US011910706B2

(12) United States Patent
Jung et al.

(10) Patent No.: US 11,910,706 B2
(45) Date of Patent: Feb. 20, 2024

(54) LIGHT-EMITTING DEVICE INCLUDING HETEROCYCLIC COMPOUND AND ELECTRONIC APPARATUS INCLUDING THE LIGHT-EMITTING DEVICE

(71) Applicant: Samsung Display Co., Ltd., Yongin-si (KR)

(72) Inventors: Minjung Jung, Yongin-si (KR); Taeil Kim, Yongin-si (KR); Sunyoung Pak, Yongin-si (KR); Junha Park, Yongin-si (KR); Jangyeol Baek, Yongin-si (KR); Munki Sim, Yongin-si (KR); Chanseok Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 507 days.

(21) Appl. No.: 17/210,377

(22) Filed: Mar. 23, 2021

(65) Prior Publication Data

US 2021/0367156 A1 Nov. 25, 2021

(30) Foreign Application Priority Data

May 25, 2020 (KR) ........................ 10-2020-0062652

(51) Int. Cl.
*H10K 85/60* (2023.01)
*H10K 50/15* (2023.01)
(Continued)

(52) U.S. Cl.
CPC ......... *H10K 85/636* (2023.02); *H10K 85/633* (2023.02); *H10K 85/656* (2023.02);
(Continued)

(58) Field of Classification Search
CPC ........................... H10K 85/657; H10K 85/322
See application file for complete search history.

(56) References Cited

U.S. PATENT DOCUMENTS

2019/0058124 A1* 2/2019 Hatakeyama ........... C07F 5/027
2020/0144513 A1 5/2020 Hatakeyama et al.
2020/0190115 A1 6/2020 Hatakeyama et al.

FOREIGN PATENT DOCUMENTS

KR 10-2016-0119683 A 10/2016
KR 10-2019-0078541 A 7/2019
(Continued)

OTHER PUBLICATIONS

Anton Pershin et al., "Highly emissive excitons with reduced exchange energy in thermally activated delayed fluorescent molecules", Nature Communications, Feb. 5, 2019, p. 1-5, vol. 10, No. 597, Springer Nature.
(Continued)

*Primary Examiner* — Sean M DeGuire
(74) *Attorney, Agent, or Firm* — Lewis Roca Rothgerber Christie LLP

(57) ABSTRACT

Provided are a light-emitting device including a heterocyclic compound and an electronic apparatus including the light-emitting device. The light-emitting device includes: a first electrode, a second electrode facing the first electrode, and an interlayer between the first electrode and the second electrode and including an emission layer, and the emission layer includes at least one heterocyclic compound represented by Formula 1.

20 Claims, 3 Drawing Sheets

10

(51) Int. Cl.
*H10K 50/16* (2023.01)
*H10K 50/18* (2023.01)
*H10K 50/17* (2023.01)

(52) U.S. Cl.
CPC ......... *H10K 85/6572* (2023.02); *H10K 50/15* (2023.02); *H10K 50/16* (2023.02); *H10K 50/171* (2023.02); *H10K 50/18* (2023.02)

(56) References Cited

FOREIGN PATENT DOCUMENTS

| | | | |
|---|---|---|---|
| KR | 10-2019-0140417 | A | 12/2019 |
| WO | WO 2018/212169 | A1 | 11/2018 |

OTHER PUBLICATIONS

Takuji Hatakeyama et al., "Ultrapure Blue Thermally Activated Delayed Fluorescence Molecules: Efficient HOMO-LUMO Separation by the Multiple Resonance Effect", Advanced Materials, Feb. 11, 2016, p. 2777-2781, vol. 28, Wiley Online Library.

* cited by examiner

LIGHT-EMITTING DEVICE INCLUDING HETEROCYCLIC COMPOUND AND ELECTRONIC APPARATUS INCLUDING THE LIGHT-EMITTING DEVICE

CROSS-REFERENCE TO RELATED APPLICATION

This application claims priority to and the benefit of Korean Patent Application No. 10-2020-0062652, filed on May 25, 2020, in the Korean Intellectual Property Office, the entire content of which is hereby incorporated by reference.

BACKGROUND

1. Field

One or more embodiments of the present disclosure relate to a light-emitting device including a heterocyclic compound and an electronic apparatus including the light-emitting device.

2. Description of Related Art

Organic light-emitting devices (OLEDs) among light-emitting devices are self-emission devices that have wide viewing angles, high contrast ratios, short response times, and excellent characteristics in terms of brightness, driving voltage, and response speed, as compared with other devices of the related art.

OLEDs may include a first electrode on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition (e.g., relax) from an excited state to a ground state to thereby generate light.

SUMMARY

One or more embodiments of the present disclosure relate to a light-emitting device including a heterocyclic compound having excellent light efficiency and high stability and an electronic apparatus including the light-emitting device.

Additional aspects of embodiments will be set forth in part in the description which follows and, in part, will be apparent from the description, or may be learned by practice of the presented embodiments of the disclosure.

An aspect of an embodiment of the present disclosure provides a light-emitting device including a first electrode, a second electrode facing the first electrode, and an interlayer between the first electrode and the second electrode and including an emission layer, wherein the interlayer further includes a hole transport region between the first electrode and the emission layer, the hole transport region includes a compound represented by Formula 201, a compound represented by Formula 202, or any combination thereof, and the emission layer includes at least one heterocyclic compound represented by Formula 1:

Formula 1

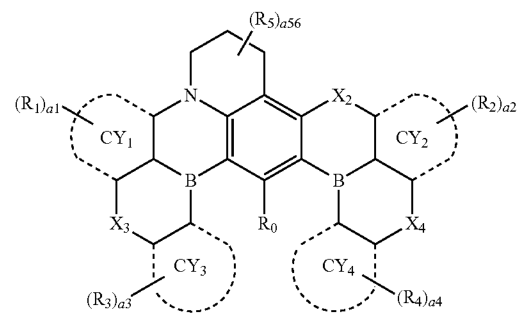

Formula 201

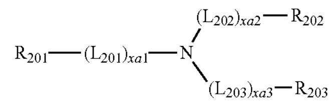

Formula 202

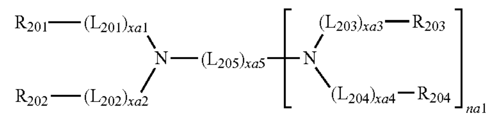

wherein, in Formula 1, $X_2$ is O, S, Se, $C(Z_{2a})(Z_{2b})$, or $N(Z_{2a})$, $X_3$ is O, S, Se, $C(Z_{3a})(Z_{3b})$, or $N(Z_{3a})$, $X_4$ is O, S, Se, $C(Z_{4a})(Z_{4b})$, or $N(Z_{4a})$, ring $CY_1$ to ring $CY_4$ are each independently a $C_3$-$C_{60}$ carbocyclic group or a $C_1$-$C_{60}$ heterocyclic group, $R_0$ to $R_5$, $Z_{2a}$, $Z_{2b}$, $Z_{3a}$, $Z_{3b}$, $Z_{4a}$, and $Z_{4b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$, a1 to a4 are each independently an integer selected from 0 to 20, a56 is an integer selected from 0 to 6, $Z_{2a}$ or $Z_{2b}$ is optionally linked to $R_2$ to form a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $Z_{3a}$ or $Z_{3b}$ is optionally linked to $R_3$ to form a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $Z_{4a}$ or $Z_{4b}$ is optionally linked to $R_4$ to form a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $R_{10a}$ is selected from:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, wherein, in Formulae 201 and 202, $L_{201}$ to $L_{204}$ are each independently a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $L_{205}$ is *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 are each independently an integer selected from 0 to 5, xa5 may be an integer selected from 1 to 10, and $R_{201}$ to $R_{204}$ and $Q_{201}$ may each independently be a $C_3$-$C_{60}$ carbocyclic group unsubstituted or substituted with at least one $R_{10a}$, or a $C_1$-$C_6$ heterocyclic group unsubstituted or substituted with at least one $R_{10a}$, $R_{201}$ and $R_{202}$ are optionally linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, $R_{203}$ and $R_{204}$ are optionally linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, na1 is an integer from 1 to 4, and * and *' each indicate a binding site to a neighboring atom.

Another aspect of an embodiment of the present disclosure provides a light-emitting device including a first electrode, a second electrode facing the first electrode, and an interlayer between the first electrode and the second electrode and including an emission layer, wherein the light-emitting device further includes a second capping layer outside the second electrode, the second capping layer having a refractive index of equal to or greater than 1.6, and the emission layer includes at least one heterocyclic compound represented by Formula 1.

Another aspect of an embodiment of the present disclosure provides an electronic apparatus including the light-emitting device, wherein the electronic apparatus further includes a thin-film transistor, the thin-film transistor includes a source electrode and a drain electrode, and the first electrode of the light-emitting device is electrically coupled to the source electrode or the drain electrode of the thin-film transistor.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
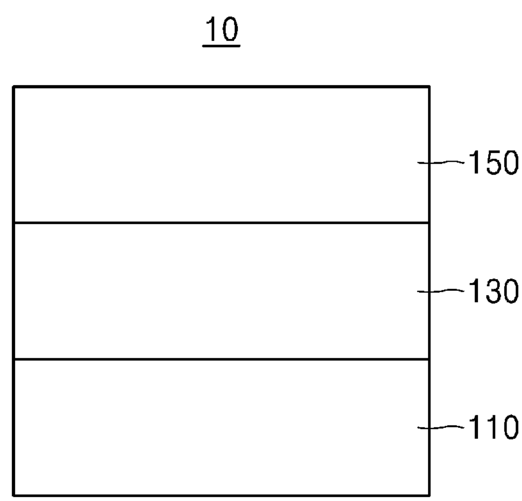
FIG. 1 is a schematic cross-sectional view of a light-emitting device according an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

An aspect of an embodiment of the present disclosure provides a heterocyclic compound represented by Formula 1:

Formula 1

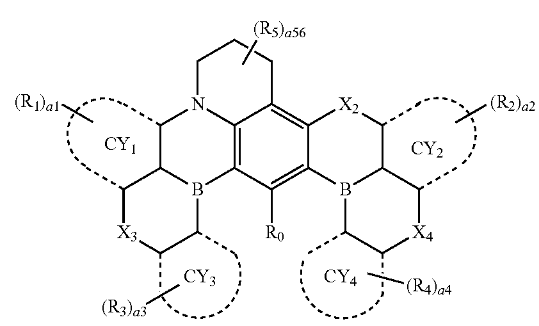

In Formula 1, $X_2$ may be O, S, Se, C($Z_{2a}$)($Z_{2b}$), or N($Z_{2a}$).

In an embodiment, $X_2$ may be O or N($Z_{2a}$), but embodiments of the present disclosure are not limited thereto.

In Formula 1, $X_3$ may be O, S, Se, $C(Z_{3a})(Z_{3b})$, or $N(Z_{3a})$.

For example, $X_3$ may be O or $N(Z_{3a})$, but embodiments of the present disclosure are not limited thereto.

In Formula 1, $X_4$ may be O, S, Se, $C(Z_{4a})(Z_{4b})$, or $N(Z_{4a})$.

In an embodiment, $X_4$ may be O or $N(Z_{4a})$, but embodiments of the present disclosure are not limited thereto.

In Formula 1, ring $CY_1$ to ring $CY_4$ may each independently be a $C_3$-$C_{60}$ carbocyclic group, or a $C_1$-$C_{60}$ heterocyclic group.

In an embodiment, ring $CY_1$ to ring $CY_4$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, but embodiments of the present disclosure are not limited thereto.

In one or more embodiments, at least one selected from ring $CY_1$ to ring $CY_4$ may be a benzene group, but embodiments of the present disclosure are not limited thereto.

In Formula 1, $R_0$ to $R_5$, $Z_{2a}$, $Z_{2b}$, $Z_{3a}$, $Z_{3b}$, $Z_{4a}$, and $Z_{4b}$ may each independently be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, $—Si(Q_1)(Q_2)(Q_3)$, $—N(Q_1)(Q_2)$, $—B(Q_1)(Q_2)$, $—C(=O)(Q_1)$, $—S(=O)_2(Q_1)$, or $—P(=O)(Q_1)(Q_2)$. $R_{10a}$ and $Q_1$ to $Q_3$ may each be the same as described in the present specification.

In an embodiment, $R_0$ to $R_5$, $Z_{2a}$, $Z_{2b}$, $Z_{3a}$, $Z_{3b}$, $Z_{4a}$, and $Z_{4b}$ may each independently be:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, an imidazopyrimidinyl group, an azacarbazolyl group, an azadibenzofuranyl group, an azadibenzothienyl group, an azafluorenyl group, an azadibenzosilolyl group, a piperidinyl group, an acridinyl group, a phenothiazinyl group, a 1,2,3,4-tetrahydroquinoline group, or a phenoxazinyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, an imidazopyrimidinyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or any combination thereof; or —B($Q_1$)($Q_2$), —P($Q_1$)($Q_2$), or —C(=O)($Q_1$), but embodiments of the present disclosure are not limited thereto.

In one or more embodiments, $R_0$ may be hydrogen or deuterium, but embodiments of the present disclosure are not limited thereto.

In one or more embodiments, $R_1$ and $R_2$ may each independently be a piperidinyl group, a carbazolyl group, an acridinyl group, a phenothiazinyl group, a 1,2,3,4-tetrahydroquinolinyl group, a phenoxazinyl group, or —N($Q_1$)($Q_2$), but embodiments of the present disclosure are not limited thereto.

$Q_1$ and $Q_2$ may each independently be selected from: hydrogen; deuterium; —F; —Cl; —Br; —I; a hydroxyl group; a cyano group; a nitro group; an amidino group; a hydrazino group; a hydrazono group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_1$-$C_{60}$ heteroaryl group; a monovalent non-aromatic condensed polycyclic group; a monovalent non-aromatic condensed heteropolycyclic group; and a $C_1$-$C_{60}$ alkyl group substituted with at least one selected from deuterium, —F, and a cyano group;

a $C_6$-$C_{60}$ aryl group substituted with at least one selected from deuterium, —F, a cyano group, and a $C_1$-$C_{60}$ alkyl group; a biphenyl group; and a terphenyl group, but embodiments of the present disclosure are not limited thereto.

In an embodiment, at least one selected from $R_3$ and $R_4$ may be hydrogen, but embodiments of the present disclosure are not limited thereto.

In Formula 1, a1 to a4 may each independently be an integer from 0 to 20.

In an embodiment, a1 to a4 may each independently be an integer selected from 0 to 6, but embodiments of the present disclosure are not limited thereto.

In Formula 1, a56 may be an integer selected from 0 to 6.

In Formula 1, $Z_{2a}$ or $Z_{2b}$ may optionally be linked to $R_2$ to form a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $Z_{3a}$ or $Z_{3b}$ may optionally be linked to $R_3$ to form a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, and $Z_{4a}$ or $Z_{4b}$ may optionally be linked to $R_4$ to form a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$.

In Formula 1, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_6$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

In Formula 1, $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_6$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, Formula 1 may be represented by any of Formulae 1A to 1D, but embodiments of the present disclosure are not limited thereto.

1A

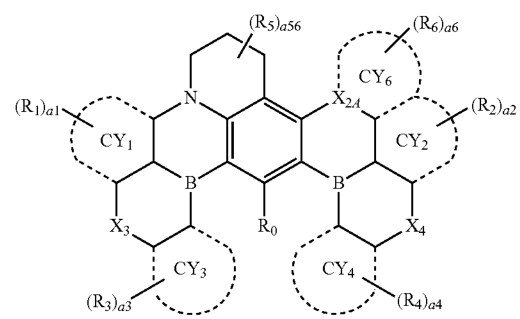

1B

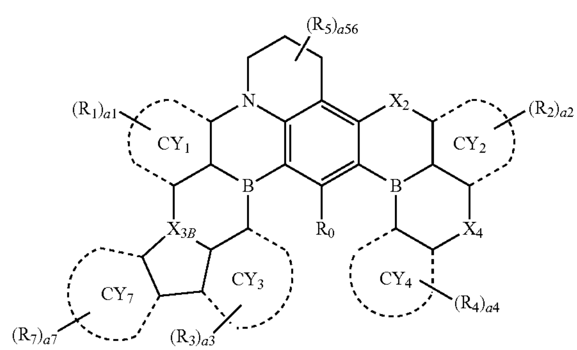

-continued

1C

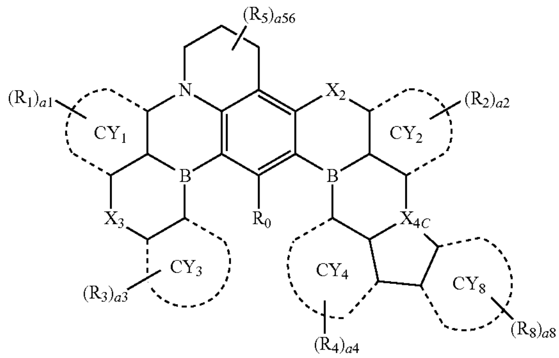

1D

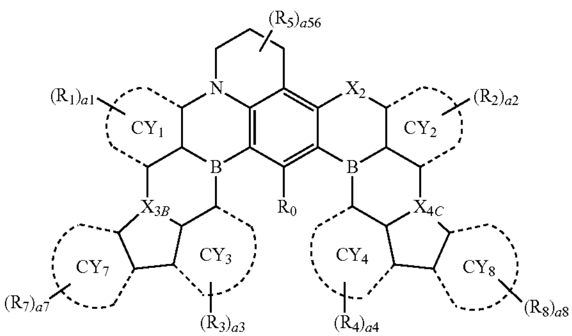

In Formulae 1A to 1D, $X_2$ to $X_4$, ring $CY_1$ to ring $CY_4$, $R_0$ to $R_5$, a1 to a4, and a56 may each be the same as described in the present specification.

$X_{2A}$ may be $C(Z_{2a})(Z_{2b})$ or $N(Z_{2a})$, $X_{3B}$ may be $C(Z_{3a})(Z_{3b})$ or $N(Z_{3a})$, $X_{4C}$ may be $C(Z_{4a})(Z_{4b})$ or $N(Z_{4a})$, ring $CY_6$ to ring $CY_8$ may each be the same as described in connection with ring $CY_1$ in the present specification, $R_6$ to $R_8$ may each be the same as described in connection with $R_1$ in the present specification, and a6 to a8 may each be the same as described in connection with a1 in the present specification.

In one or more embodiments, Formula 1 may be represented by any of Formulae 1A-1 to 1D-1, but embodiments of the present disclosure are not limited thereto.

1A-1

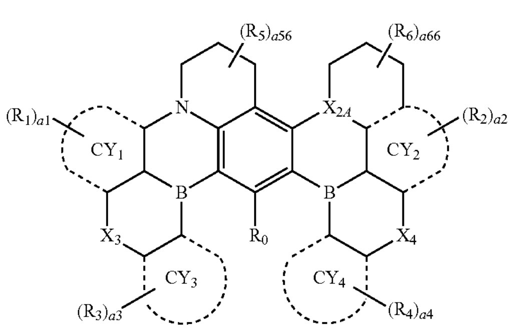

-continued 1B-1

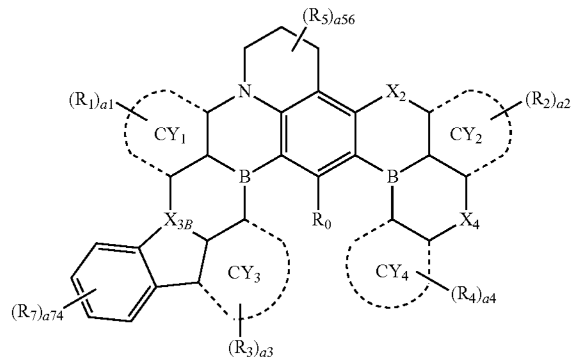

1C-1

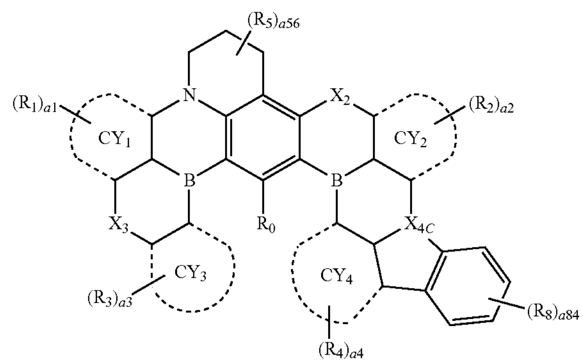

1D-1

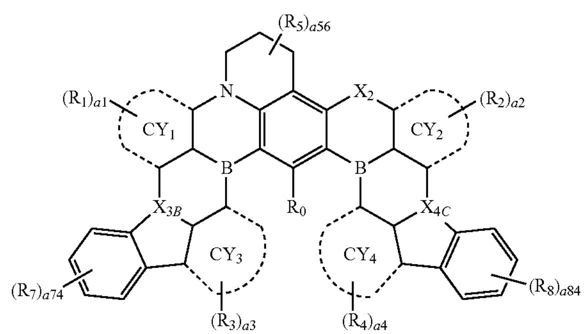

In Formulae 1A-1 to 1D-1, $X_2$ to $X_4$, ring $CY_1$ to ring $CY_4$, $R_0$ to $R_5$, a1 to a4, and a56 may each be the same as described in the present specification.

$X_{2A}$ may be $C(Z_{2a})(Z_{2b})$ or $N(Z_{2a})$, $X_{3B}$ may be $C(Z_{3a})(Z_{3b})$ or $N(Z_{3a})$, $X_{4C}$ may be $C(Z_{4a})(Z_{4b})$ or $N(Z_{4a})$, $R_6$ to $R_8$ may each be the same as described in connection with $R_1$ in the present specification, a66 is the same as described in connection with a56 in the present specification, and a74 and a84 may each independently be an integer selected from 0 to 4.

In Formula 1, ring $CY_1$ and ring $CY_2$ may each be identical to each other, but embodiments of the present disclosure are not limited thereto.

In an embodiment, ring $CY_1$ and ring $CY_2$ may each be identical to each other, and $R_1$ and $R_2$ may each be identical to each other. However, embodiments of the present disclosure are not limited thereto.

In one or more embodiments, ring $CY_1$ and ring $CY_2$ may each be identical to each other, and a1 and a2 may each be identical to each other. However, embodiments of the present disclosure are not limited thereto.
In an embodiment, the heterocyclic compound may be one selected from Compounds 1 to 40, but embodiments of the present disclosure are not limited thereto:
1
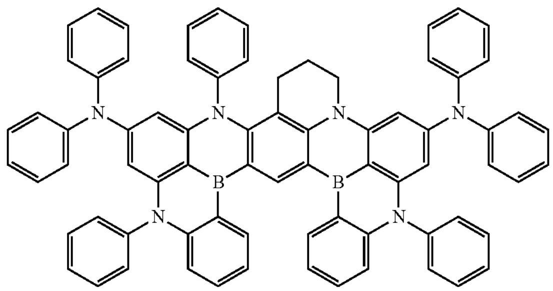
2
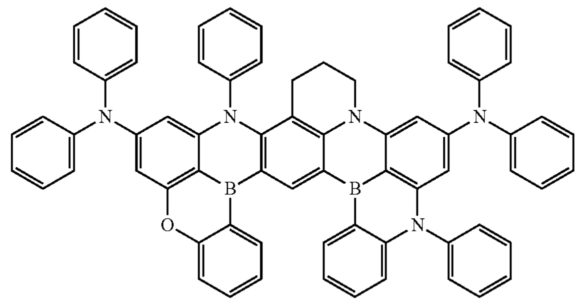
3
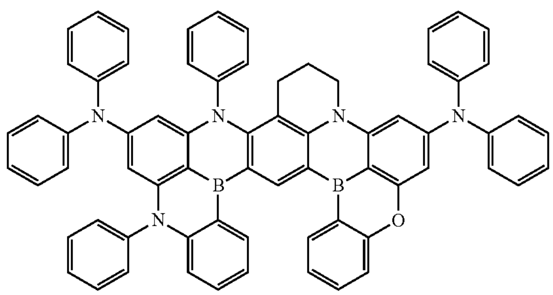
4
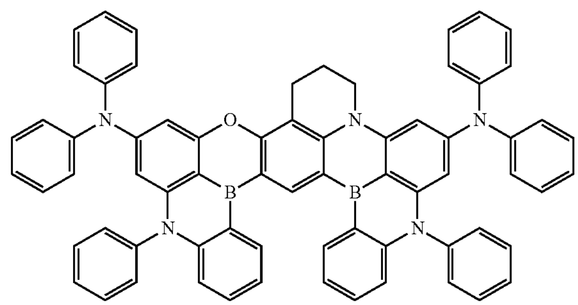
5
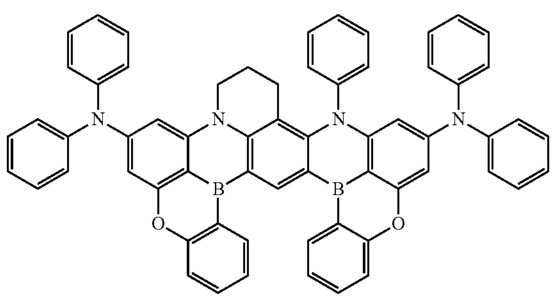
6
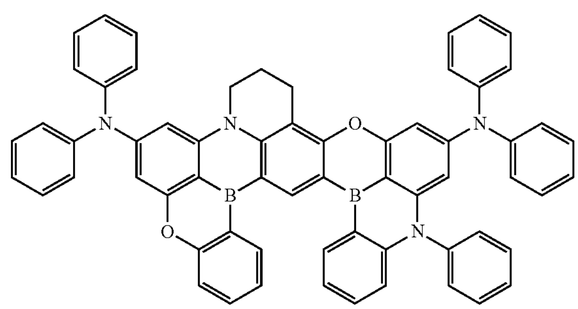
7
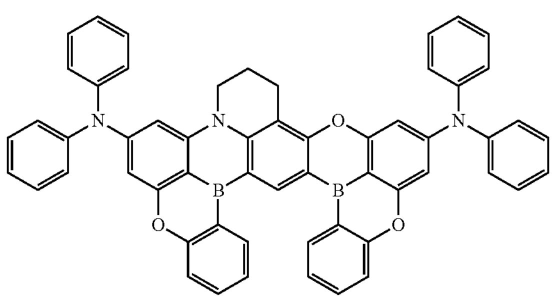
8
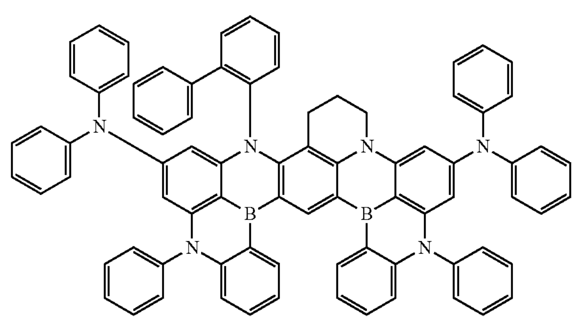

-continued
9
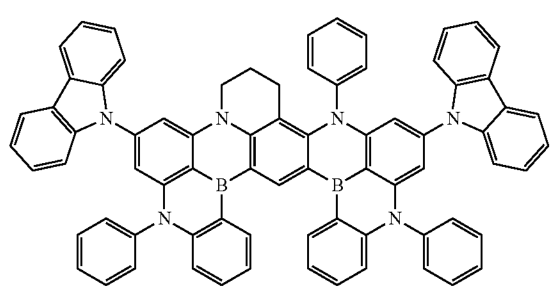
10
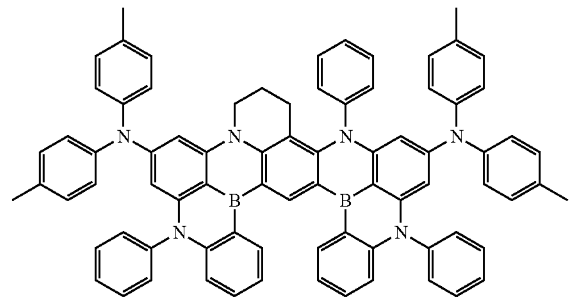
11
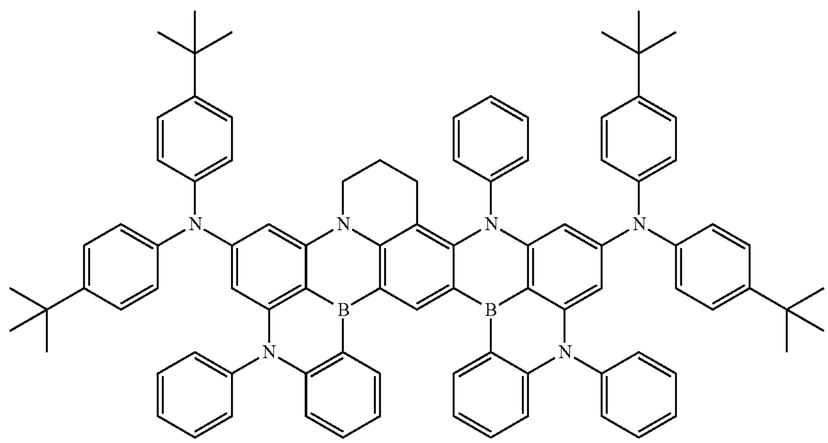
12
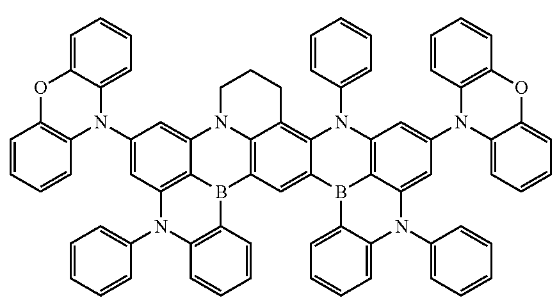
13
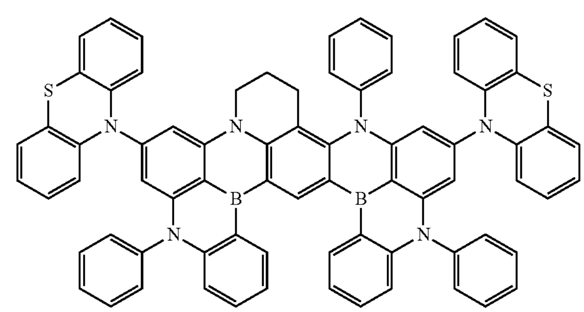
14
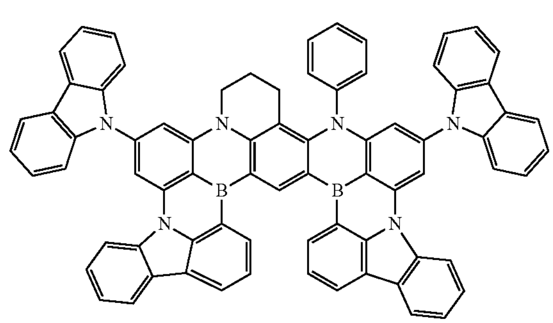
15
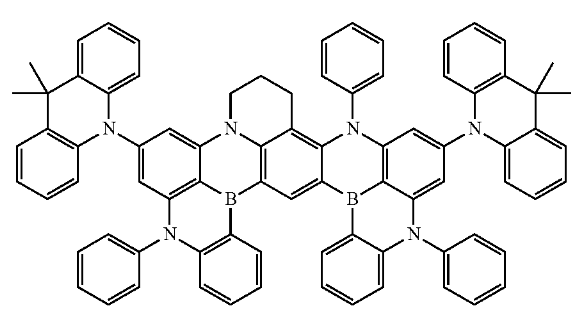

-continued
16
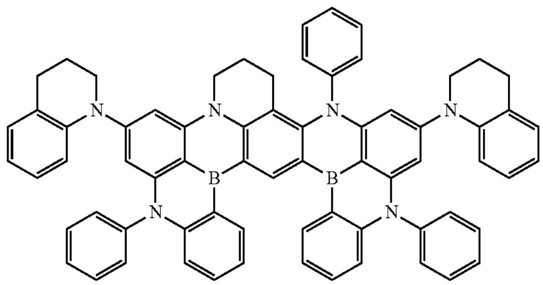
17
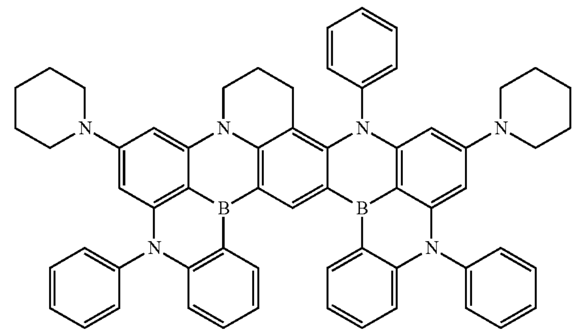
18
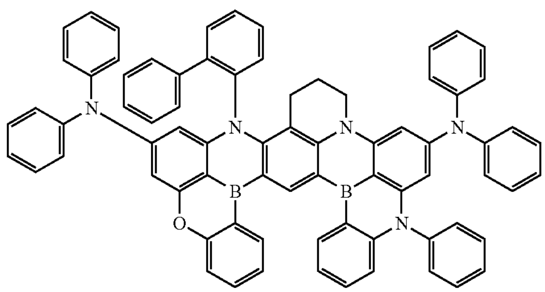
19
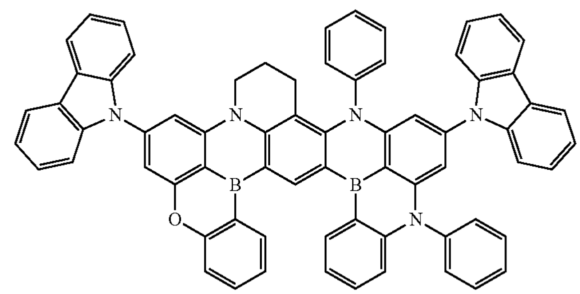
20
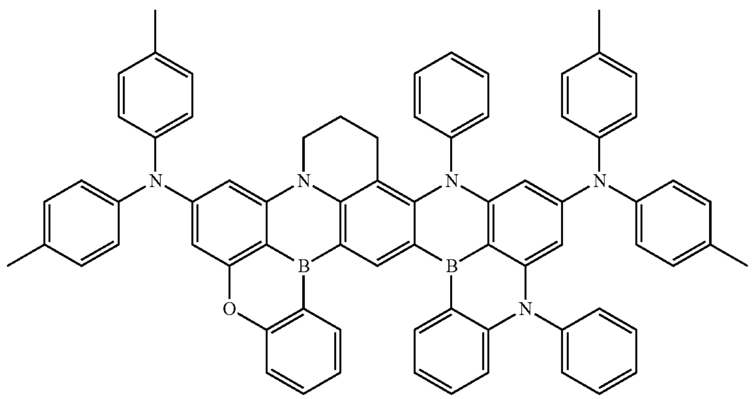
21
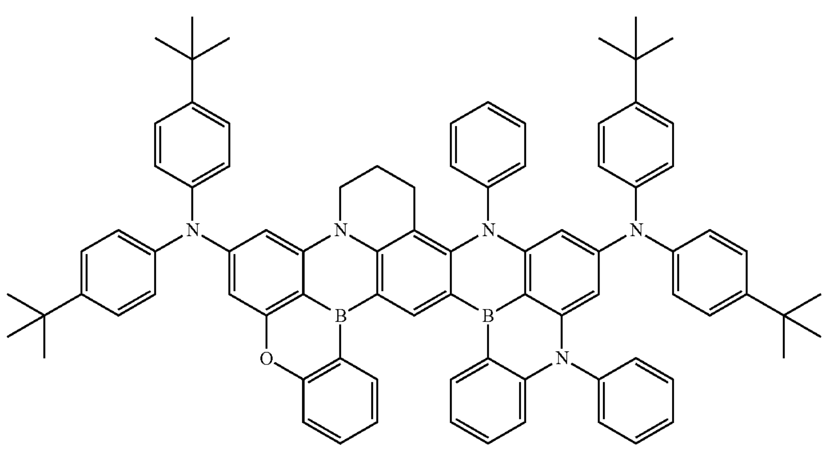

-continued
22
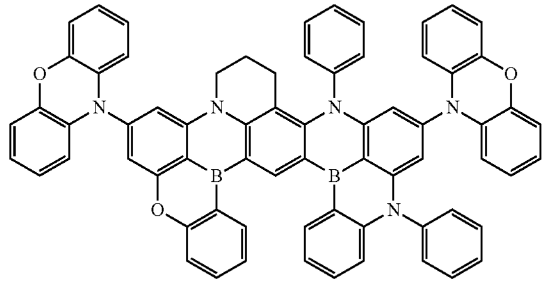
23
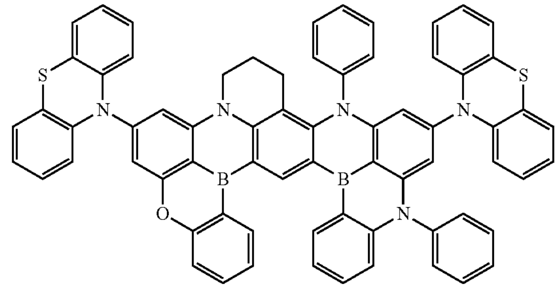
24
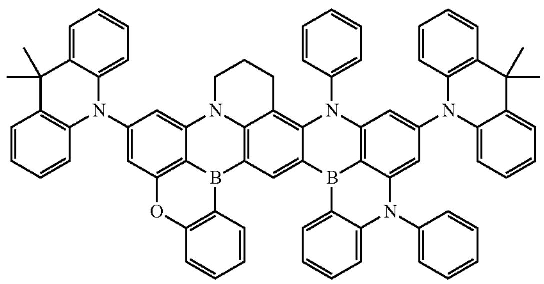
25
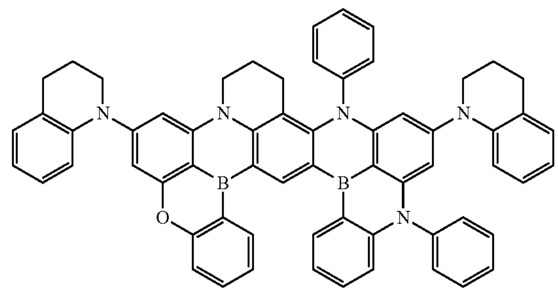
26
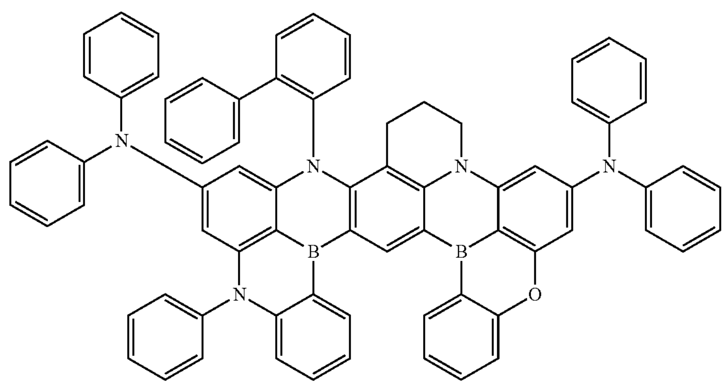
27
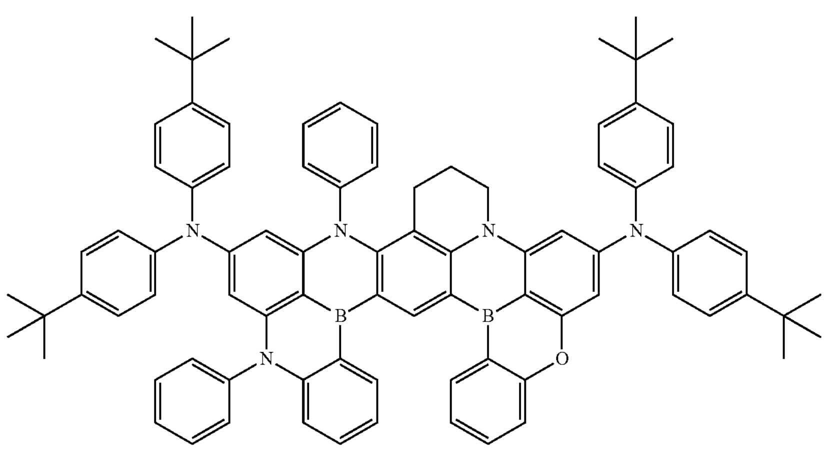

-continued
28
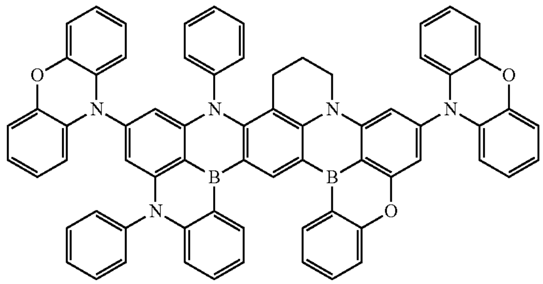
29
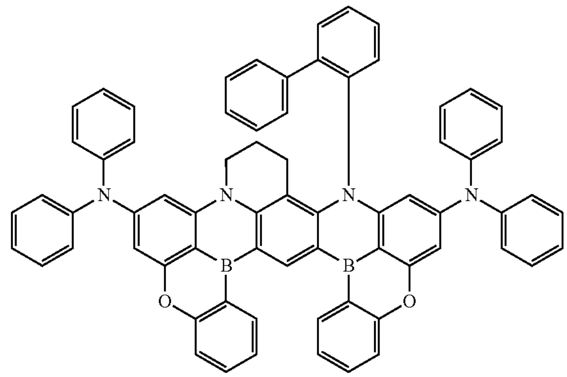
30
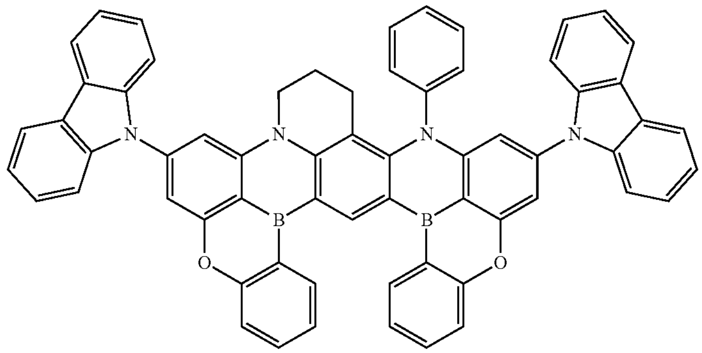
31
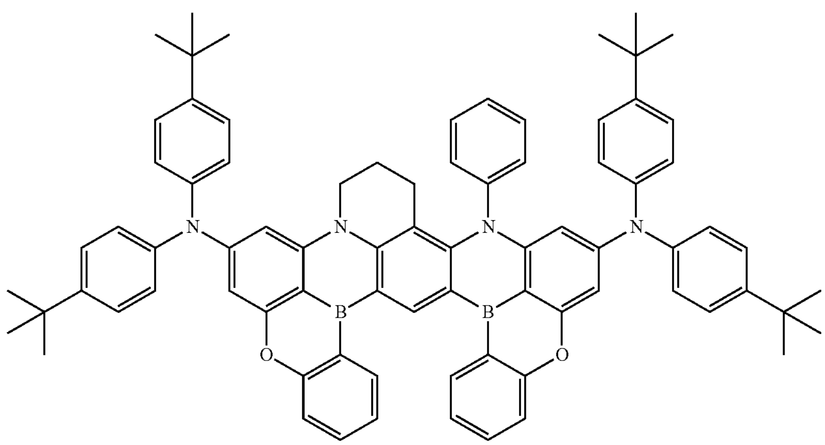
32
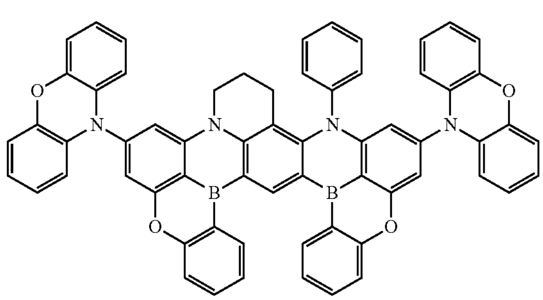
33
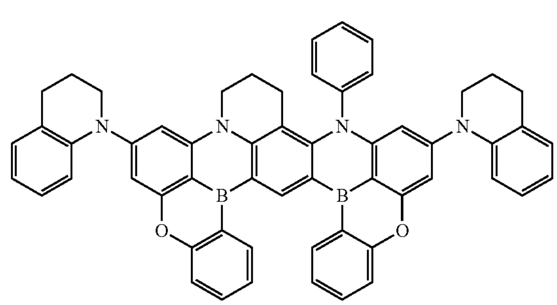

-continued
34
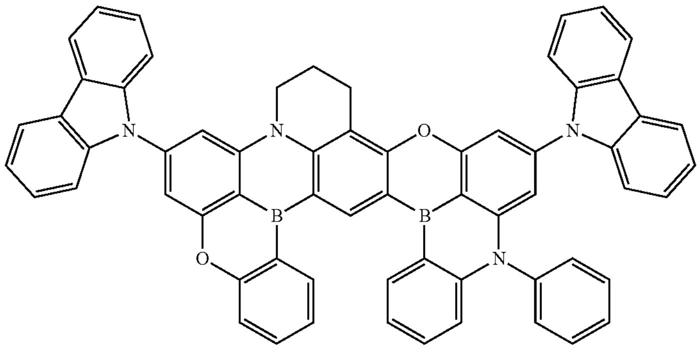
35
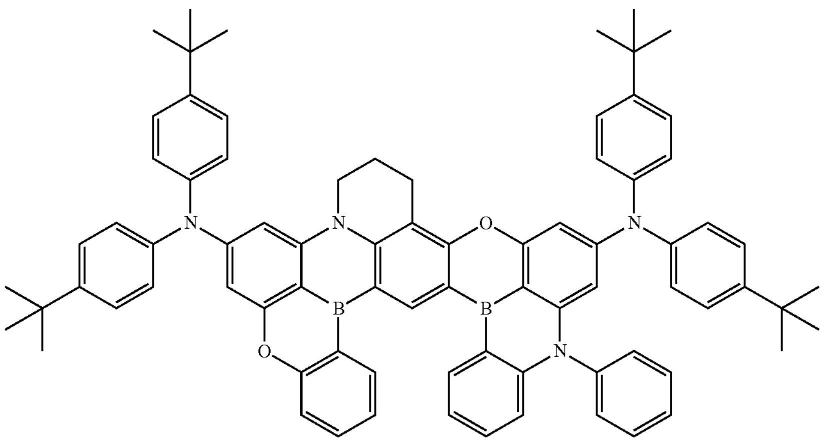
36
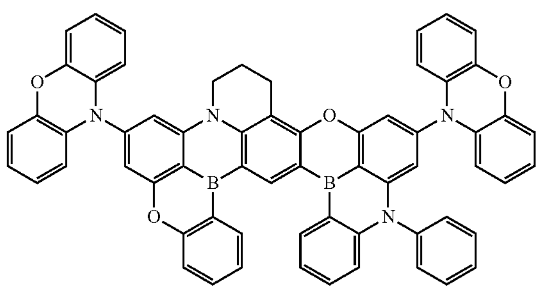
37
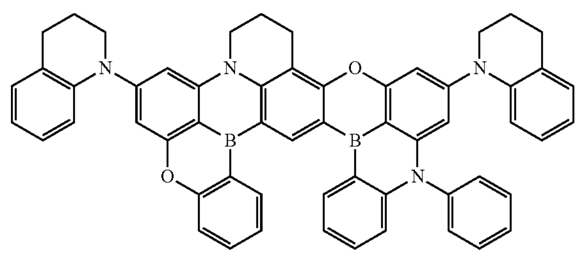
38
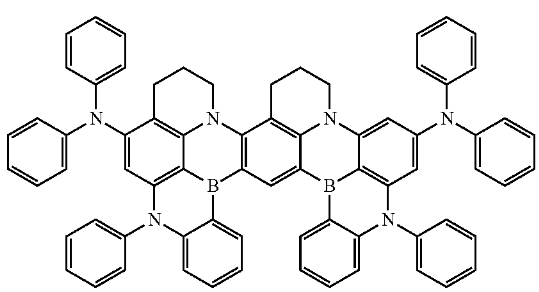
39
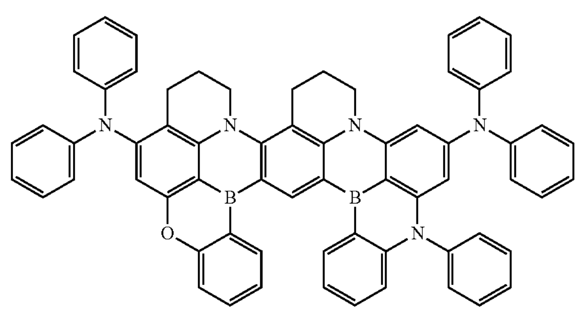

-continued

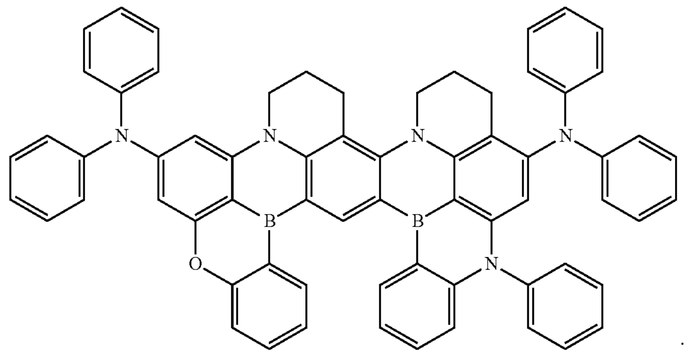

The heterocyclic compound represented by Formula 1 may have a wide plate-like structure.

The heterocyclic compound includes i) a piperidine group in the backbone so that, as compared with a non-condensed backbone, the number of freely rotating bonds may be reduced, thereby exhibiting an effect of making the molecule (the heterocyclic compound) rigid in terms of bond dissociation energy (BDE). Also, as compared with a backbone where the ring is formed outward rather than in the central benzene (e.g., where the ring is at a periphery of the compound rather than being directly bonded a benzene ring at a center of the heterocyclic compound), the central benzene in which the piperidine group is formed may be located among N, $X_2$, and B, which is the strongest multiple resonance position (e.g., the position that provides the greatest number of resonance structures and/or the largest degree of resonance effects). According to this mechanism, the piperidine group may have abundant electrons, and in this regard, the multiple resonance of the central benzene may be more activated (or increased), thereby exhibiting an effect of compensating for chemical instability that the heterocyclic compound would otherwise have. In addition, in the heterocyclic compound, ii) $R_0$ and ring $CY_3$ or $R_0$ and $CY_4$ are not connected. Thus, the heterocyclic compound may have a wide plate-like structure, and accordingly, the multiple resonance may be activated so that the delocalization of electrons in the molecule (the heterocyclic compound) may be activated and luminescence efficiency may be increased due to high polarizability. Accordingly, the heterocyclic compound may be used as a high-efficiency delayed fluorescence light-emitting material, and in this regard, an electronic device, e.g., an organic light-emitting device, including the heterocyclic compound may have low driving voltage, excellent light emission efficiency, and long lifespan.

Methods of synthesizing the heterocyclic compound represented by Formula 1 should be readily apparent to those of ordinary skill in the art by referring to Synthesis Examples and/or Examples described below.

At least one of the heterocyclic compound represented by Formula 1 may be included in a light-emitting device (e.g., an organic light-emitting device).

Another aspect of an embodiment of the present disclosure provides a light-emitting device including: a first electrode; a second electrode facing the first electrode; and an interlayer between the first electrode and the second electrode and including an emission layer, wherein the interlayer further includes a hole transport region between the first electrode and the emission layer, the hole transport region may include a compound represented by Formula 201, a compound represented by Formula 202, or any combination thereof, and the emission layer includes at least one of the heterocyclic compound represented by Formula 1:

Formula 201

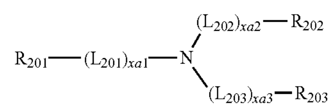

Formula 202

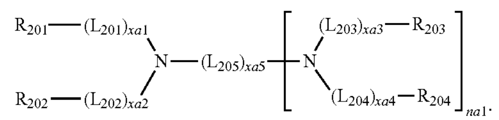

In Formulae 201 and 202, $L_{201}$ to $L_{204}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer selected from 0 to 5, xa5 may be an integer selected from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer selected from 1 to 4.

In one or more embodiments, the first electrode of the light-emitting device may be an anode, the second electrode of the light-emitting device may be a cathode, the interlayer may further include an electron transport region between the emission layer and the second electrode, the hole transport region may include a hole injection layer, a hole transport layer, an emission auxiliary layer, an electron blocking layer, or any combination thereof, and the electron transport region may include a buffer layer, a hole blocking layer, an electron control layer, an electron transport layer, an electron injection layer, or any combination thereof.

In one or more embodiments, at least one selected from the hole transport region and the emission layer includes an arylamine-containing compound, an acridine-containing compound, a carbazole-containing compound, or any combination thereof; or at least one selected from the emission layer and the electron transport region includes a silicon-containing compound, a phosphine oxide-containing compound, a sulfur oxide-containing compound, a phosphorus oxide-containing compound, a triazine-containing compound, a pyrimidine-containing compound, a pyridine-containing compound, a dibenzofuran-containing compound, a dibenzothiophene-containing compound, or any combination thereof.

In one or more embodiments, the emission layer included in the interlayer of the light-emitting device may include a dopant and a host, and the dopant may include the heterocyclic compound. For example, the heterocyclic compound may serve as a dopant.

The emission layer may emit red light, green light, blue light, and/or white light. For example, the emission layer may emit blue light or turquoise light. The blue or the turquoise light may have, for example, a maximum luminescence wavelength in a range of about 400 nm to about 500 nm.

The emission layer may have a lowest excitation triplet energy level of, for example, equal to or greater than 2.5 eV and equal to or less than 3.0 eV.

The heterocyclic compound included in the emission layer may serve as a delayed fluorescence dopant to emit delayed fluorescence from the emission layer.

In an embodiment, the light-emitting device may further include a second capping layer outside the second electrode, and the second capping layer may include one selected from a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof.

In an embodiment, the emission layer may be formed by a wet process and/or a vapor deposition process.

In one or more embodiments, the light-emitting device may include:

a first capping layer outside the first electrode;

a second capping layer outside the second electrode; or the first capping layer and the second capping layer.

Another aspect of an embodiment of the present disclosure provides a light-emitting device including: a first electrode, a second electrode facing the first electrode, and an interlayer between the first electrode and the second electrode and including an emission layer, wherein the light-emitting device further includes a second capping layer outside the second electrode, the second capping layer having a refractive index of equal to or greater than 1.6, and the emission layer includes at least one heterocyclic compound represented by Formula 1.

In an embodiment, an encapsulation portion may be on the second capping layer. The encapsulation portion may be on the light-emitting device to protect the light-emitting device from moisture or oxygen.

In an embodiment, the encapsulation portion may include:

an inorganic film including silicon nitride ($SiN_x$), silicon oxide ($SiO_x$), indium tin oxide, indium zinc oxide, or any combination thereof;

an organic film including polyethylene terephthalate, polyethylene naphthalate, polycarbonate, polyimide, polyethylene sulfonate, polyoxymethylene, polyarylate, hexamethyldisiloxane, acryl-based resin, epoxy-based resin, or any combination thereof; or a combination of the inorganic film and the organic film.

Another aspect of an embodiment of the present disclosure provides an electronic apparatus including the light-emitting device. The electronic apparatus may further include a thin-film transistor.

For example, the electronic apparatus may further include a thin-film transistor including a source electrode and a drain electrode, and the first electrode of the light-emitting device may be electrically coupled to the source electrode or the drain electrode.

In an embodiment, the electronic apparatus may further include a color filter, a color conversion layer, a touchscreen layer, a polarization layer, or any combination thereof. For example, the electronic apparatus may be a flat electronic apparatus, but embodiments of the present disclosure are not limited thereto.

A description of the electronic apparatus may be the same as described above.

In the present specification, the expression the "(interlayer) includes a heterocyclic compound" may be construed as meaning the "(interlayer) may include one heterocyclic compound of Formula 1 or two different heterocyclic compounds of Formula 1".

For example, the interlayer may include only Compound 1 as the heterocyclic compound. In an embodiment, Compound 1 may be included in the emission layer of the light-emitting device. In one or more embodiments, the interlayer may include Compounds 1 and 2 as the heterocyclic compounds. In this regard, Compound 1 and Compound 2 may be included in an identical layer (for example, Compound 1 and Compound 2 may both be included in an emission layer), or different layers (for example, Compound 1 may be included in an emission layer and Compound 2 may be included in an electron transport region).

The term "interlayer," as used herein, refers to a single layer and/or all layers between the first electrode and the second electrode of the light-emitting device.

DESCRIPTION OF FIG. 1

FIG. 1 is a schematic cross-sectional view of a light-emitting device 10 according to an embodiment. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

First Electrode 110

In FIG. 1, a substrate may be additionally under the first electrode 110 or above the second electrode 150. The substrate may be a glass substrate and/or a plastic substrate. The substrate may be a flexible substrate. In one or more embodiments, the substrate may include plastics (or polymers) having excellent heat resistance and durability, such as polyimide, polyethylene terephthalate (PET), polycarbonate, polyethylene naphthalate, polyarylate (PAR), polyetherimide, or a combination thereof.

The first electrode 110 may be formed by, for example, depositing and/or sputtering a material for forming the first electrode 110 on the substrate. When the first electrode 110 is an anode, a high work function material that can easily inject holes may be used as the material for forming the first electrode 110.

The first electrode 110 may be a reflective electrode, a semi-transmissive electrode, or a transmissive electrode. When the first electrode 110 is a transmissive electrode, the material for forming the first electrode 110 may include indium tin oxide (ITO), indium zinc oxide (IZO), tin oxide ($SnO_2$), zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as the material for forming the first electrode 110.

The first electrode 110 may have a single-layered structure including (e.g., consisting of) a single layer or a multi-layered structure including a plurality of layers. For example, the first electrode 110 may have a three-layered structure of ITO/Ag/ITO.

Interlayer 130

The interlayer 130 is on the first electrode 110. The interlayer 130 includes an emission layer.

The interlayer 130 may further include a hole transport region between the first electrode 110 and the emission layer and an electron transport region between the emission layer and the second electrode 150.

The interlayer 130 may further include a metal-containing compound, such as an organometallic compound, an inorganic material, such as a quantum dot, and/or the like, in addition to various suitable organic materials.

In one or more embodiments, the interlayer 130 may include, i) two or more emitting units sequentially stacked between the first electrode 110 and the second electrode 150 and ii) a charge generation layer between the two emitting units. When the interlayer 130 includes the emitting unit and the charge generation layer as described above, the light-emitting device 10 may be a tandem light-emitting device.

Hole Transport Region in Interlayer 130

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially on the first electrode 110.

The hole transport region may include a compound represented by Formula 201, a compound represented by Formula 202, or any combination thereof:

Formula 201

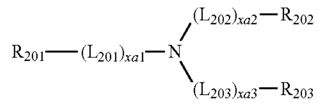

Formula 202

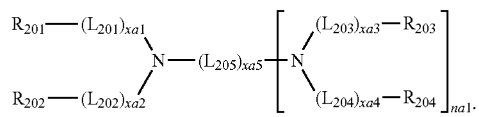

In Formulae 201 and 202, $L_{201}$ to $L_{204}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer selected from 0 to 5, xa5 may be an integer selected from 1 to 10, $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group and/or the like) (for example, refer to the following compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ poly cyclic group unsubstituted or substituted with at least one $R_{10a}$, and na1 may be an integer selected from 1 to 4.

For example, Formulae 201 and 202 may each include at least one selected from groups represented by Formulae CY201 to CY217:

CY201

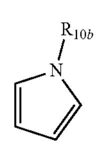

-continued

CY202

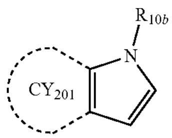

CY203

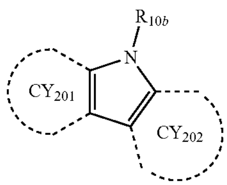

CY204

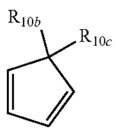

CY205

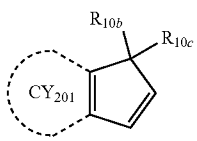

CY206

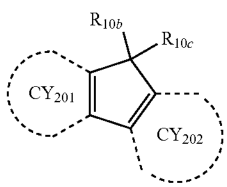

CY207

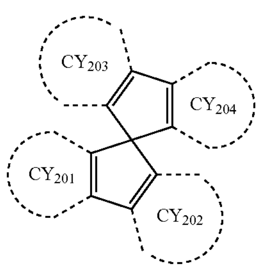

CY208

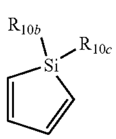

CY209

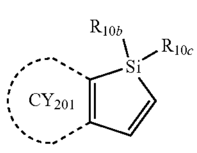

CY210

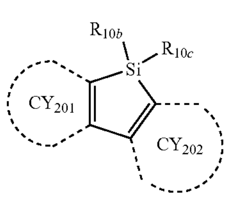

-continued

CY211

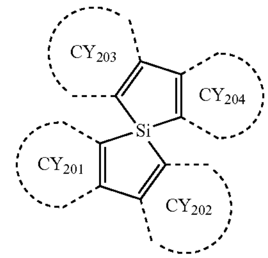

CY212

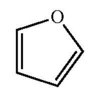

CY213

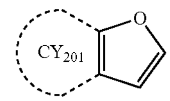

CY214

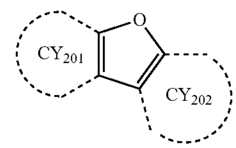

CY215

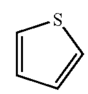

CY216

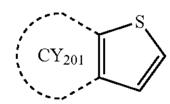

CY217

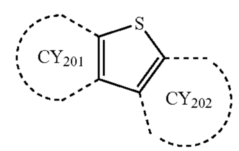

Regarding Formulae CY201 to CY217, $R_{10b}$ and $R_{10c}$ may each be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formula CY201 to CY217 may be unsubstituted or substituted with at least one $R_{10a}$ described herein.

In an embodiment, ring $CY_{201}$ to ring $CY_{204}$ in Formulae CY201 to CY217 may each independently be a benzene group, a naphthalene group, a phenanthrene group, or an anthracene group.

In one or more embodiments, Formulae 201 and 202 may each include at least one selected from groups represented by Formulae CY201 to CY203.

In one or more embodiments, Formula 201 may include at least one selected from groups represented by Formulae CY201 to CY203 and at least one selected from groups represented by Formulae CY204 to CY217.

In one or more embodiments, in Formula 201, xa1 may be 1, $R_{201}$ may be a group represented by any of Formulae CY201 to CY203, xa2 may be 0, and $R_{202}$ may be a group represented by any of Formulae CY204 to CY207.

In one or more embodiments, each of Formulae 201 and 202 may not include groups represented by Formulae CY201 to CY203.

In one or more embodiments, each of Formulae 201 and 202 may not include groups represented by Formulae CY201 to CY203, and may include at least one selected from groups represented by Formulae CY204 to $CY_{217}$.

In one or more embodiments, each of Formulae 201 and 202 may not include groups represented by Formulae CY201 to CY217.

For example, the hole transport region may include one selected from Compounds HT1 to HT44, m-MTDATA, TDATA, 2-TNATA, NPB(NPD), p-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), 9-(4-(tert-butyl)phenyl)-3,6-bis(triphenylsilyl)-9H-carbazole (CzSi), or any combination thereof:

HT1

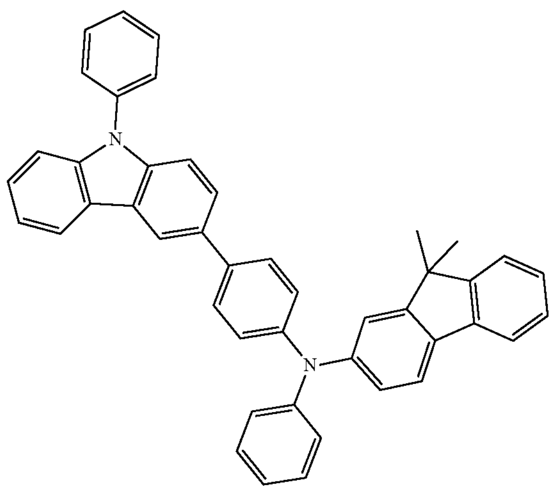

HT2

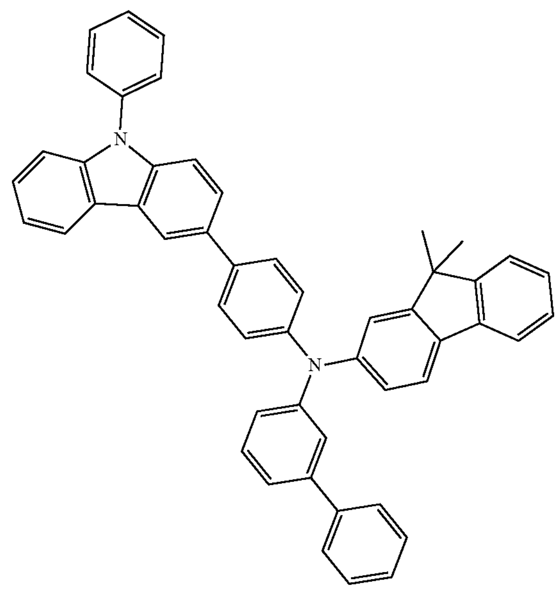

HT3

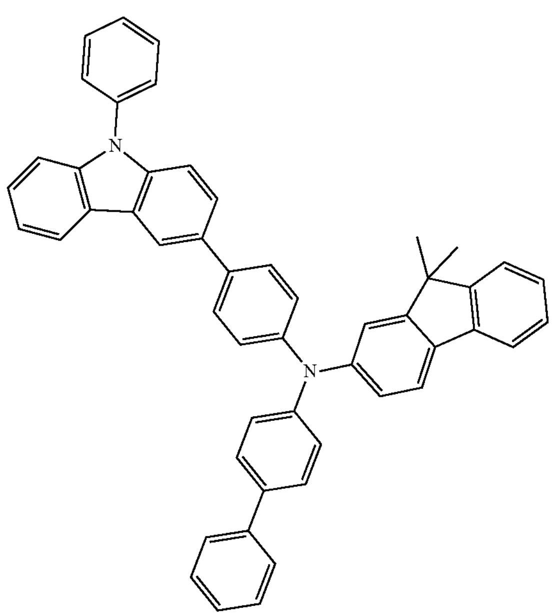

HT4

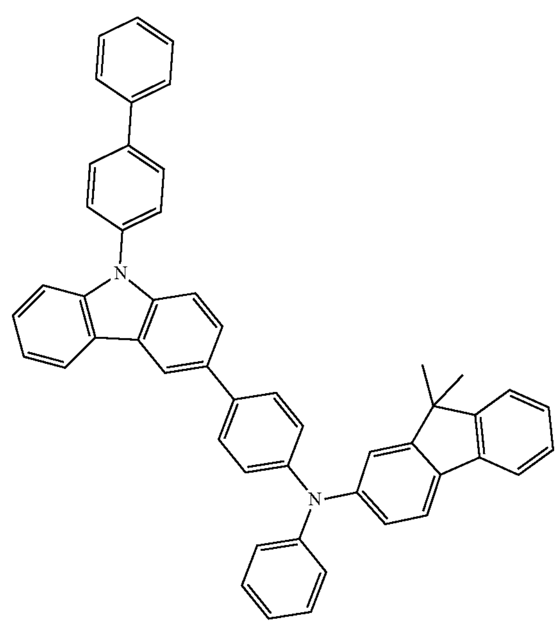

-continued
HT5
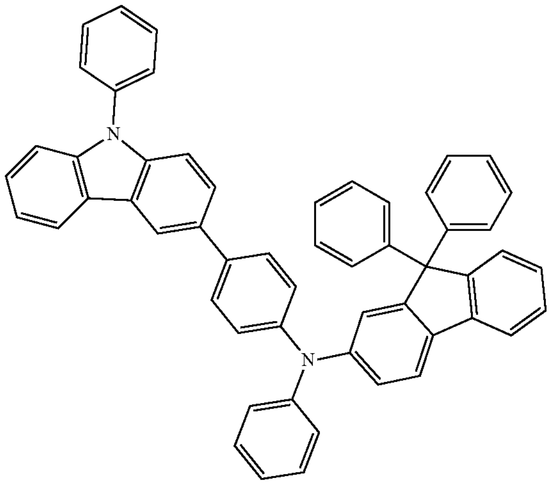
HT6
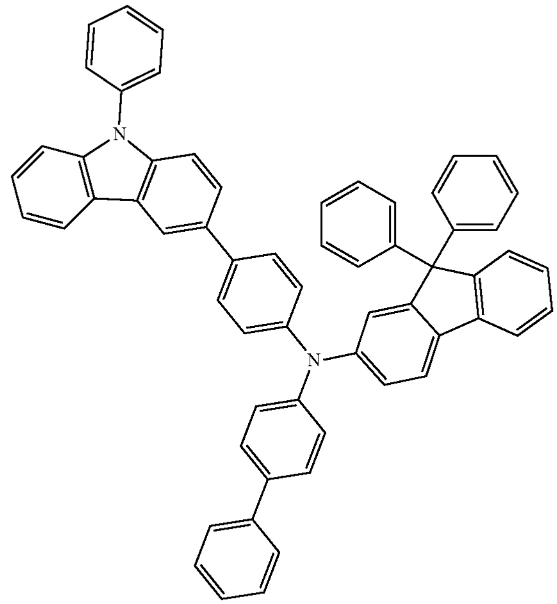
HT7
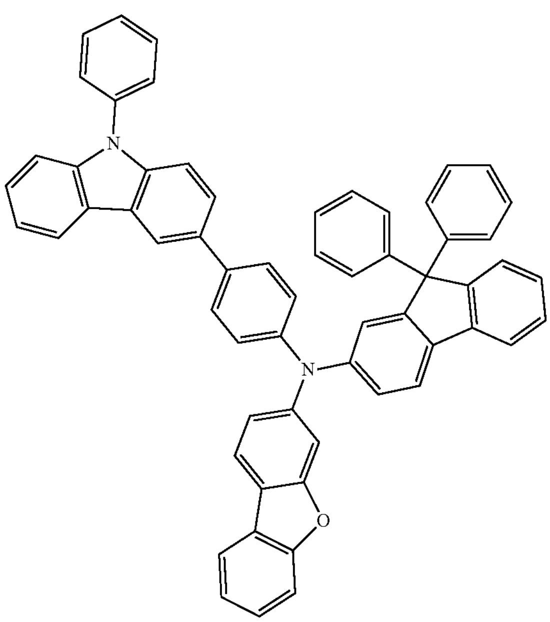
HT8
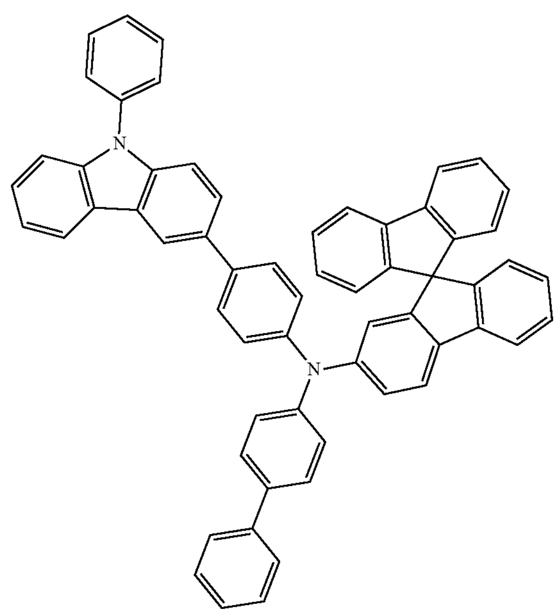

-continued
HT9
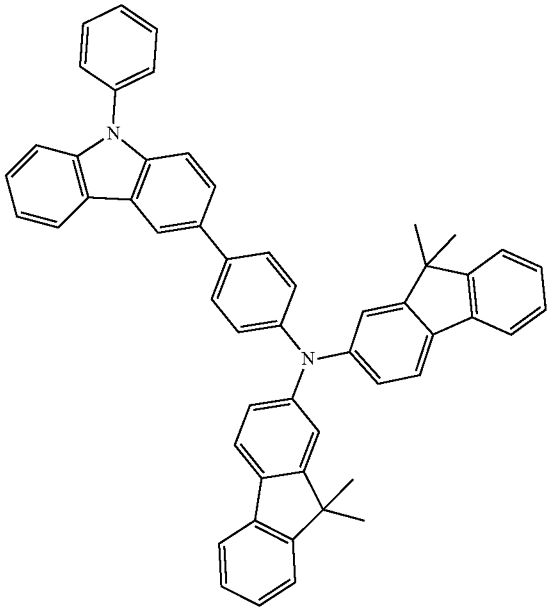
HT10
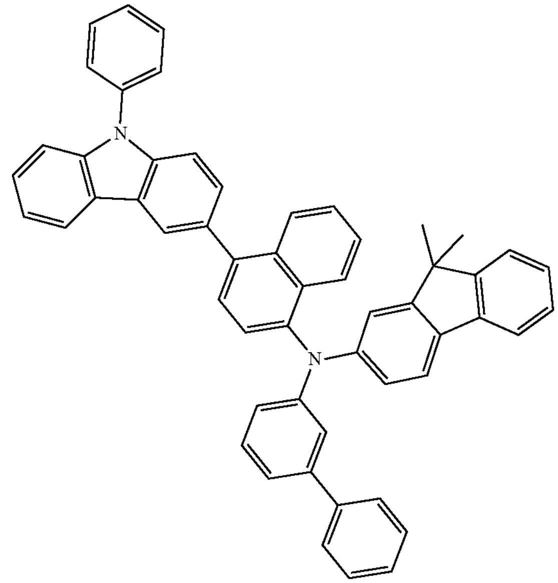
HT11
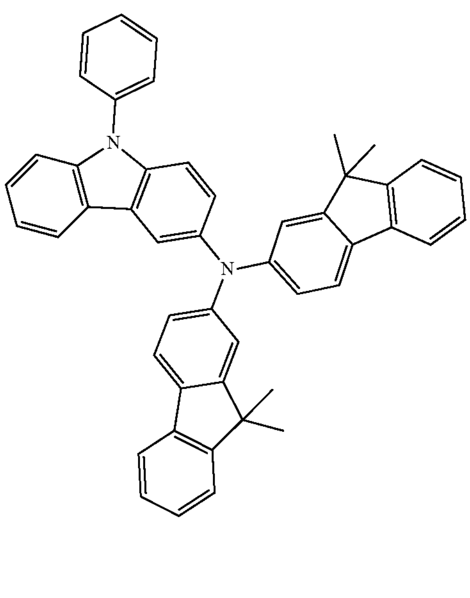
HT12
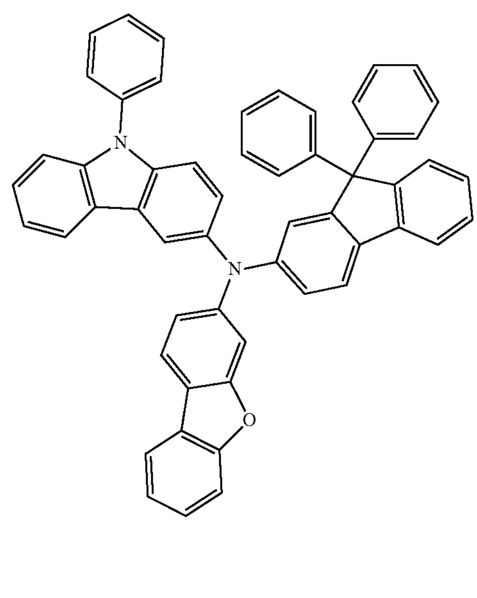

-continued
HT13
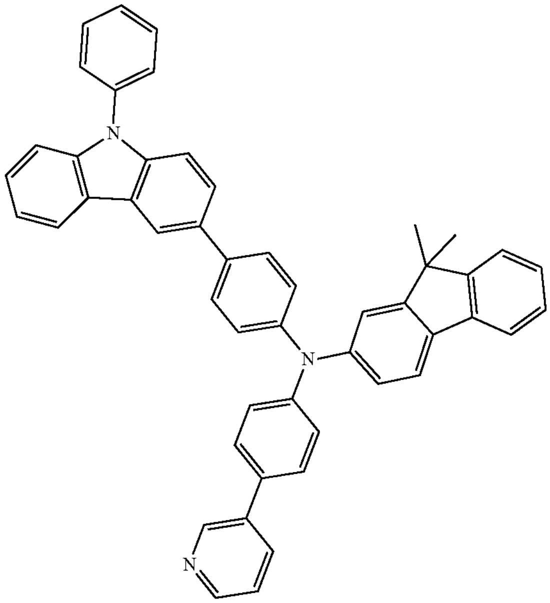
HT14
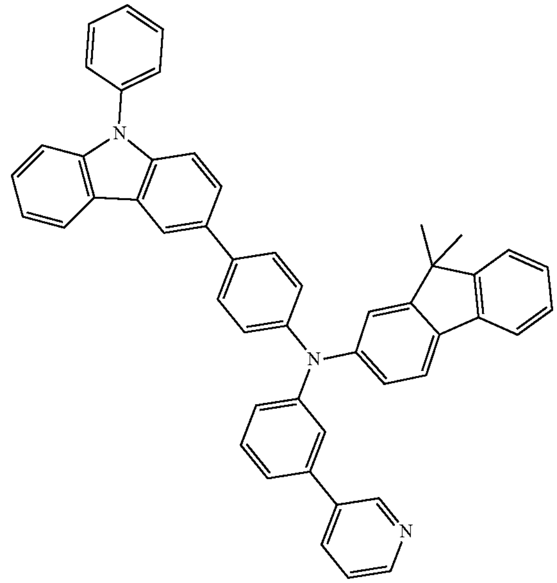
HT15
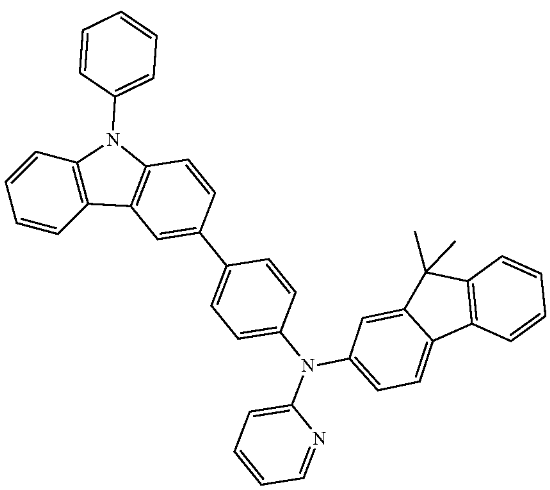
HT16
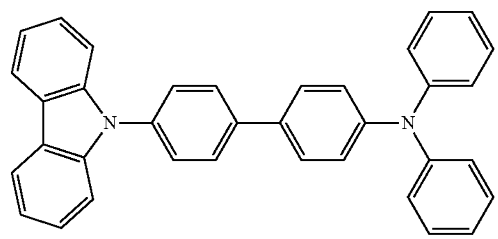
HT17
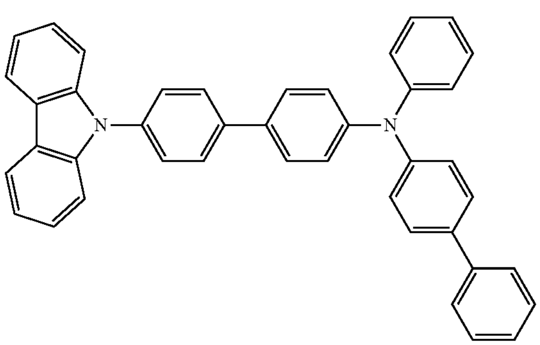
HT18
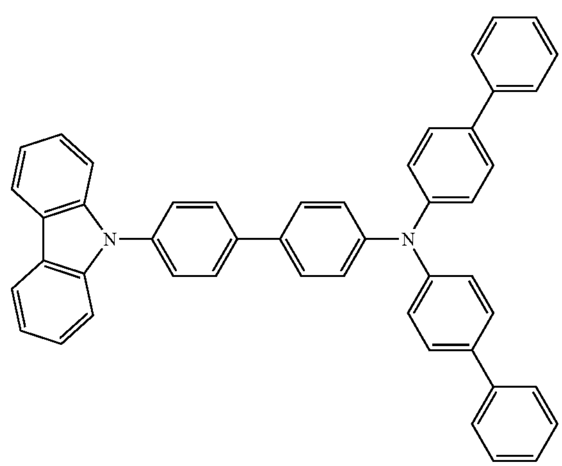

-continued
HT19
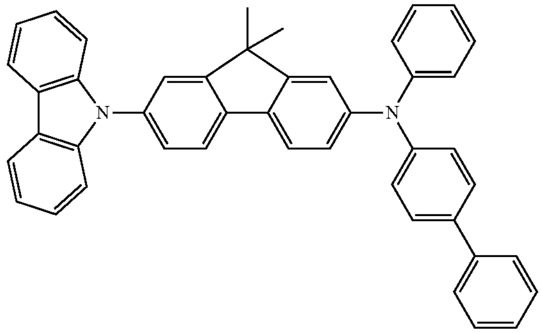
HT20
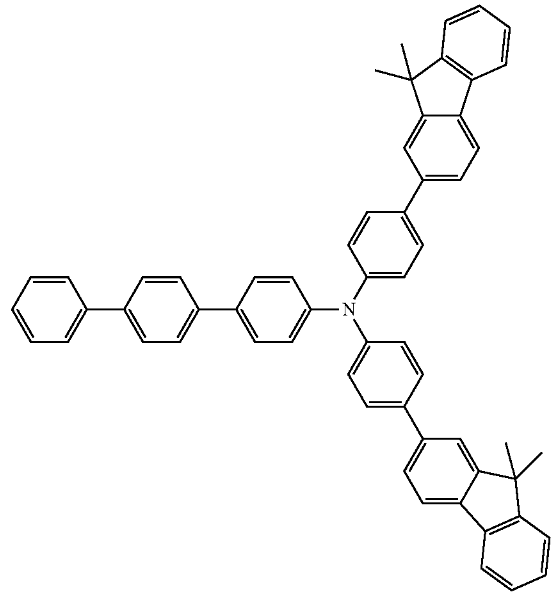
HT21
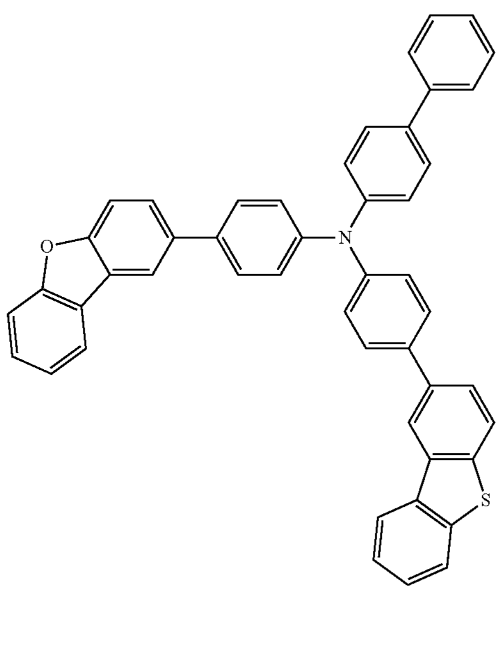
HT22
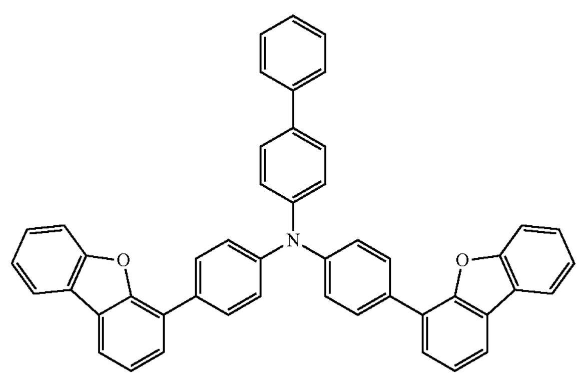

-continued
HT23
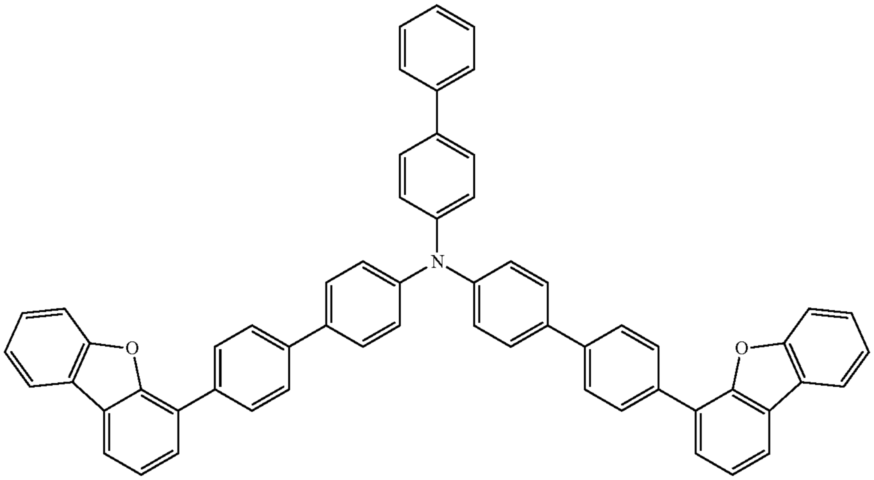
HT24
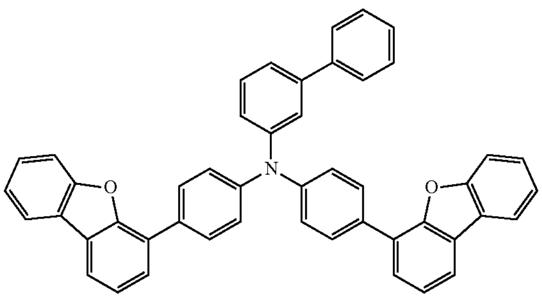
HT25
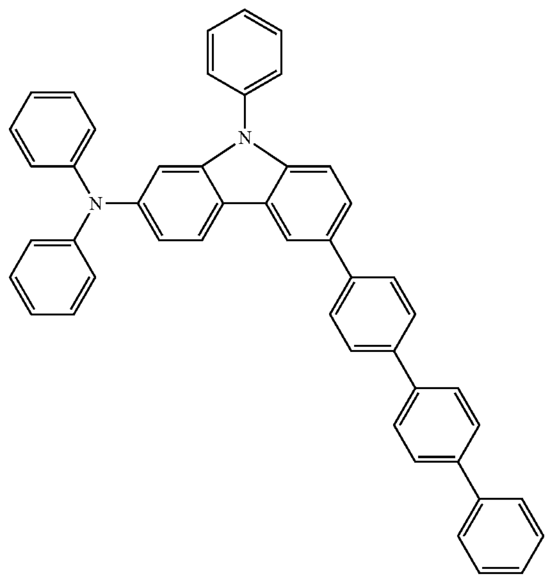
HT26
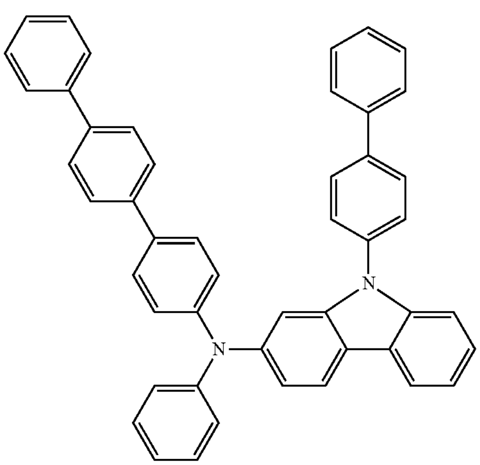
HT27
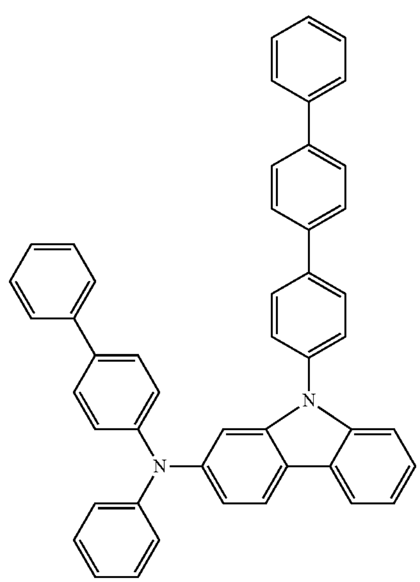

-continued
HT28
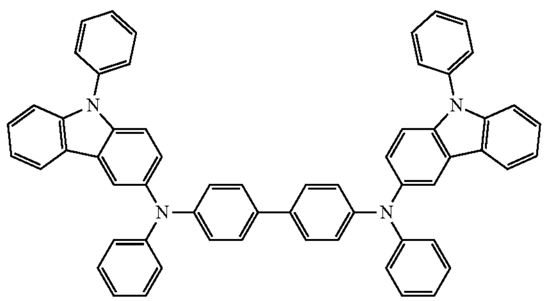
HT29
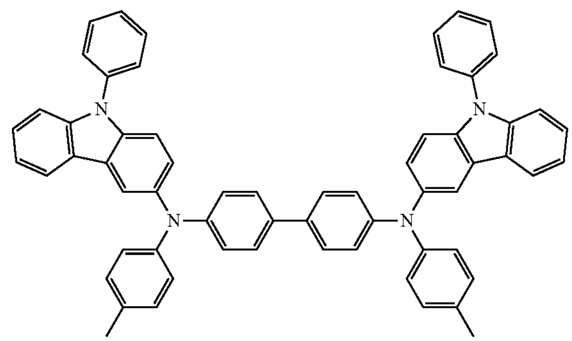
HT30
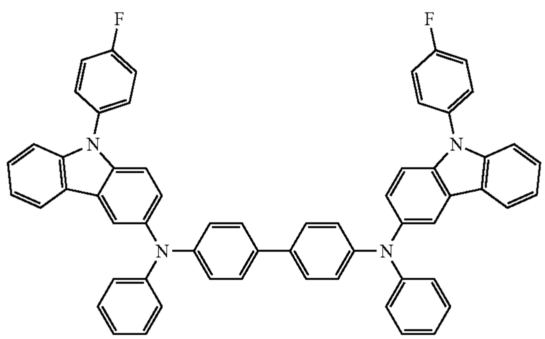
HT31
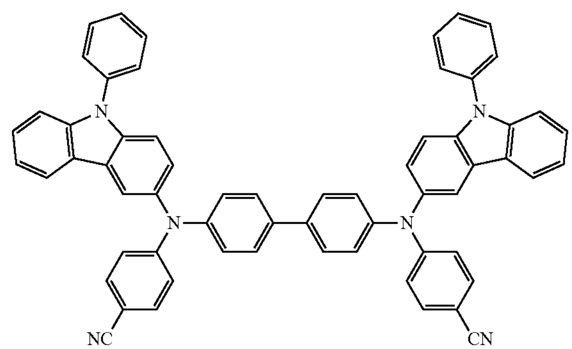
HT32
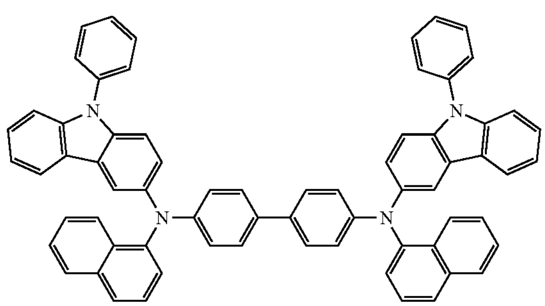
HT33
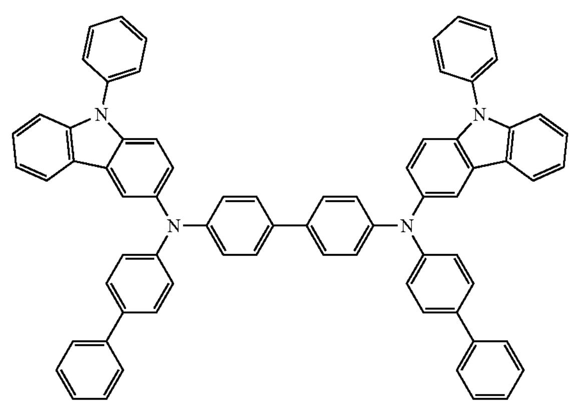

-continued
HT34
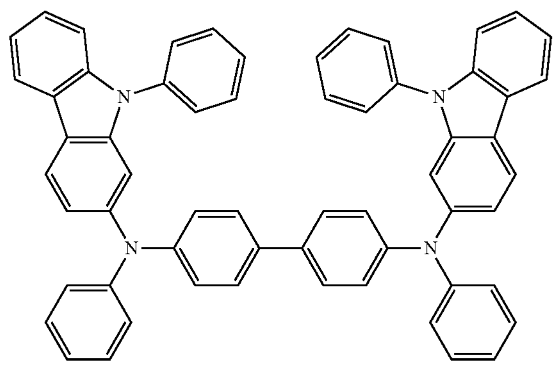
HT35
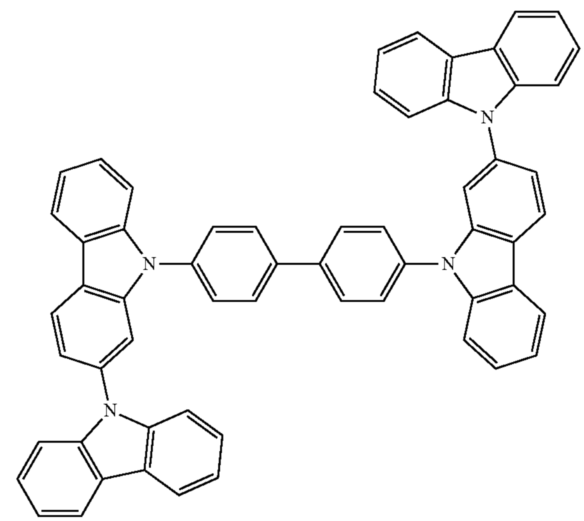
HT36
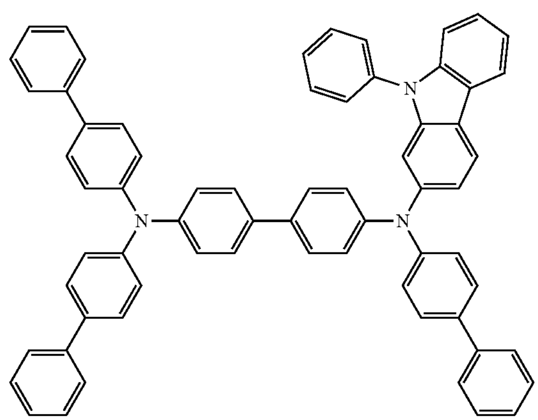
HT37
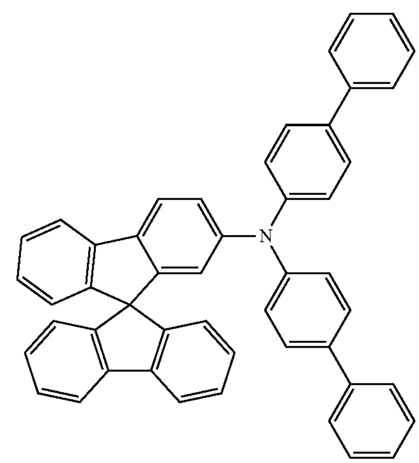
HT38
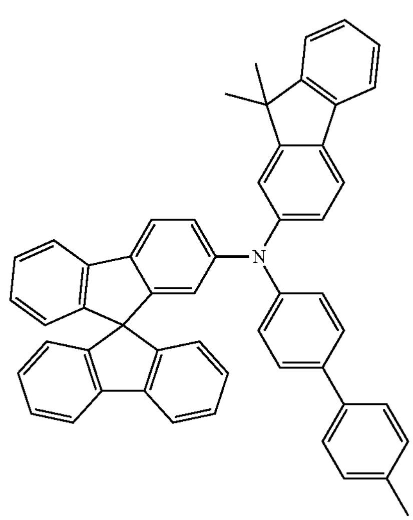
HT39
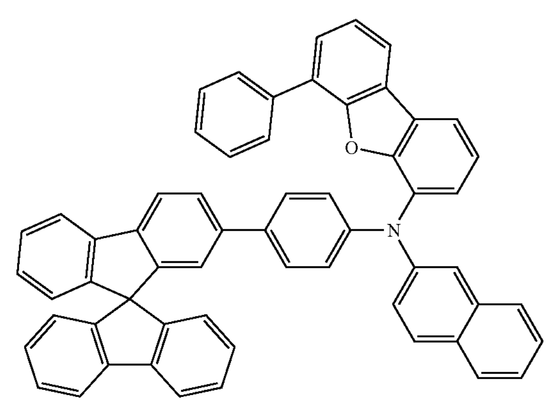

-continued
HT40
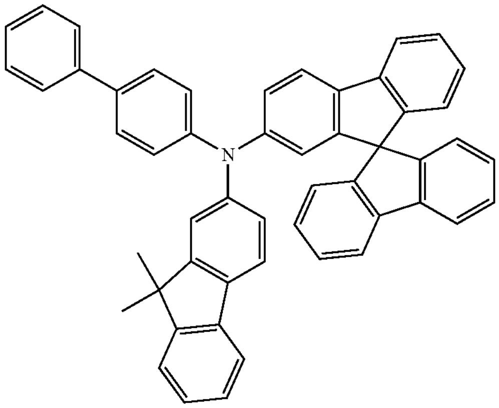
HT41
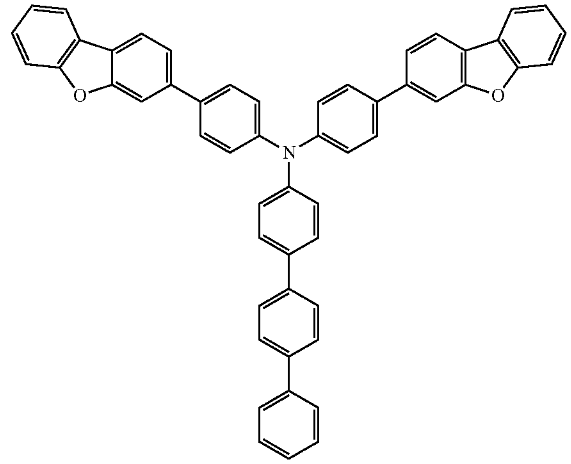
HT42
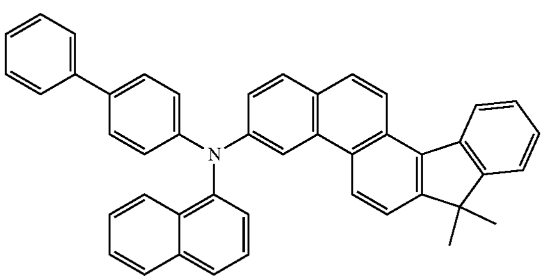
HT43
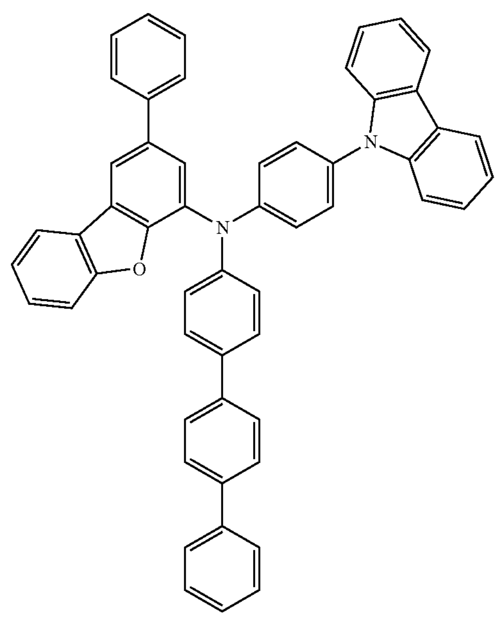

-continued
HT44
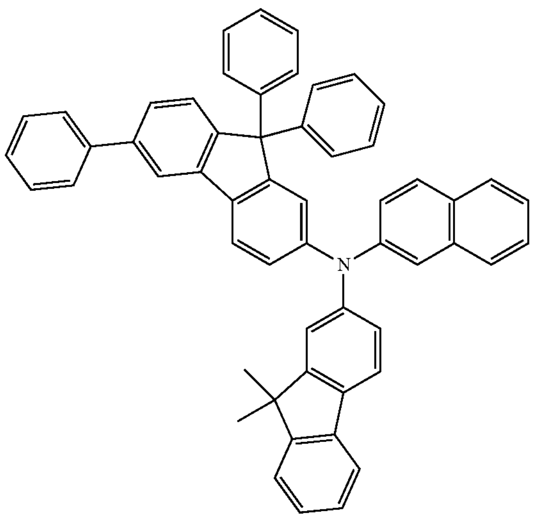
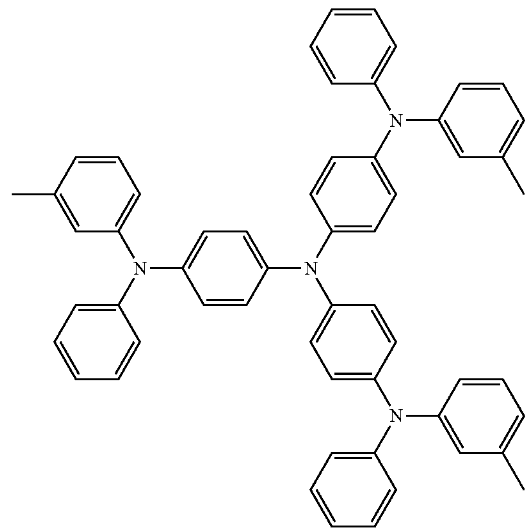
m-MTDATA
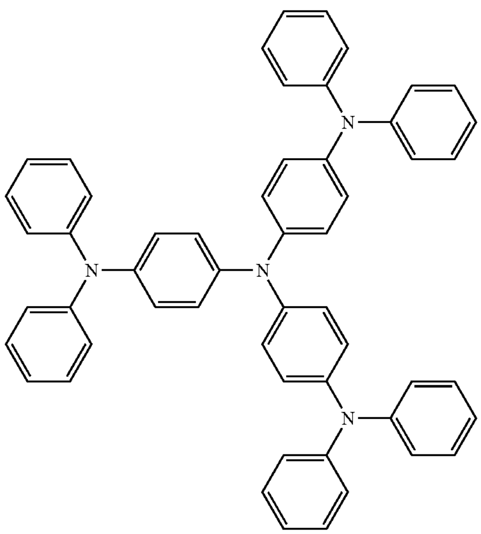
TDATA
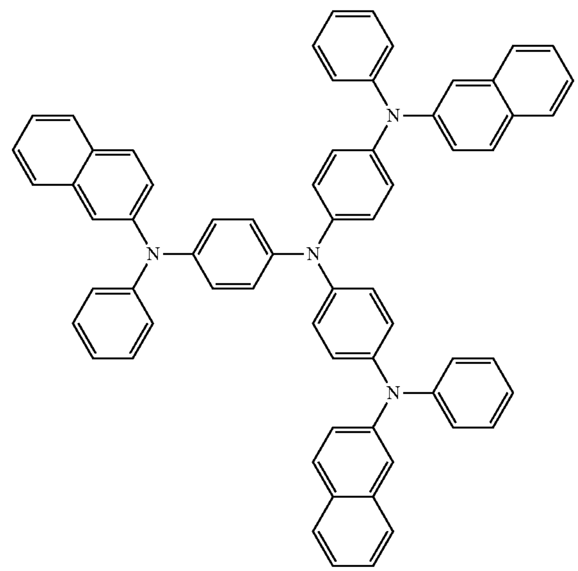
2-TNATA
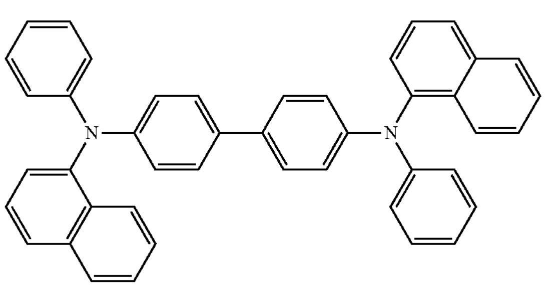
NPB
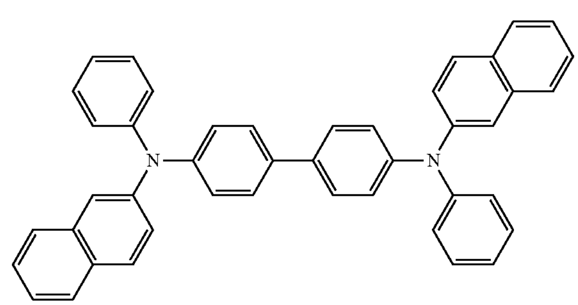
β-NPB -continued

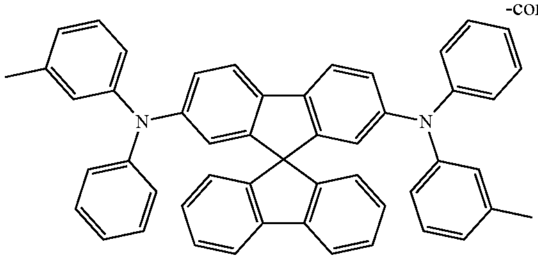

Spiro-TPD

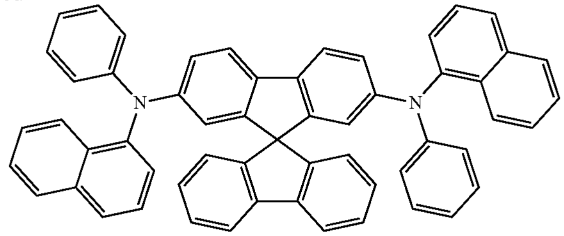

Spiro-NPB

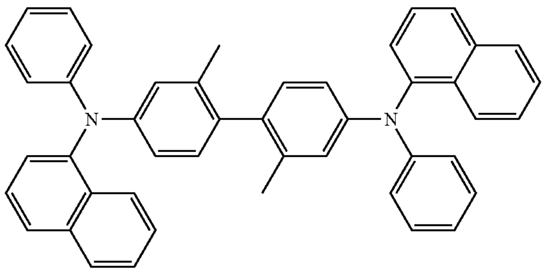

methylated-NPB

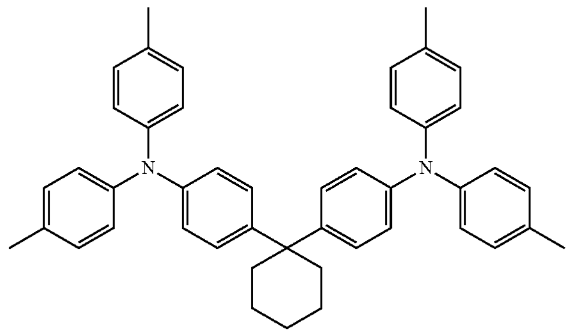

TAPC

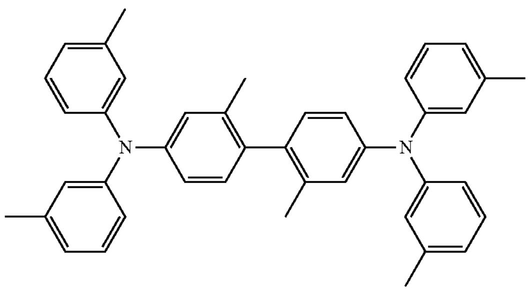

HMTPD

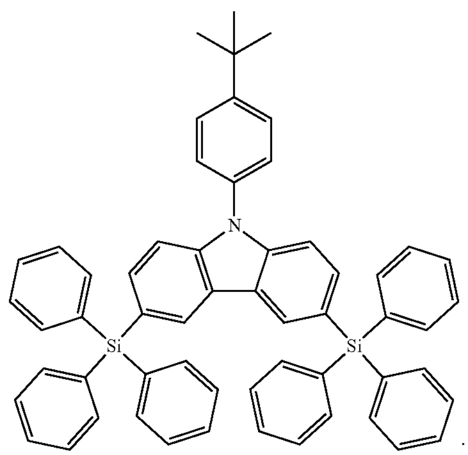

CzSi

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within any of the foregoing ranges, suitable or satisfactory hole transporting characteristics may be obtained without a substantial increase in driving voltage.

The emission auxiliary layer may increase light-emission efficiency by compensating for an optical resonance distance according to the wavelength of light emitted by the emission layer, and the electron blocking layer may block or reduce the flow of electrons from an electron transport region. The emission auxiliary layer and the electron blocking layer may include the materials as described above.

P-Dopant

The hole transport region may further include, in addition to these materials, a charge generation material for the improvement of conductive (e.g., electrically conductive) properties. The charge-generating material may be uniformly or non-uniformly dispersed in the hole transport region (for example, in the form of a single layer including (e.g., consisting of) a charge generation material).

The charge generation material may be, for example, a p-dopant.

In an embodiment, the p-dopant may have a lowest unoccupied molecular orbital (LUMO) energy level of equal to or less than −3.5 eV.

In an embodiment, the p-dopant may include a quinone derivative, a cyano group-containing compound, a compound containing Elements EL1 and EL2, or any combination thereof.

Examples of the quinone derivative are TCNQ and F4-TCNQ.

Examples of the cyano group-containing compound are HAT-CN and a compound represented by Formula 221:

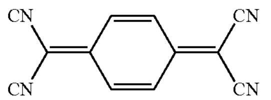

TCNQ

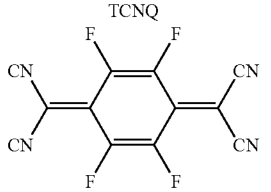

F4-TCNQ

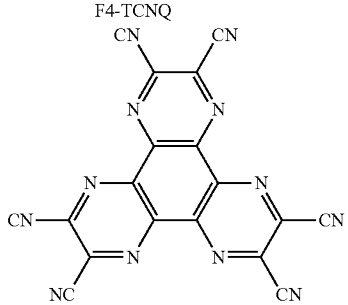

HAT-CN

Formula 221

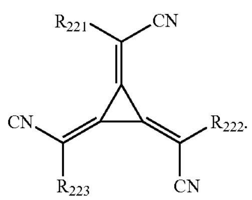

In Formula 221, $R_{221}$ to $R_{223}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, and at least one selected from $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Regarding the compound containing Elements EL1 and EL2, Element EL1 may be a metal, a metalloid, or a combination thereof, and Element EL2 may be a non-metal, a metalloid, or a combination thereof.

Examples of the metal are: an alkali metal (for example, lithium (Li), sodium (Na), potassium (K), rubidium (Rb), cesium (Cs), and/or the like); an alkaline earth metal (for example, beryllium (Be), magnesium (Mg), calcium (Ca), strontium (Sr), barium (Ba), and/or the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); a post-transition metal (for example, zinc (Zn), indium (In), tin (Sn), and/or the like); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like); and/or the like.

Examples of the metalloid are silicon (Si), antimony (Sb), and tellurium (Te).

Examples of the non-metal are oxygen (O) and halogen (for example, F, Cl, Br, I, etc.).

For example, the compound containing Elements EL1 and EL2 may include metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, or any combination thereof.

Examples of the metal oxide are tungsten oxide (for example, WO, $W_2O_3$, $WO_2$, $WO_3$, and/or $W_2O_5$), vanadium oxide (for example, VO, $V_2O_3$, $VO_2$, and/or $V_2O_5$), molybdenum oxide (MoO, $Mo_2O_3$, $MoO_2$, $MoO_3$, and/or $Mo_2O_5$), and rhenium oxide (for example, $ReO_3$).

Examples of the metal halide are alkali metal halide, alkaline earth metal halide, transition metal halide, post-transition metal halide, and lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide are $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are titanium halide (for example, $TiF_4$, $TiCl_4$, $TiBr_4$, and/or $TiI_4$), zirconium halide (for example, $ZrF_4$, $ZrCl_4$, $ZrBr_4$, and/or $ZrI_4$), hafnium halide (for example, $HfF_4$, $HfCl_4$, $HfBr_4$, and/or $HfI_4$), vanadium halide (for example, $VF_3$, $VCl_3$, $VBr_3$, and/or $VI_3$), niobium halide (for example, $NbF_3$, $NbCl_3$, $NbBr_3$, and/or $NbI_3$), tantalum halide (for example, $TaF_3$, $TaCl_3$, $TaBr_3$, and/or $TaI_3$), chromium halide (for example, $CrF_3$, $CrCl_3$, $CrBr_3$, and/or $CrI_3$), molybdenum halide (for example, $MoF_3$, $MoCl_3$, $MoBr_3$, and/or $MoI_3$), tungsten halide (for example, $WF_3$, $WCl_3$, $WBr_3$, and/or $WI_3$), manganese halide (for example, $MnF_2$, $MnCl_2$, $MnBr_2$, and/or $MnI_2$), technetium halide (for example, $TcF_2$, $TcCl_2$, $TcBr_2$, and/or $TcI_2$), rhenium halide (for example, $ReF_2$, $ReCl_2$, $ReBr_2$, and/or $ReI_2$), iron halide (for example, $FeF_2$, $FeCl_2$, $FeBr_2$, and/or $FeI_2$), ruthenium halide (for example, $RuF_2$, $RuCl_2$, $RuBr_2$, and/or $RuI_2$), osmium halide (for example, $OsF_2$, $OsCl_2$, $OsBr_2$, and/or $OsI_2$), cobalt halide (for example, $CoF_2$, $CoCl_2$, $CoBr_2$, and/or $COI_2$), rhodium halide (for example, $RhF_2$, $RhCl_2$, $RhBr_2$, and/or $RhI_2$), iridium halide (for example, $IrF_2$, $IrCl_2$, $IrBr_2$, and/or $IrI_2$), nickel halide (for example, $NiF_2$, $NiCl_2$, $NiBr_2$, and/or $NiI_2$), palladium halide (for example, $PdF_2$, $PdCl_2$, $PdBr_2$, and/or $PdI_2$), platinum halide (for example, $PtF_2$, $PtCl_2$, $PtBr_2$, and/or $PtI_2$), copper halide (for example, CuF, CuCl, CuBr, and/or CuI), silver halide (for example, AgF, AgCl, AgBr, and/or AgI), and gold halide (for example, AuF, AuCl, AuBr, and/or AuI).

Examples of the post-transition metal halide are zinc halide (for example, $ZnF_2$, $ZnCl_2$, $ZnBr_2$, and/or $ZnI_2$), indium halide (for example, $InI_3$), and tin halide (for example, $SnI_2$).

Examples of the lanthanide metal halide are YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

An example of the metalloid halide is antimony halide (for example, $SbCl_5$).

Examples of the metal telluride are an alkali metal telluride (for example, $Li_2Te$, $Na_2Te$, $K_2Te$, $Rb_2Te$, and/or $Cs_2Te$), alkaline earth metal telluride (for example, BeTe, MgTe, CaTe, SrTe, and/or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, and/or $Au_2Te$), post-transition metal telluride (for example, and/or ZnTe), and lanthanide metal telluride (for example, LaTe, CeTe, PrTe, NdTe, PmTe, EuTe, GdTe, TbTe, DyTe, HoTe, ErTe, TmTe, YbTe, and/or LuTe).

Emission Layer in Interlayer 130

When the light-emitting device 10 is a full-color light-emitting device, the emission layer may be patterned into a red emission layer, a green emission layer, and/or a blue emission layer, according to a sub-pixel. In one or more embodiments, the emission layer may have a stacked structure of two or more layers of a red emission layer, a green emission layer, and a blue emission layer, in which the two or more layers contact (e.g., physically contact) each other or are separated from each other. In one or more embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be in a range about 0.01 parts by weight to about 15 parts by weight based on 100 parts by weight of the host.

In one or more embodiments, the emission layer may include quantum dots.

wherein, in Formula 301, $Ar_{301}$ and $L_{301}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xb11 may be 1, 2, or 3, xb1 may be an integer selected from 0 to 5, $R_{301}$ may be hydrogen, deuterium, —F, —Cl, —Br, —I, hydroxyl group, cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{301})(Q_{302})(Q_{303})$, —$N(Q_{301})(Q_{302})$, —$B(Q_{301})(Q_{302})$, —$C(=O)(Q_{301})$, —$S(=O)_2(Q_{301})$, or —$P(=O)(Q_{301})(Q_{302})$, xb21 may be an integer selected from 1 to 5, and $Q_{301}$ to $Q_{303}$ may each be the same as described in connection with $Q_1$.

For example, when xb11 in Formula 301 is 2 or more, two or more $Ar_{301}$(s) may be linked to each other via a single bond.

In one or more embodiments, the host may include a compound represented by Formula 301-1, a compound represented by Formula 301-2, or any combination thereof:

Formula 301-1

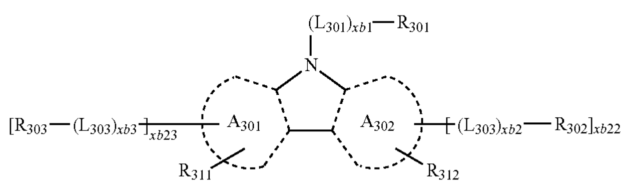

Formula 301-2

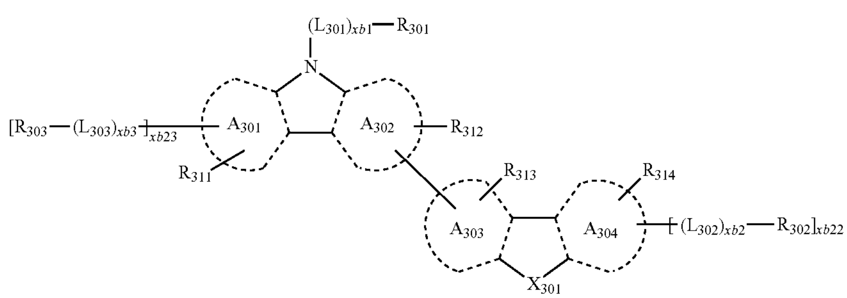

In some embodiments, the emission layer may include a delayed fluorescence material. The delayed fluorescence material may serve as a host or a dopant in the emission layer.

A thickness of the emission layer may be in a range of about 100 Å to about 1,000 Å, for example, about 200 Å to about 600 Å. When the thickness of the emission layer is within any of the foregoing ranges, excellent light-emission characteristics may be obtained without a substantial increase in driving voltage.

Host

In an embodiment, the host may include a compound represented by Formula 301:

$$[Ar_{301}]_{xb11}\text{-}[(L_{301})_{xb1}\text{-}R_{301}]_{xb21} \quad \text{Formula 301}$$

wherein, in Formulae 301-1 and 301-2, ring $A_{301}$ to ring $A_{304}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $X_{301}$ may be O, S, N-[$(L_{304})_{xb4}$-$R_{304}$], $C(R_{304})(R_{305})$, or $Si(R_{304})(R_{305})$, xb22 and xb23 may each independently be 0, 1, or 2, $L_{301}$, xb1, and $R_{301}$ may each be the same as described in the present specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may each be the same as described in connection with $R_{301}$.

In one or more embodiments, the host may include an alkaline earth metal complex. In one or more embodiments, the host may include a Be complex (for example, Compound H55), a Mg complex, a Zn complex, or any combination thereof.

In one or more embodiments, the host may include one selected from Compounds H1 to H124, 9,10-di(2-naphthyl) anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

H1

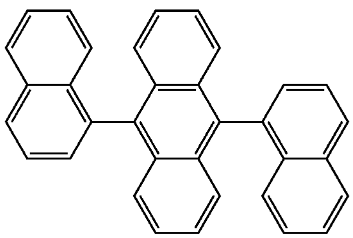

H2

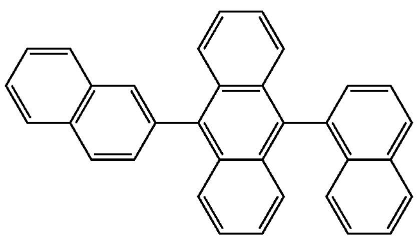

H3

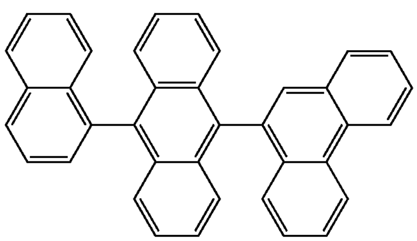

H4

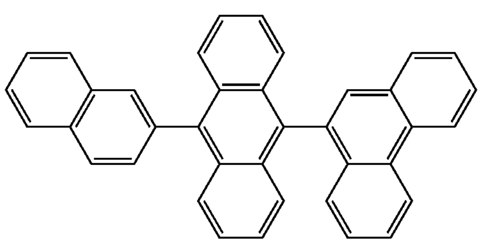

H5

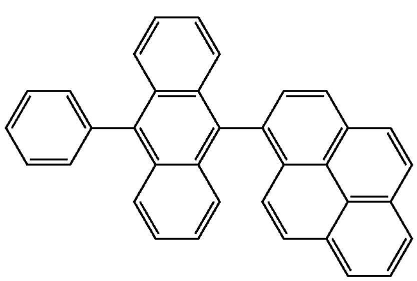

-continued

H6

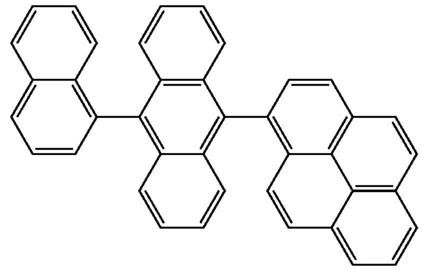

H7

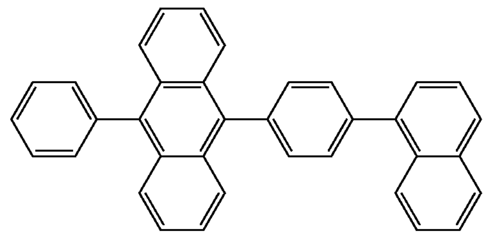

H8

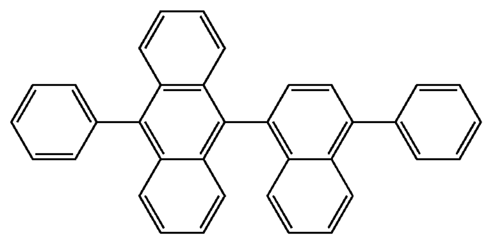

H9

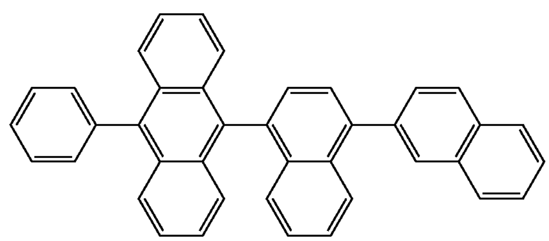

H10

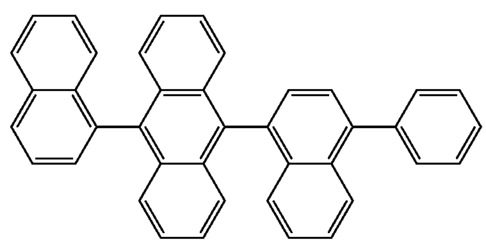

H11

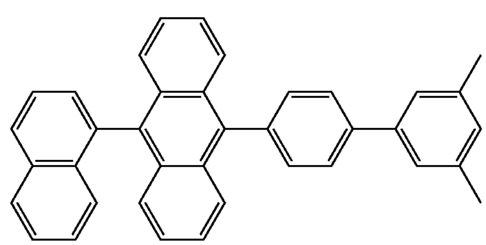

-continued
H12
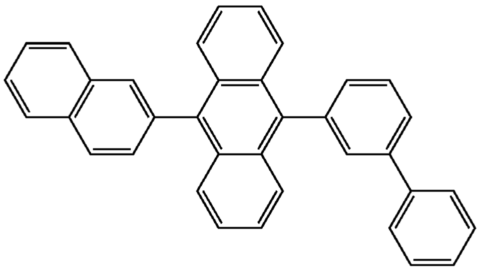
H13
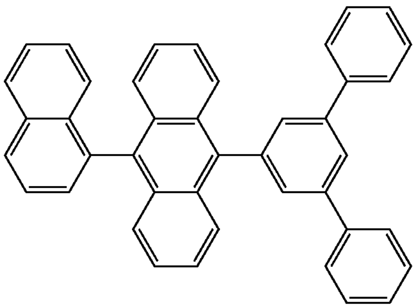
H14
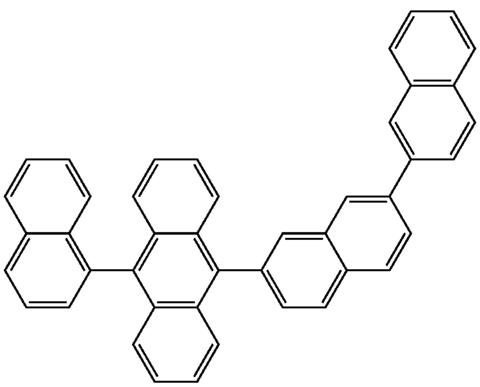
H15
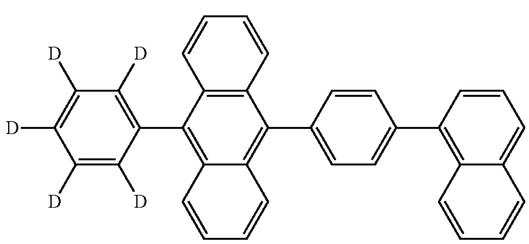
H16
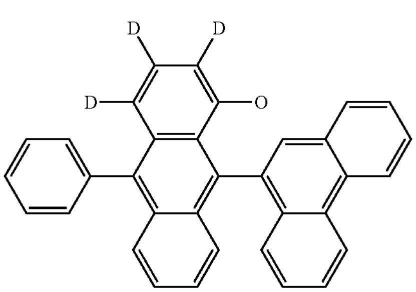
-continued
H17
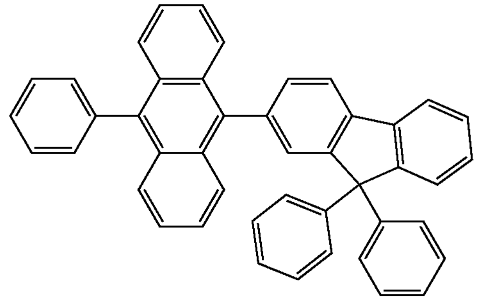
H18
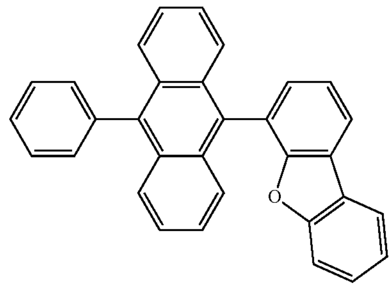
H19
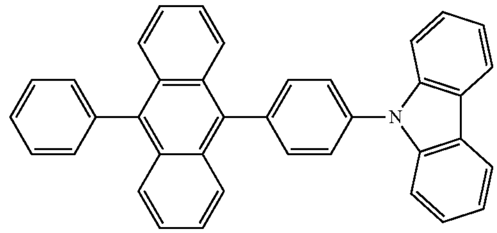
H20
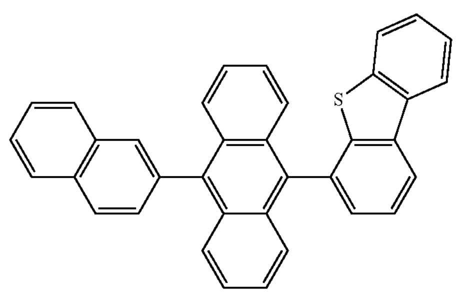
H21
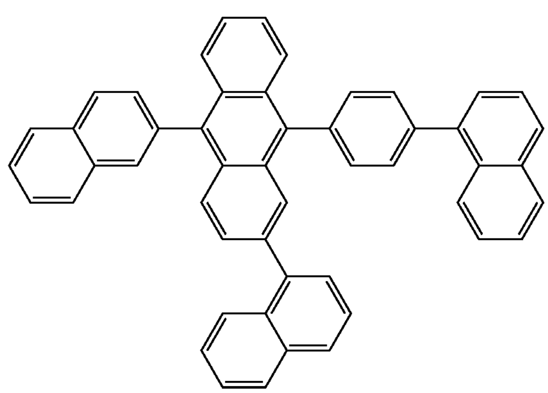

H22
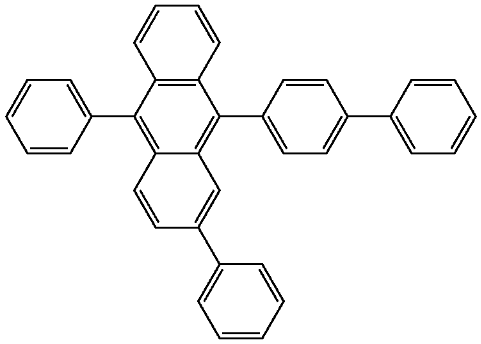
H23
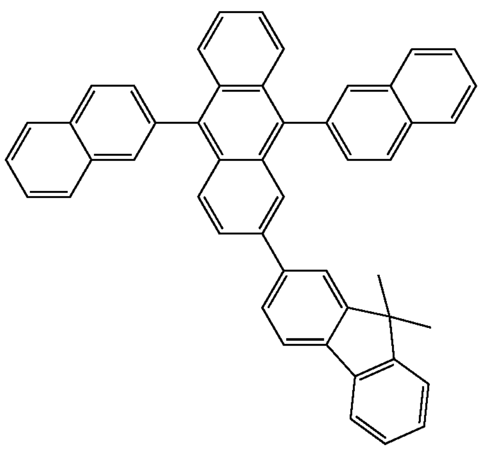
H24
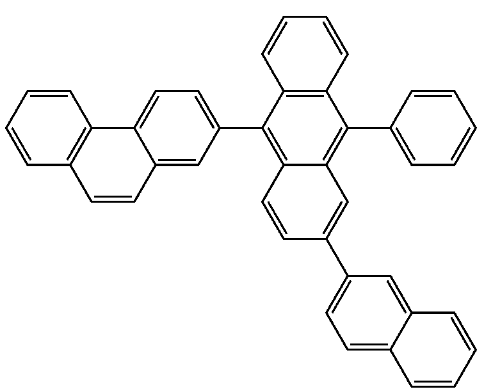
H25
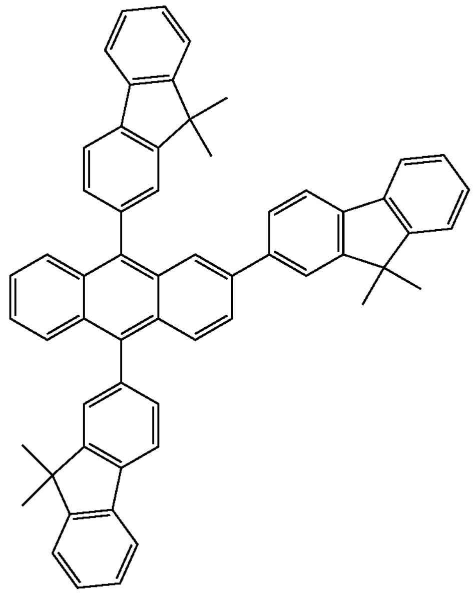
H26
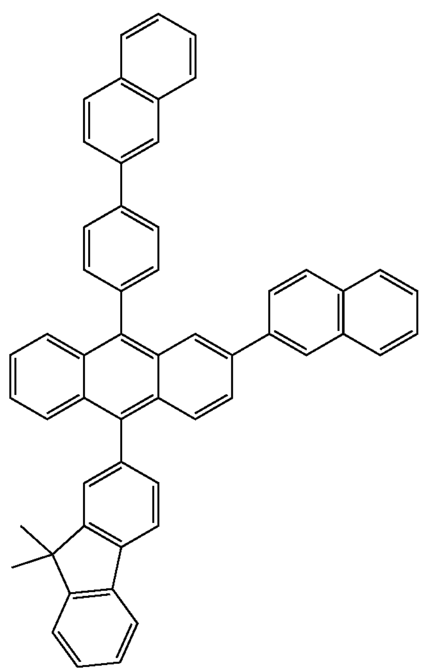

-continued
H27
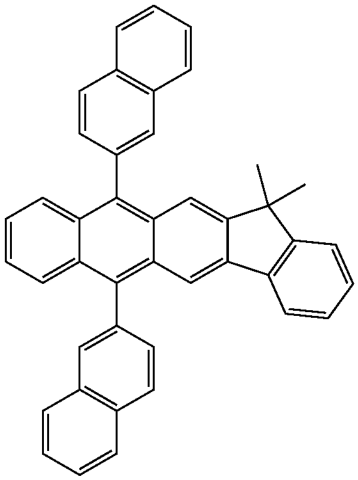
H28
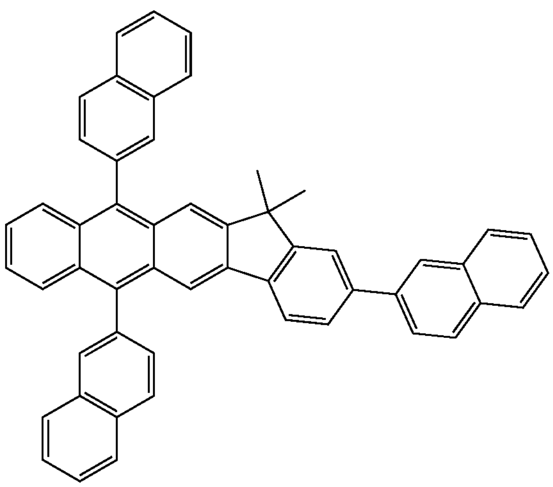
H29
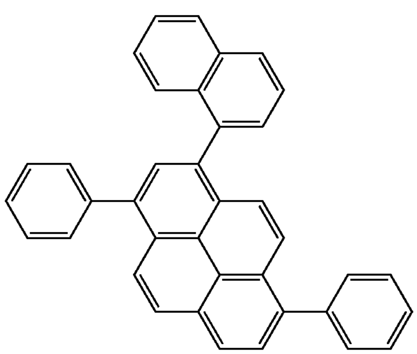
-continued
H30
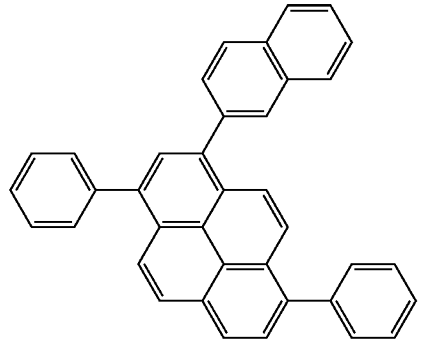
H31
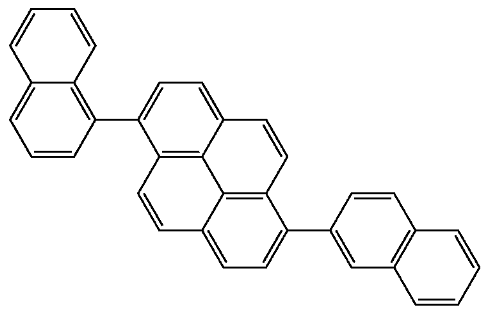
H32
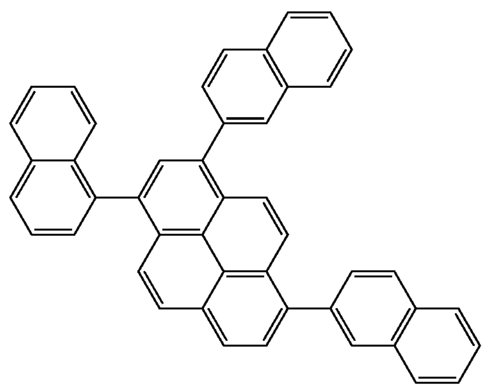
H33
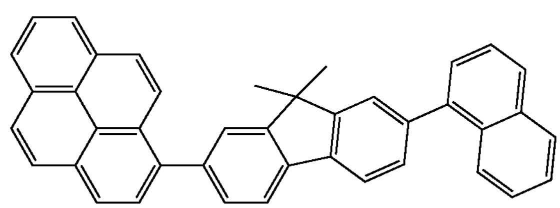
H34
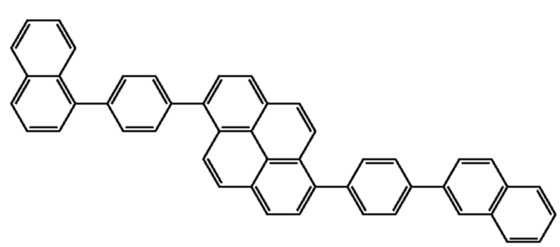

-continued
H35
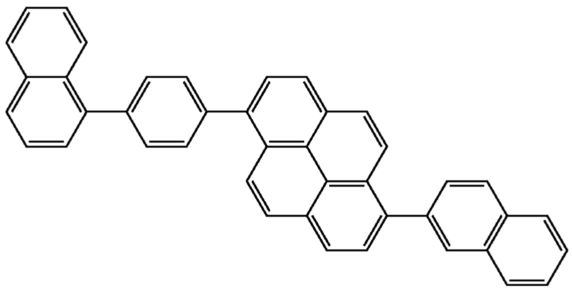
H36
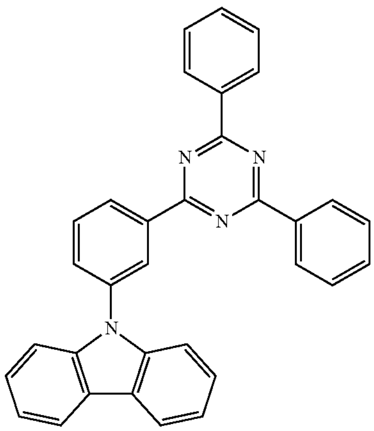
H37
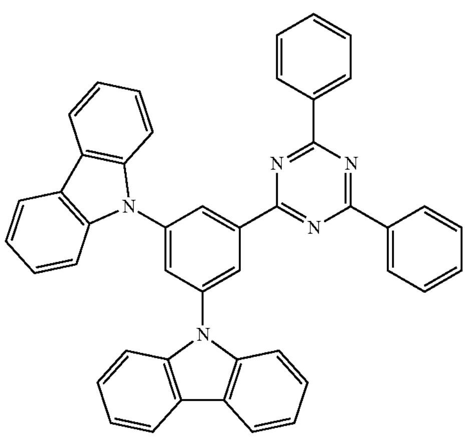
H38
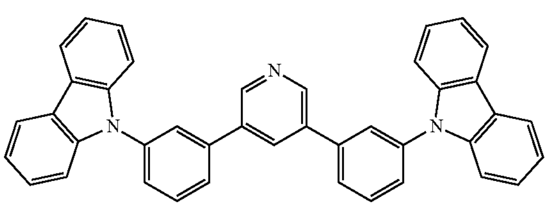
-continued
H39
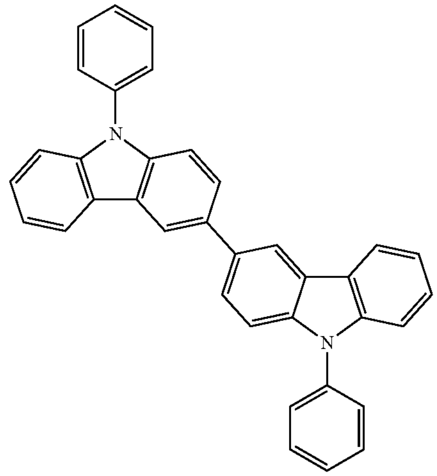
H40
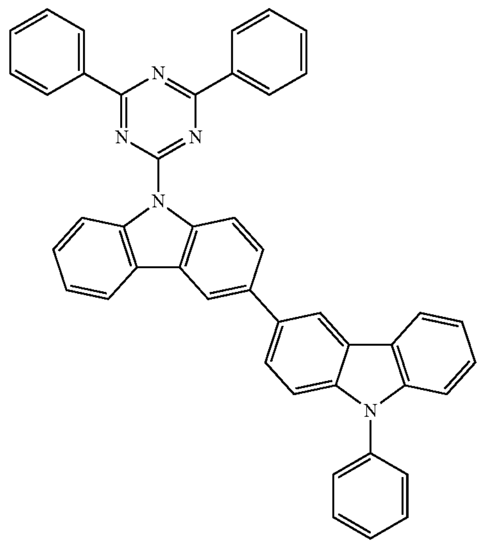
H41
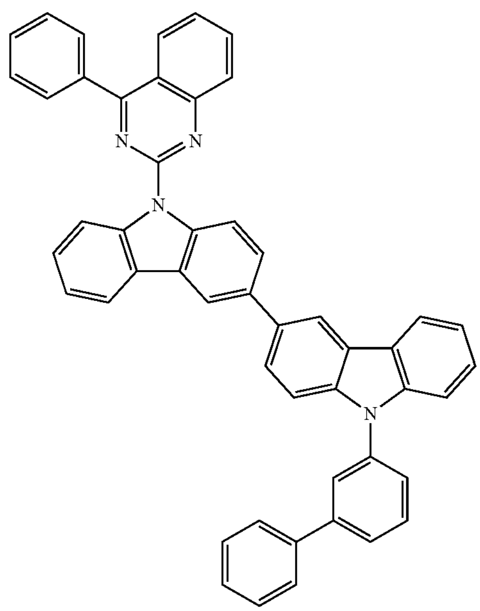

-continued
H42
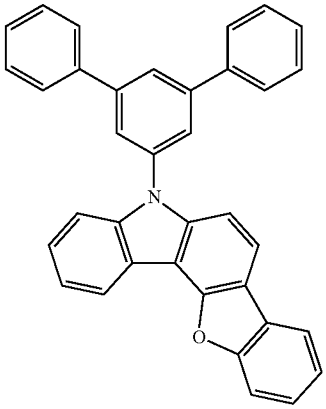
H43
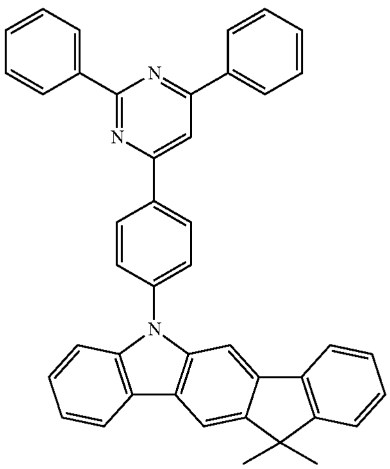
H44
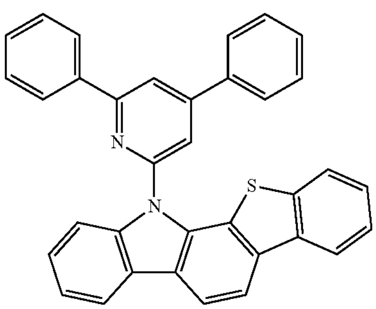
H45
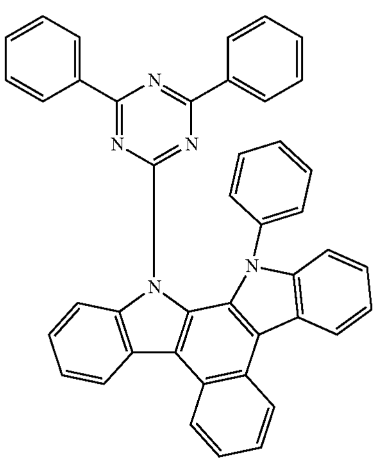
-continued
H46
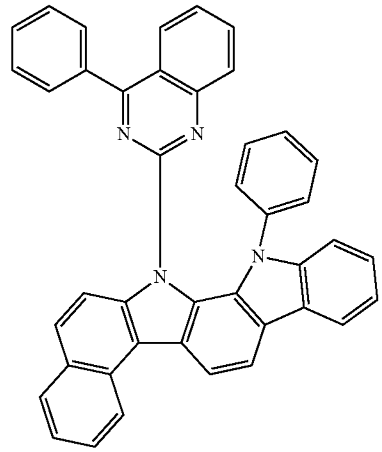
H47
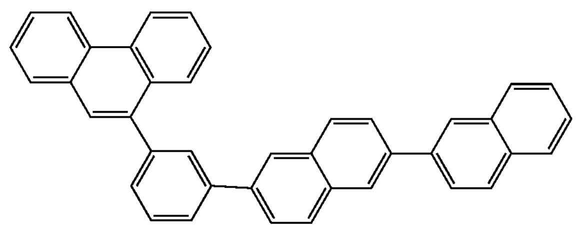
H48
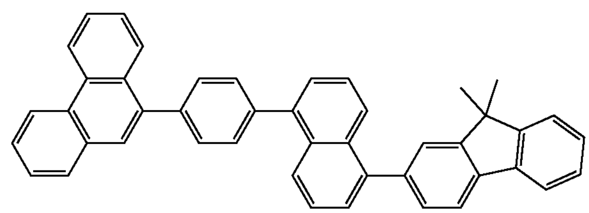
H49
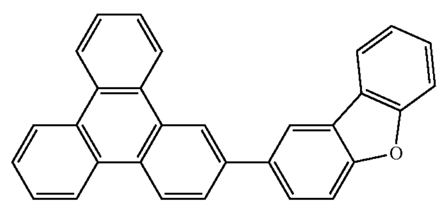
H50
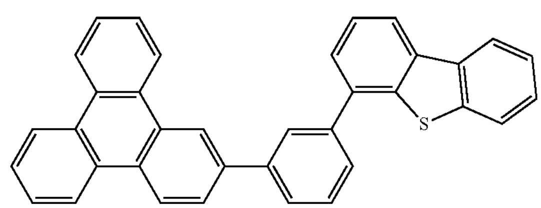
H51
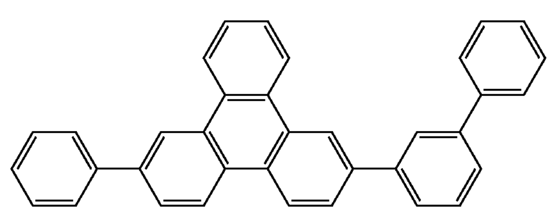

-continued
H52
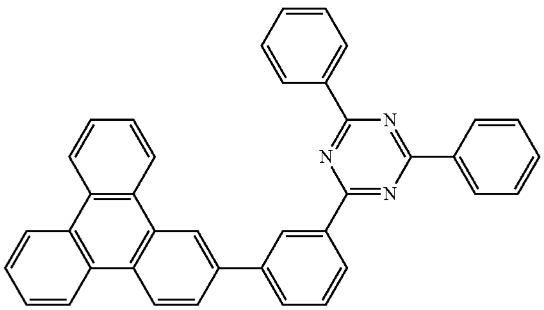
H53
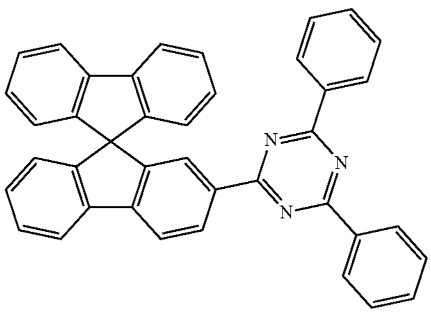
H54
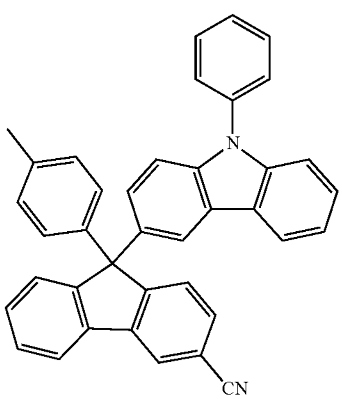
H55
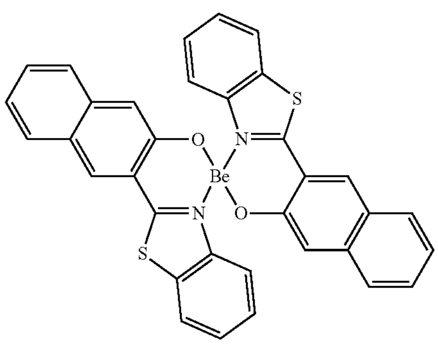
-continued
H56
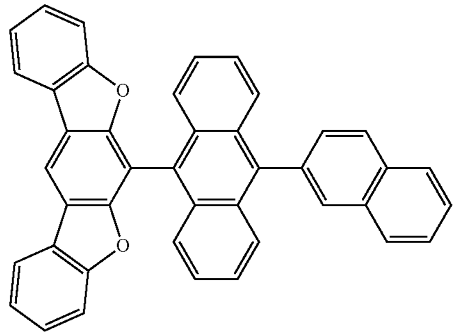
H57
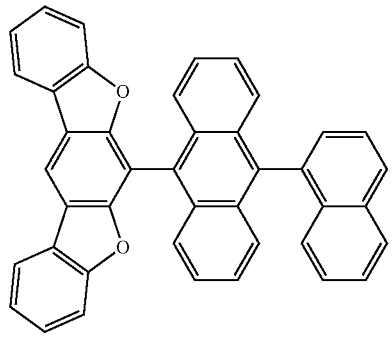
H58
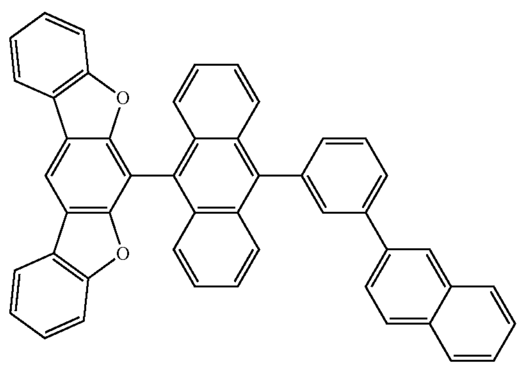
H59
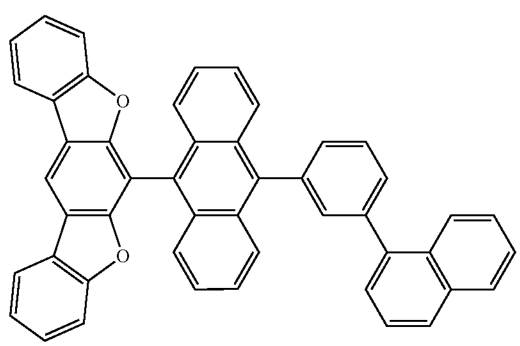

-continued
H60
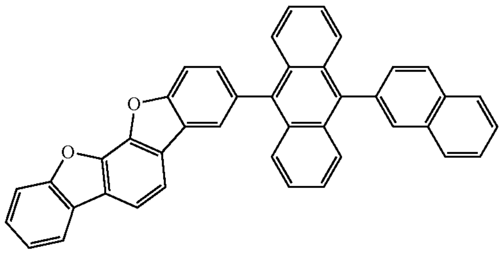
H61
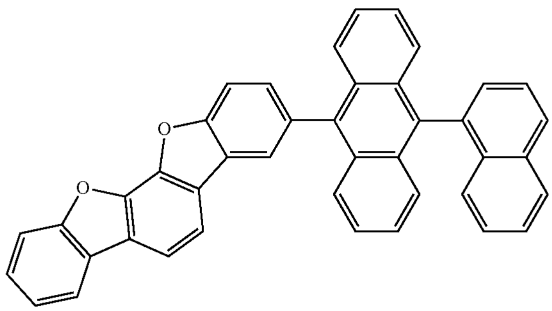
H62
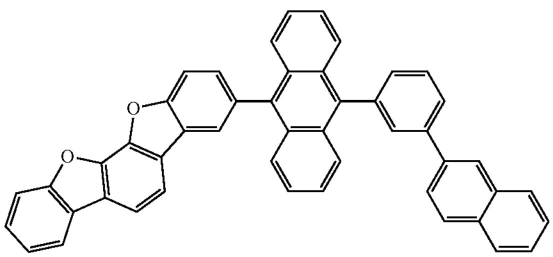
H63
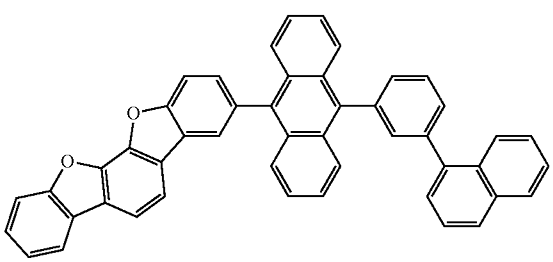
H64
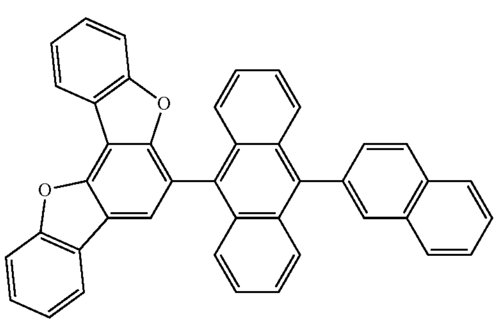
-continued
H65
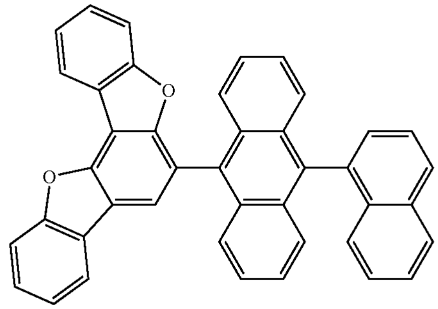
H66
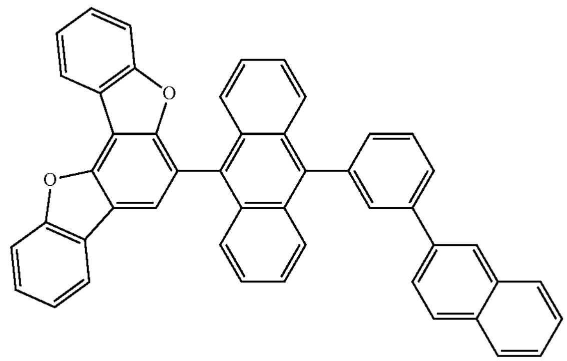
H67
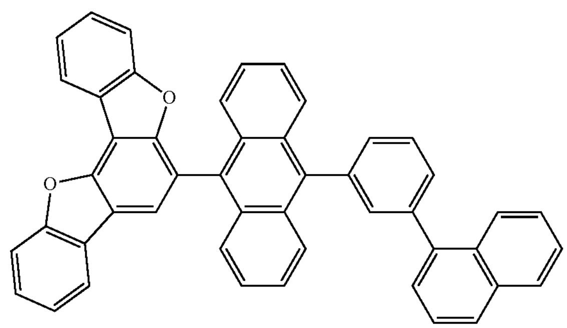
H68
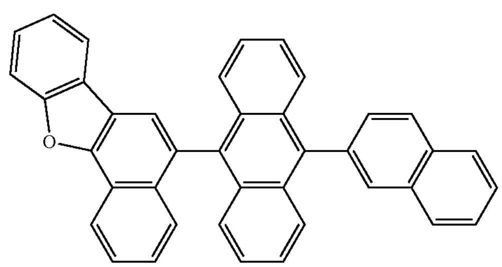
H69
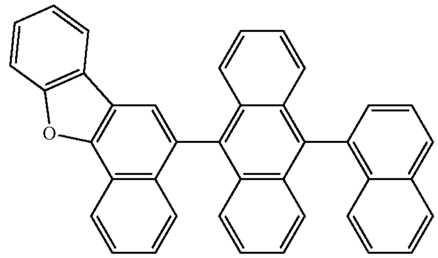

-continued
H70
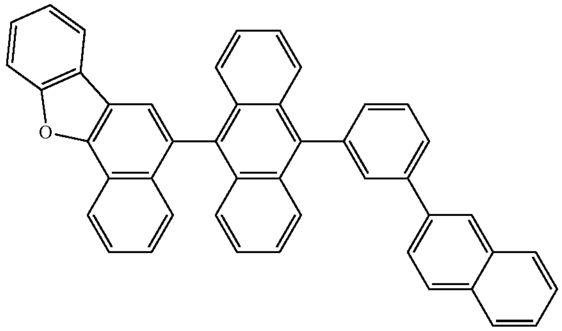
H71
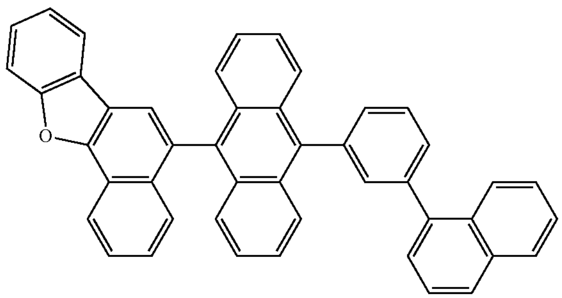
H72
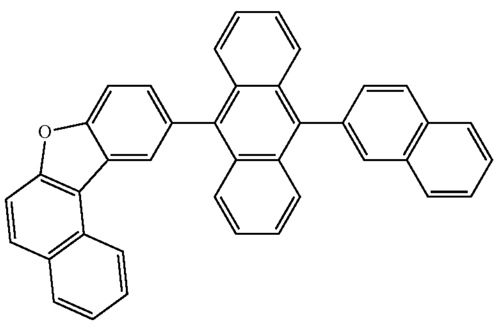
H73
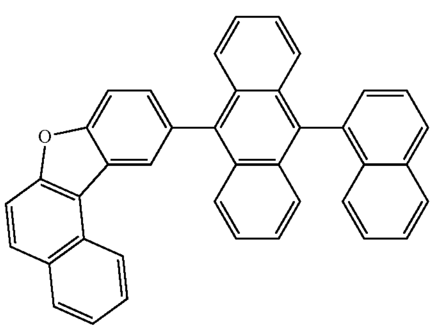
-continued
H74
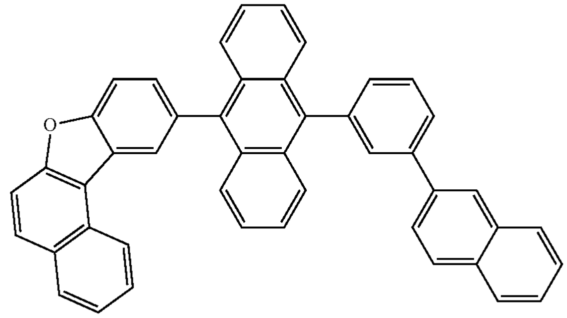
H75
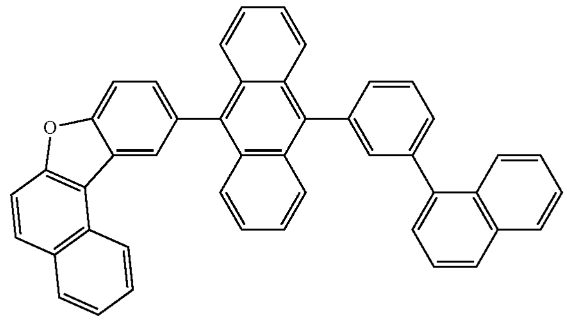
H76
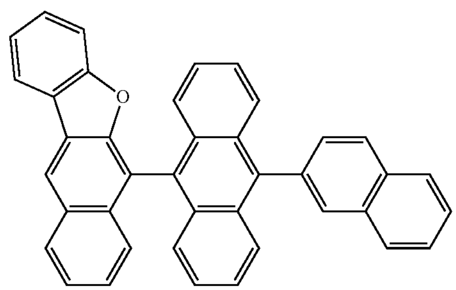
H77
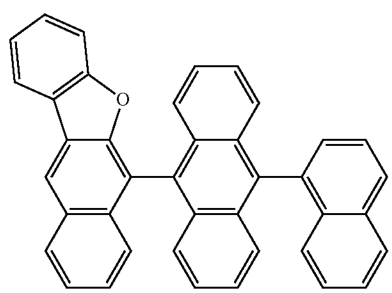
H78
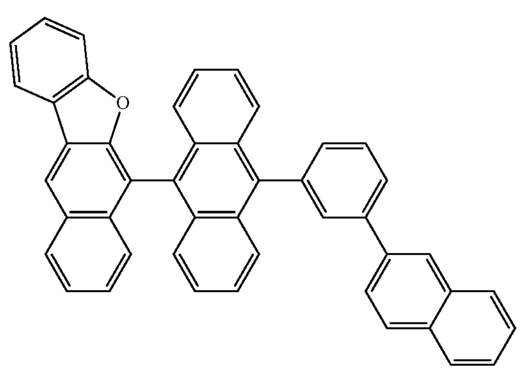

-continued
H79
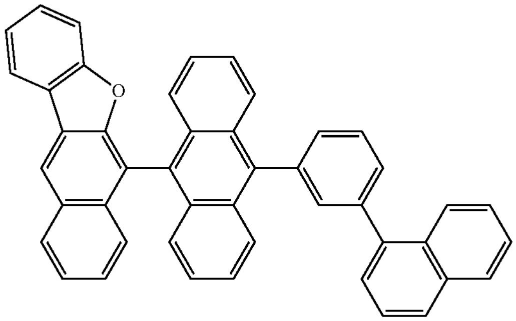
H80
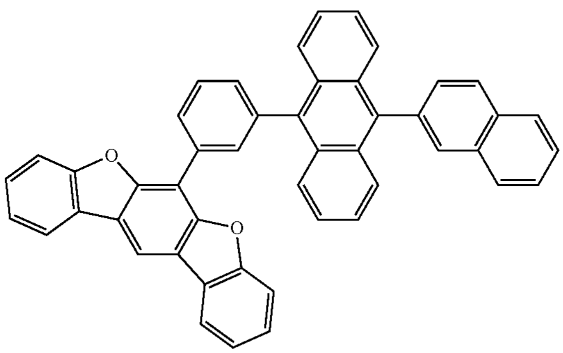
H81
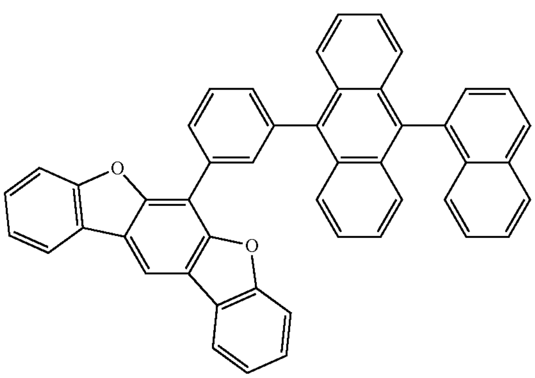
H82
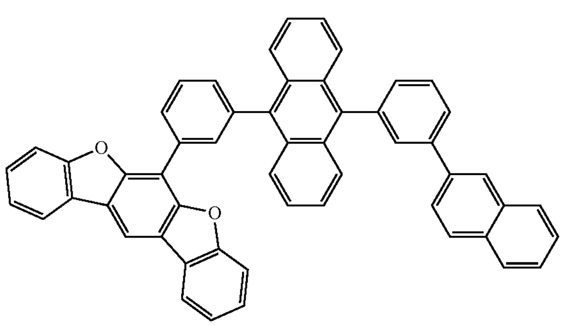
-continued
H83
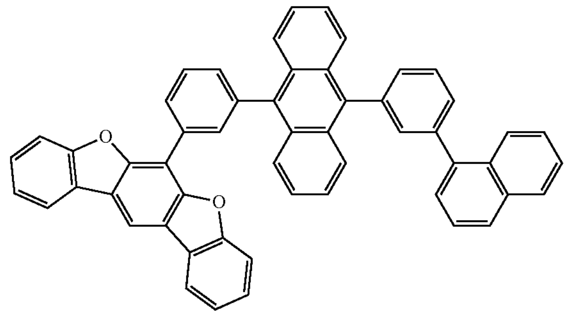
H84
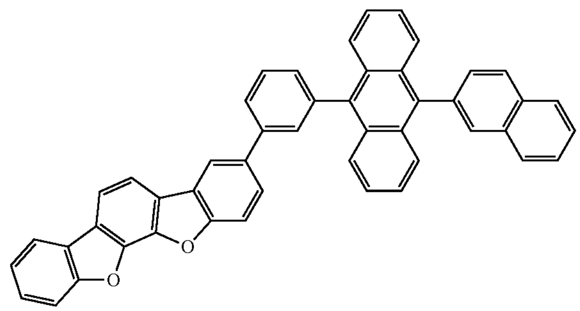
H85
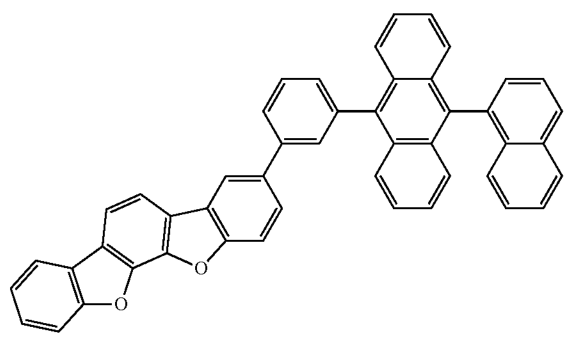
H86
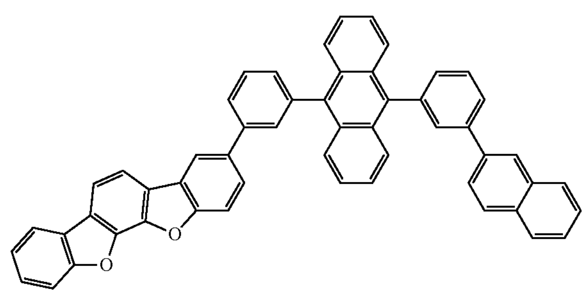
H87
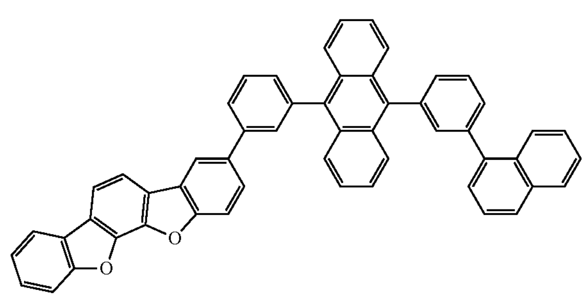

-continued
H88
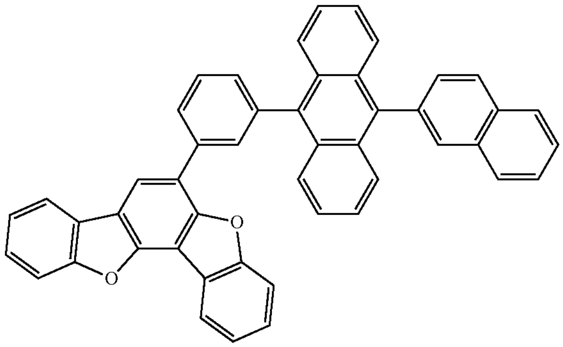
H89
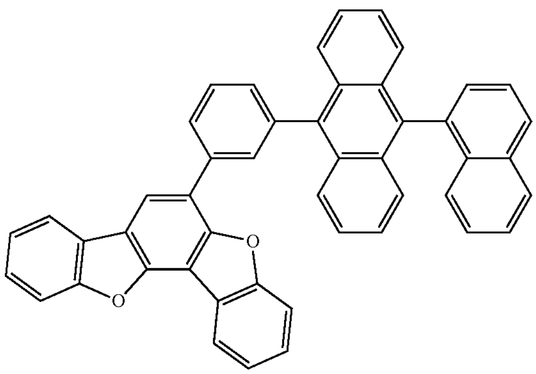
H90
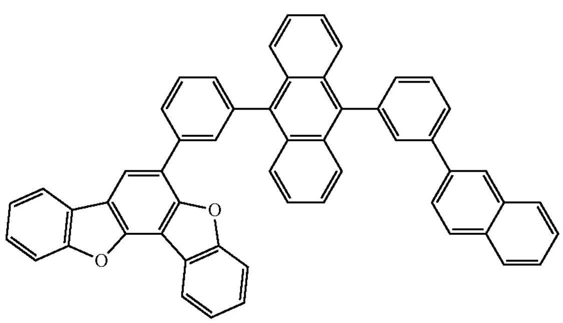
H91
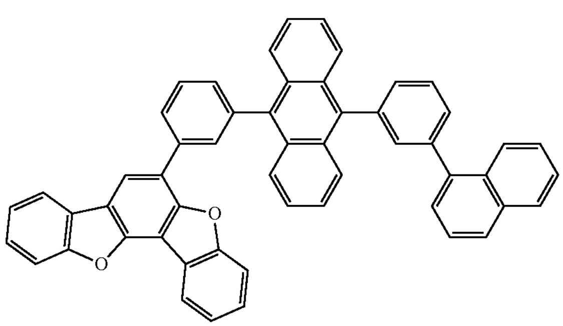
-continued
H92
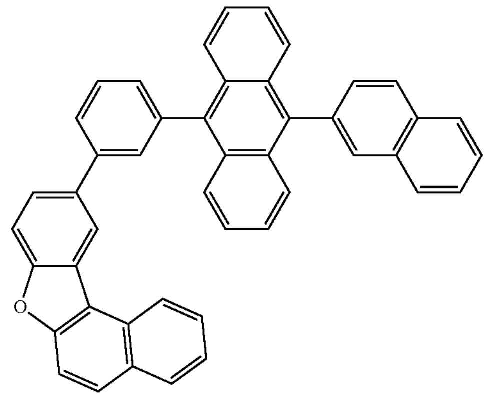
H93
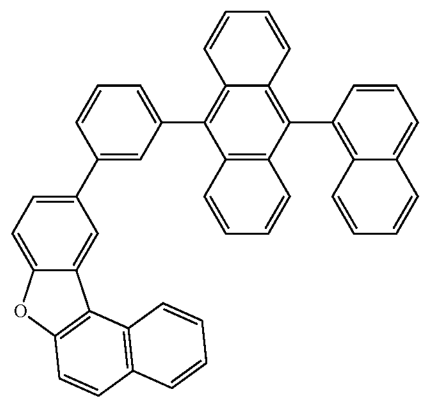
H94
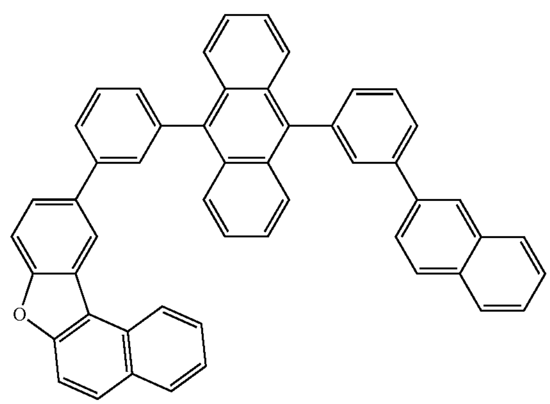
H95
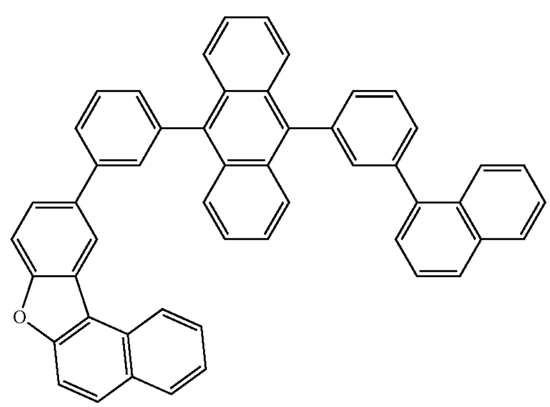

H96
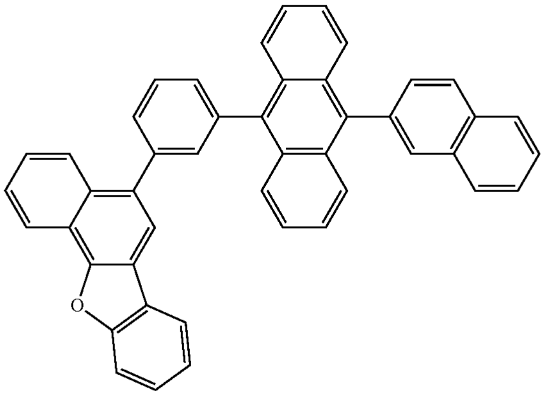
H97
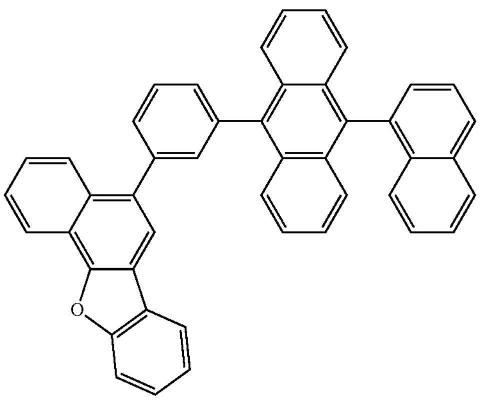
H98
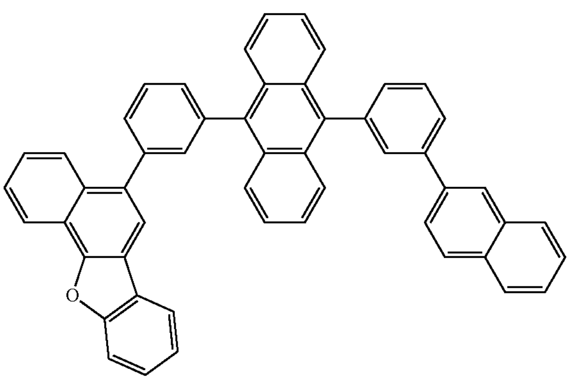
H99
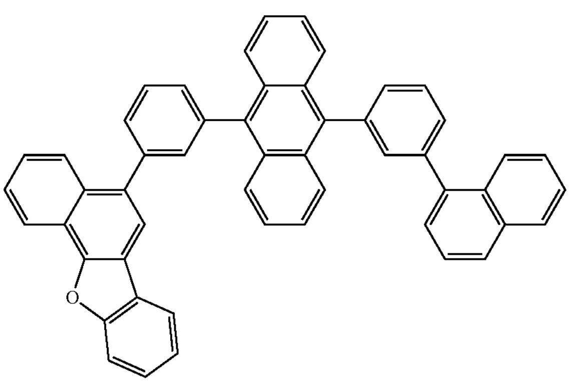
H100
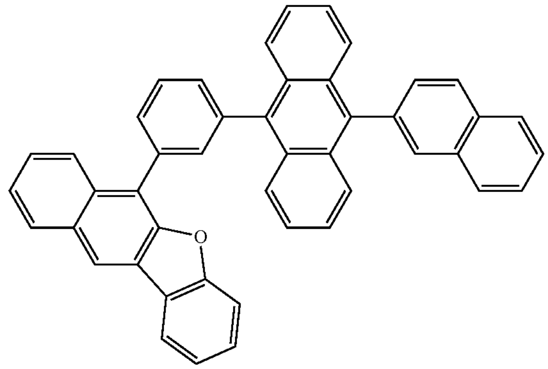
H101
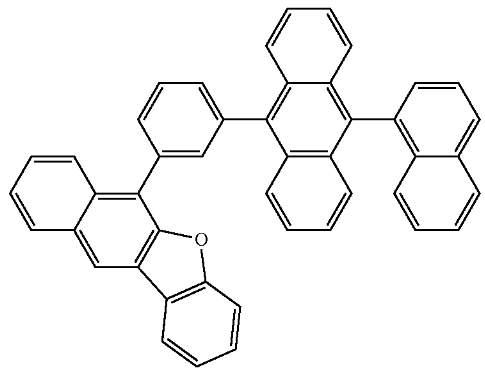
H102
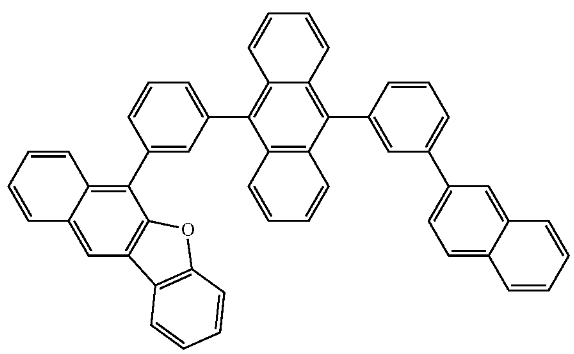
H103
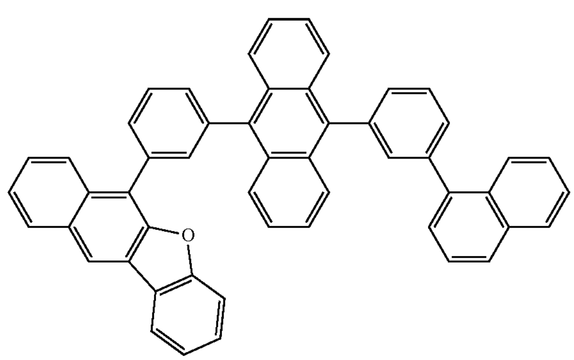

-continued
H104
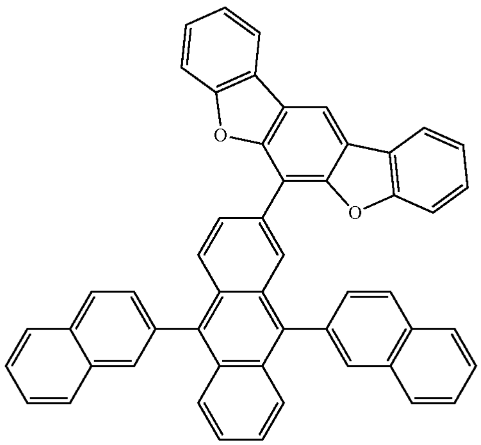
H105
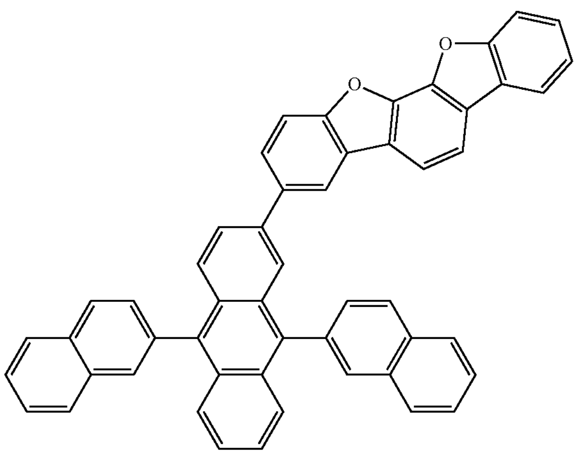
H106
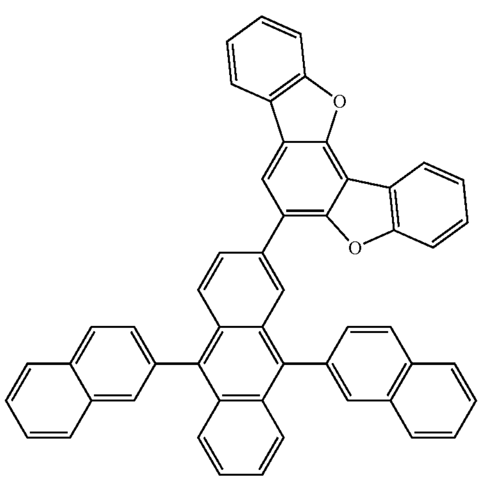
-continued
H107
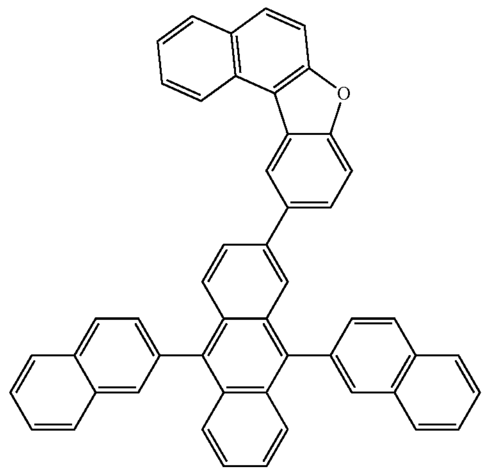
H108
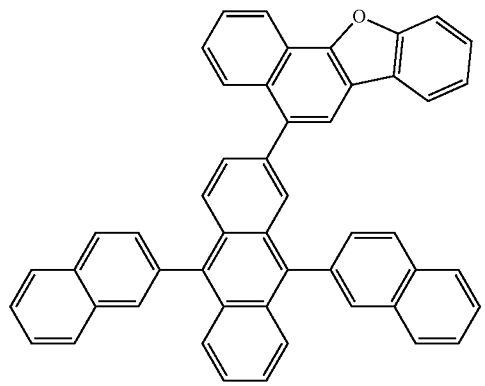
H109
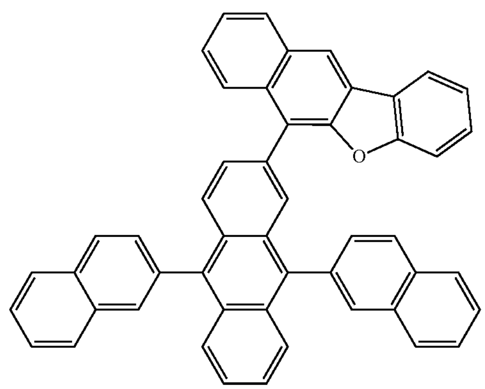
H110
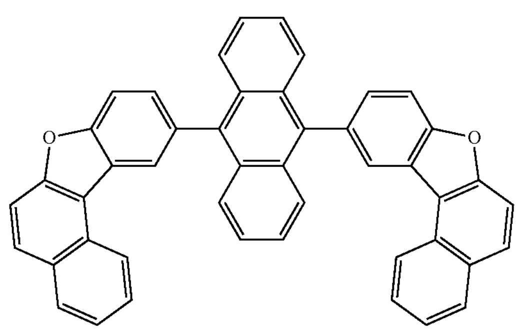

-continued
H111
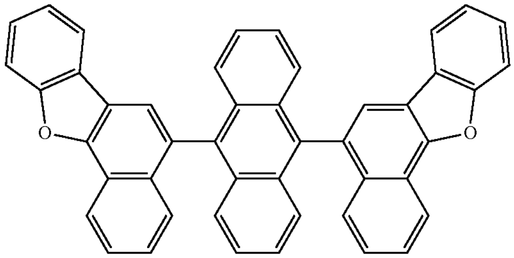
H112
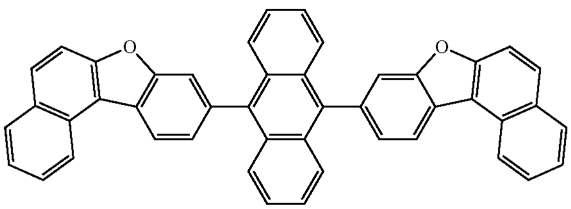
H113
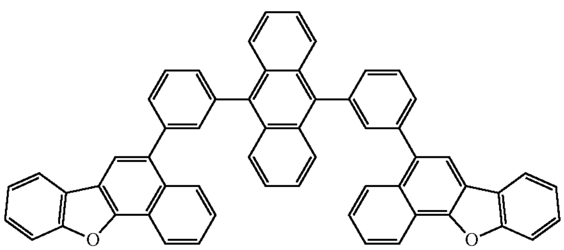
H114
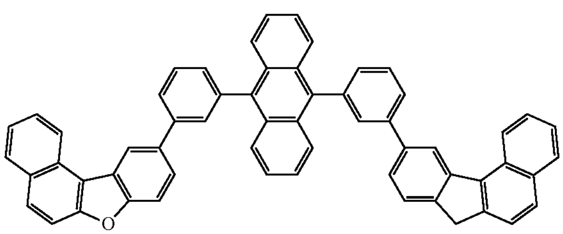
H115
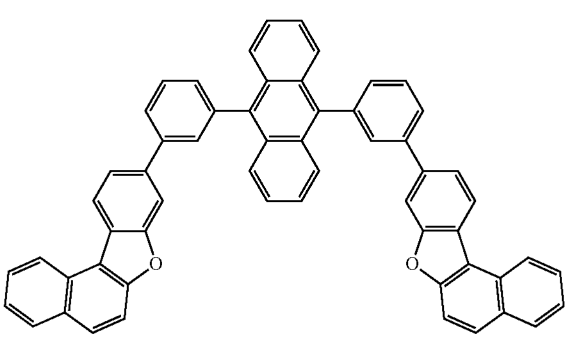
-continued
H116
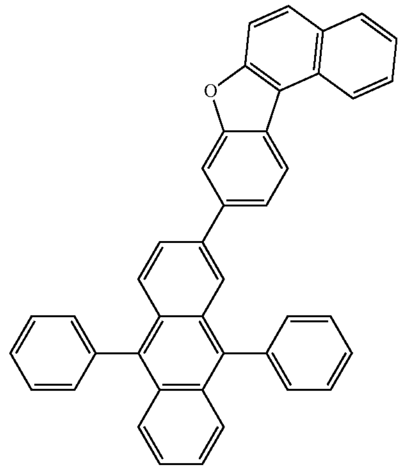
H117
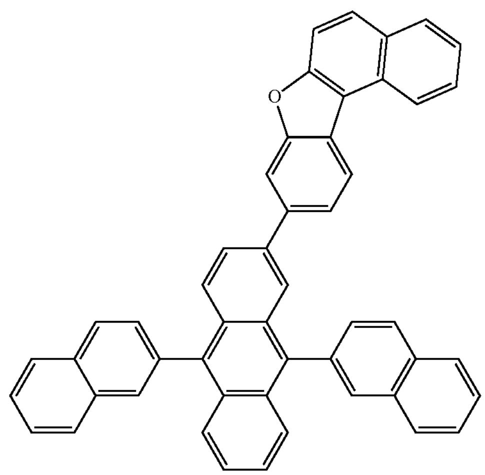
H118
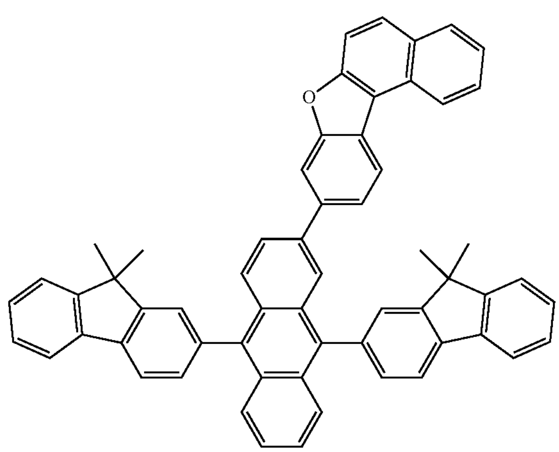

-continued

H119

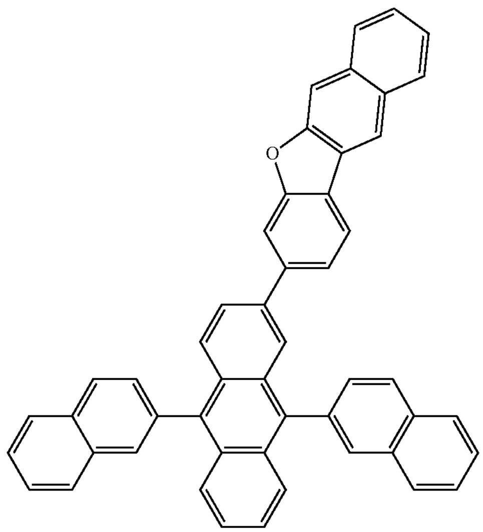

H120

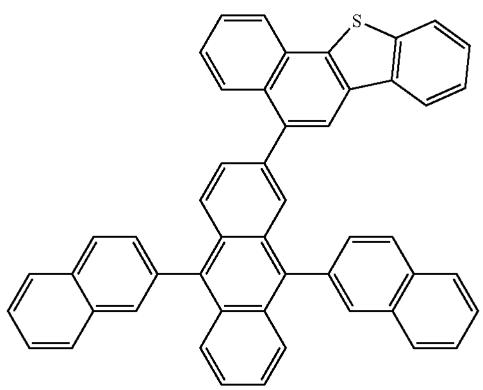

H121

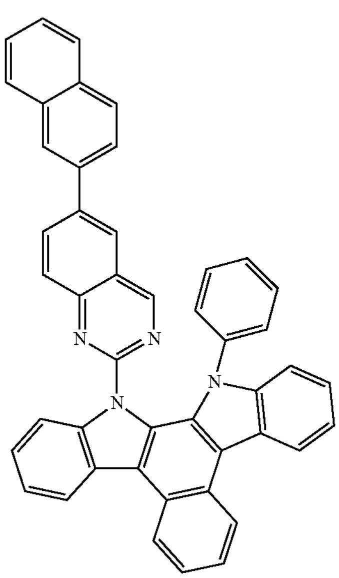

-continued

H122

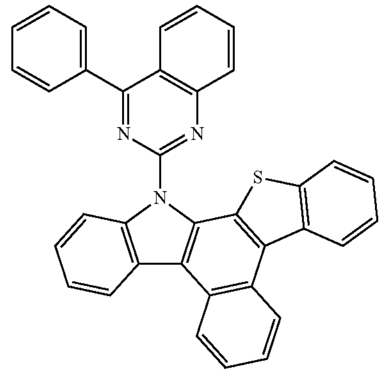

H123

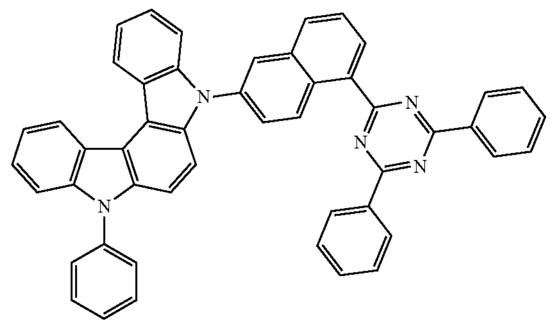

H124

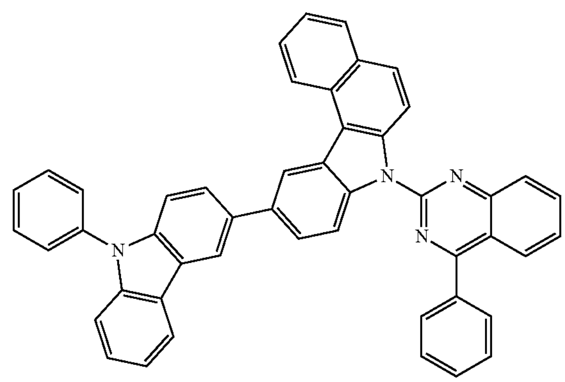

Delayed Fluorescence Material

The emission layer may include a delayed fluorescence material.

The delayed fluorescence material used herein may be selected from any suitable compound that is capable of emitting delayed fluorescent light based on a delayed fluorescence emission mechanism.

The delayed fluorescence material included in the emission layer may act as a host or a dopant, depending on the type (or composition) of other materials included in the emission layer.

In an embodiment, a difference between a triplet energy level (eV) of the delayed fluorescence material and a singlet energy level (eV) of the delayed fluorescence material may be equal to or greater than 0 eV and equal to or less than 0.5 eV. When the difference between the triplet energy level (eV) of the delayed fluorescence material and the singlet energy level (eV) of the delayed fluorescence material is within the range above, up-conversion from the triplet state to the singlet state of the delayed fluorescence materials may effectively occur, and thus, the luminescence efficiency of the light-emitting device 10 may be improved.

In an embodiment, the delayed fluorescence material may include i) a material that includes at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and/or ii) a material including a $C_8$-$C_{60}$ polycyclic group in which two or more cyclic groups share boron (B) and are condensed with each other (e.g., are combined together with each other).

The delayed fluorescence material may include at least one selected from Compounds DF1 to DF9:

DF1(DMAC-DPS)

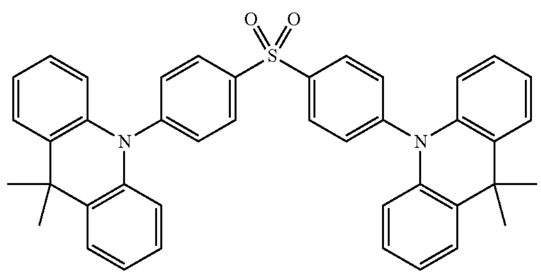

DF2(ACRFLCN)

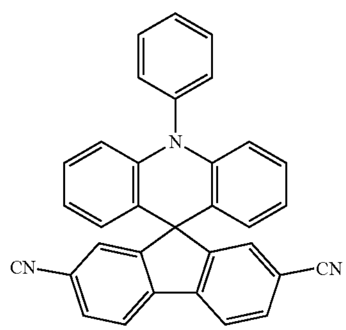

DF3(ACRSA)

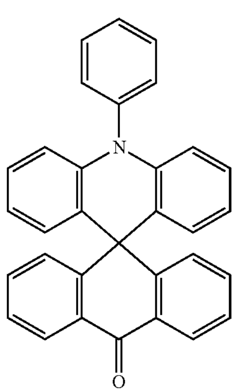

-continued

DF4(CC2TA)

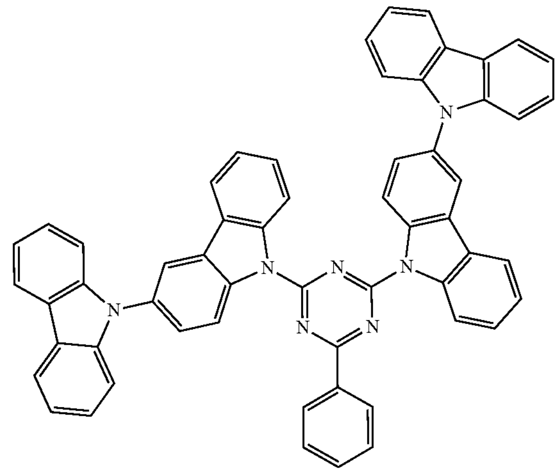

DF5(PIC-TRZ)

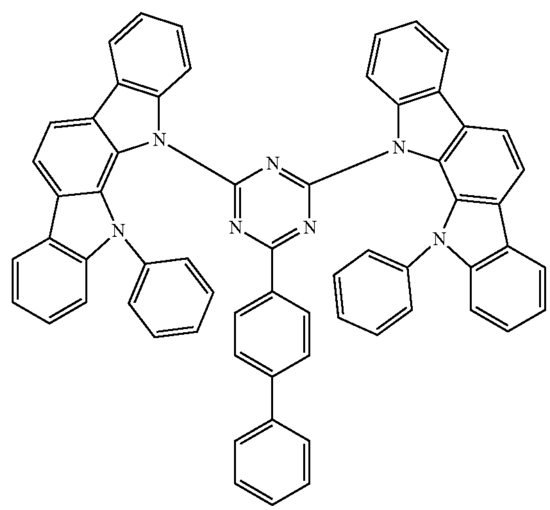

DF6(PIC-TRZ2)

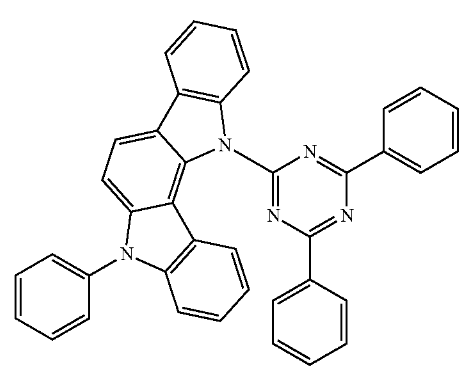

-continued

DF7(PXZ-TRZ)

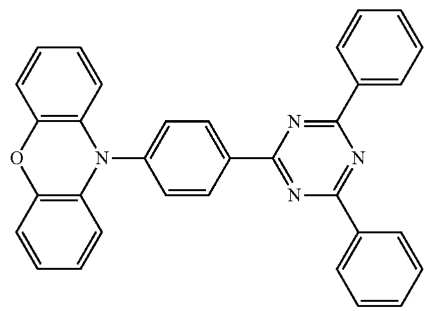

DF8(DABNA-1)

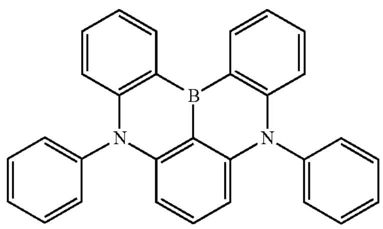

DF9(DABNA-2)

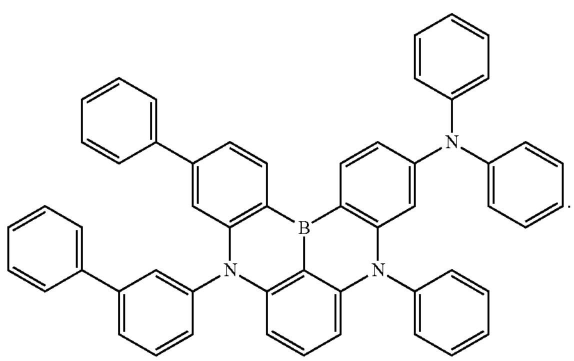

Quantum Dot

The emission layer may include a quantum dot.

The quantum dot as used herein refers to a crystal of a semiconductor compound, and may include any suitable material that is capable of emitting light of various suitable emission wavelengths depending on the size of the crystal.

A diameter of the quantum dot may be, for example, in a range of about 1 nm to about 10 nm.

The quantum dot may be synthesized by a wet chemical process, an organometallic chemical vapor deposition process, a molecular beam epitaxy process, and/or a process that is similar to these processes.

The wet chemical process refers to a method in which a solvent and a precursor material are mixed, and then, a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and/or a molecular beam epitaxy (MBE) process, the growth of quantum dot particles may be controlled.

The quantum dot may include: Group II-VI semiconductor compounds; Group III-V semiconductor compounds; Group III-VI semiconductor compounds; Group 1-III-VI semiconductor compounds; Group IV-VI semiconductor compounds; a Group IV element or compound; or any combination thereof.

Examples of the Group II-VI semiconductor compounds are: a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compounds are: a binary compound, such as GaN, GaP, GaAs, GaSb, AlN, AlP, AlAs, AlSb, InN, InP, InAs, and/or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and/or GaAlNP; a quaternary compound, such as GaAlNAs, GaAlNSb, GaAlPAs, GaAlPSb, GaInNP, GaInNAs, GalnNSb, GaInPAs, GalnPSb, InAlNP, InAlNAs, InAlNSb, InAlPAs, and/or InAlPSb; or any combination thereof. The Group III-V semiconductor compounds may further include a Group II element. Examples of the Group III-V semiconductor compounds further including the Group II element are InZnP, InGaZnP, and/or InAlZnP.

Examples of the Group III-VI semiconductor compounds are: a binary compound, such as GaS, GaSe, $Ga_2Se_3$, GaTe, InS, $In_2S_3$, InSe, $In_2Se_3$, and/or InTe; a ternary compound, such as $InGaS_3$ and/or $InGaSe_3$; or any combination thereof.

Examples of the Group 1-III-VI semiconductor compounds are: a ternary compound, such as AgInS, $AgInS_2$, CulnS, $CuInS_2$, $CuGaO_2$, $AgGaO_2$, and/or $AgAlO_2$.

Examples of the Group IV-VI semiconductor compounds are: a binary compound, such as SnS, SnSe, SnTe, PbS, PbSe, and/or PbTe; a ternary compound, such as SnSeS, SnSeTe, SnSTe, PbSeS, PbSeTe, PbSTe, SnPbS, SnPbSe, and/or SnPbTe; a quaternary compound, such as SnPbSSe, SnPbSeTe, and/or SnPbSTe; or any combination thereof.

In an embodiment, the Group IV element or compound may include: a single element compound, such as Si and/or Ge; a binary compound, such as SiC and/or SiGe; or any combination thereof.

Each element included in the multi-element compound such as the binary compound, ternary compound, and quaternary compound may be present in a particle at a uniform concentration or a non-uniform concentration.

In some embodiments, the quantum dot may have a single structure having a uniform (e.g., substantially uniform) concentration of each element included in the corresponding quantum dot or a dual structure of a core-shell. For example, the material included in the core may be different from the material included in the shell.

The shell of the quantum dot may function as a protective layer for maintaining semiconductor characteristics by preventing or reducing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases along a direction toward the center.

Examples of the shell of the quantum dot are an oxide of metal and/or non-metal, a semiconductor compound, or any combination thereof. Examples of the oxide of metal and/or non-metal are: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $CO_3O_4$, and/or NiO; a ternary compound, such as $MgAl_2O_4$, $CoFe_2O_4$, $NiFe_2O_4$, and/or $CoMn_2O_4$; or any combination thereof. Examples of the semiconductor compound are, as described herein, Group III-VI semiconductor compounds; Group II-VI semiconductor compounds; Group III-V semiconductor compounds; Group III-VI semiconductor compounds; Group I-III-VI semiconductor compounds; Group IV-VI semiconductor compounds; or any combination thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width of half maximum (FWHM) of an emission wavelength spectrum of the quantum dot may be equal to or less than about 45 nm, for example, equal to or less than about 40 nm, and for example, equal to or less than about 30 nm. When the FWHM of the emission wavelength spectrum of the quantum dot is within any of the foregoing ranges, color purity or color reproduction may be improved. In addition, light emitted through such quantum dot is irradiated in omnidirection (e.g., in substantially every direction). Accordingly, a wide viewing angle may be increased.

In addition, the quantum dot may be, for example, a spherical, pyramidal, multi-arm, and/or cubic nanoparticle, a nanotube, a nanowire, a nanofiber, and/or nanoplate particle.

By adjusting the size of the quantum dot, the energy band gap may also be adjusted, thereby obtaining light of various suitable wavelengths in the quantum dot emission layer. Therefore, by using quantum dots of different sizes, a light-emitting device that emits light of various suitable wavelengths may be implemented. In an embodiment, the size of the quantum dot may be selected to emit red, green and/or blue light. In addition, the size of the quantum dot may be configured by combining light of various suitable colors, so as to emit white light.

Electron Transport Region in Interlayer 130

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, in each structure, layers are sequentially stacked on the emission layer.

The electron transport region (for example, the buffer layer, the hole blocking layer, the electron control layer, or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$, or a $C_1$-$C_6$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(═O)($Q_{601}$), —S(═O)$_2$($Q_{601}$), or —P(═O)($Q_{601}$)($Q_{602}$), $Q_{601}$ to $Q_{603}$ may each be the same as described in connection with $Q_1$, xe21 may be 1, 2, 3, 4, or 5, and at least one selected from $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In one or more embodiments, when xe11 in Formula 601 is 2 or more, two or more $Ar_{601}$(s) may be linked to each other via a single bond.

In one or more embodiments, $Ar_{601}$ in Formula 601 may be a substituted or unsubstituted anthracene group.

In one or more embodiments, the electron transport region may include a compound represented by Formula 601-1:

Formula 601-1

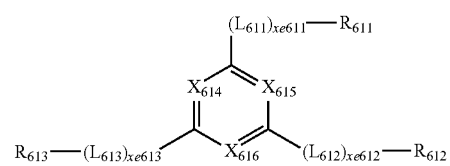

wherein, in Formula 601-1, $X_{614}$ may be N or C($R_{614}$), $X_{615}$ may be N or C($R_{615}$), $X_{616}$ may be N or C($R_{616}$), and at least one selected from $X_{614}$ to $X_{616}$ may be N, $L_{611}$ to $L_{613}$ may each be the same as described in connection with $L_{601}$, xe611 to xe613 may be understood by referring to the description presented in connection with xe1, $R_{611}$ to $R_{613}$ may each be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, xe1 and xe611 to xe613 in Formula 601 and 601-1 may each independently be 0, 1, or 2.

The electron transport region may include one selected from Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, diphenyl(4-(triphenylsilyl)phenyl)phosphine oxide (TSPO1), 1,3,5-tris(1-phenyl-1H-benzo[d]imidazol-2-yl)benzene (TPBI), or any combination thereof:

ET1
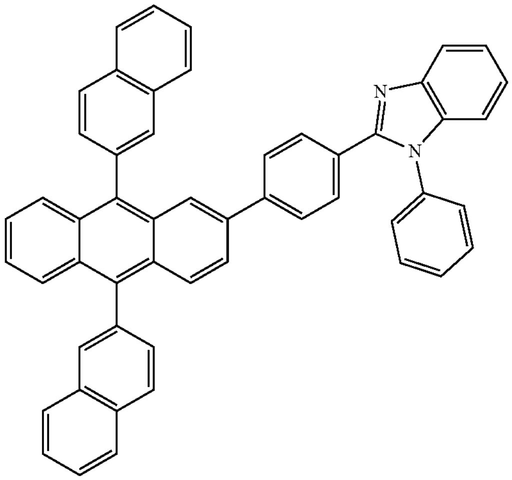
ET2
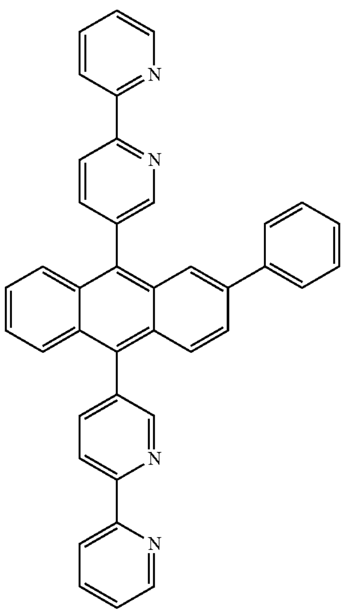
ET3
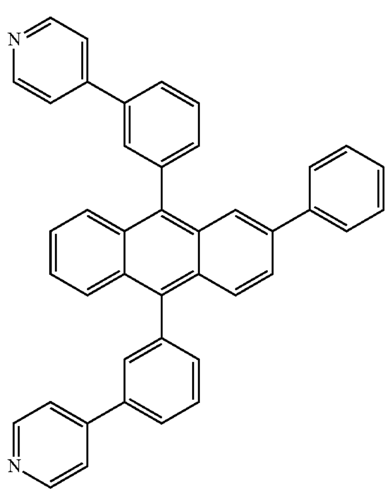
-continued
ET4
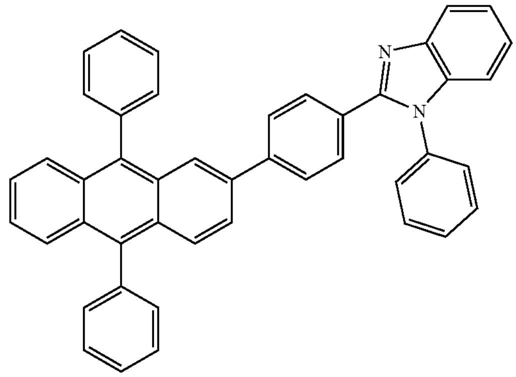
ET5
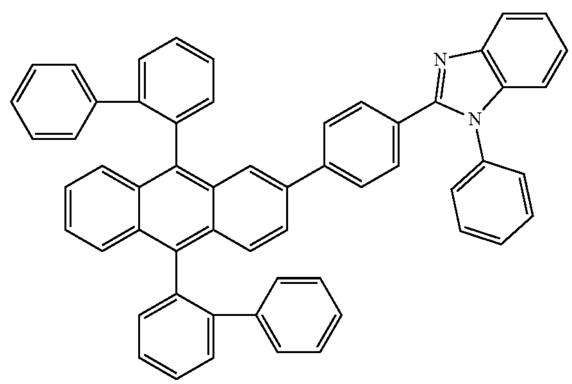
ET6
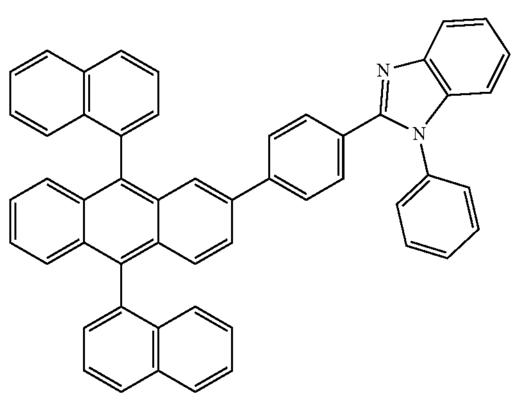

-continued
ET7
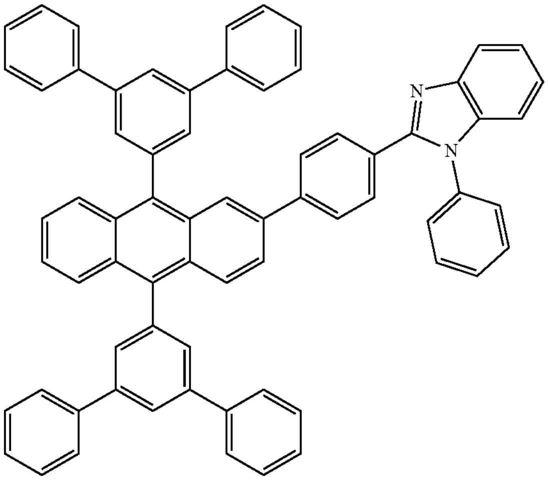
ET8
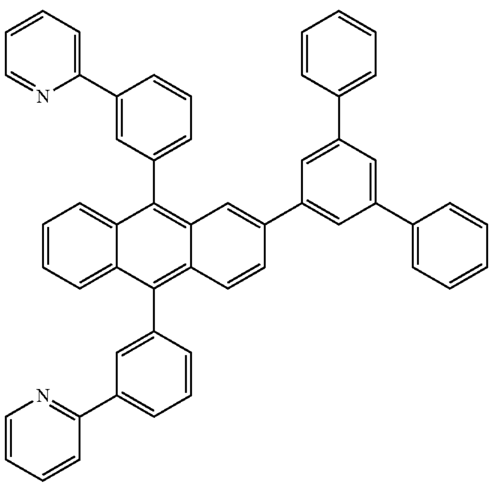
ET9
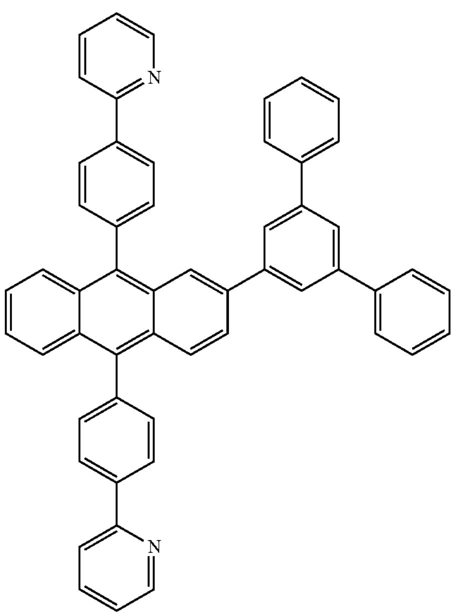
-continued
ET10
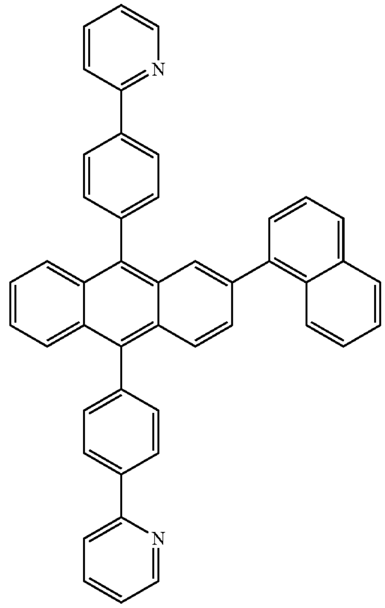
ET11
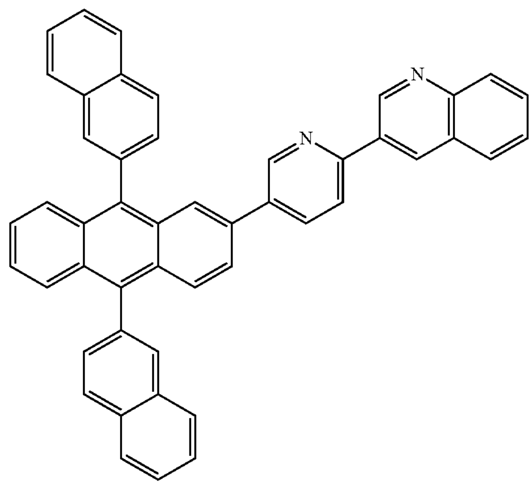
ET12
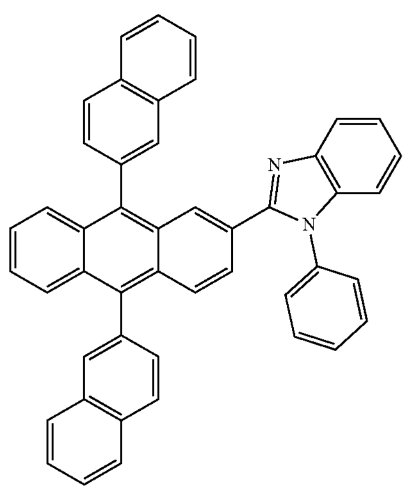

-continued
ET13
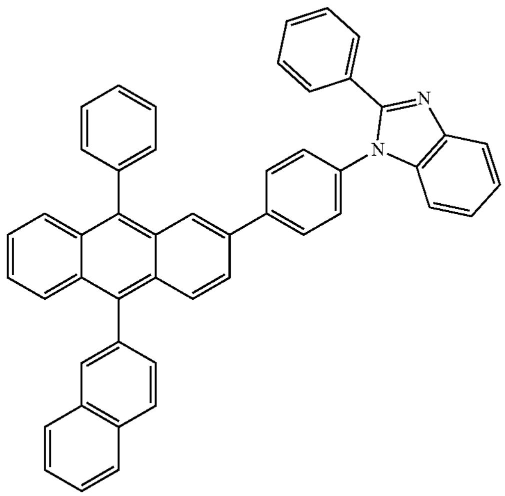
ET14
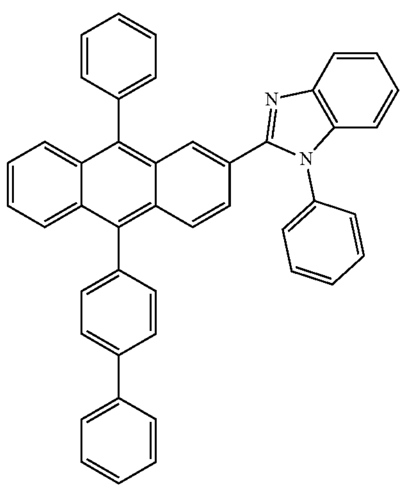
ET15
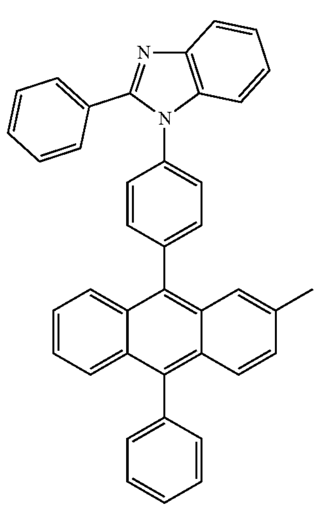
-continued
ET16
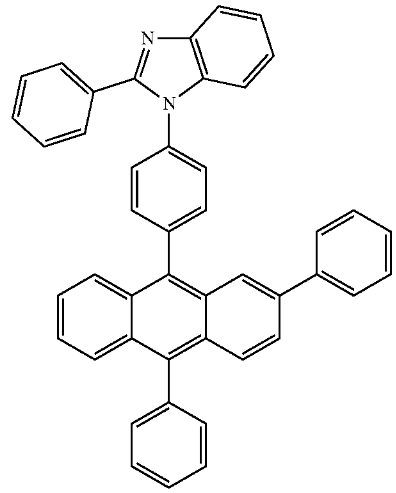
ET17
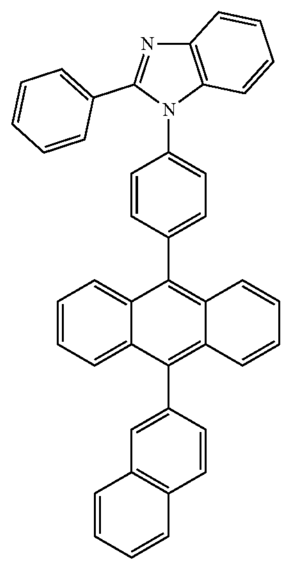
ET18
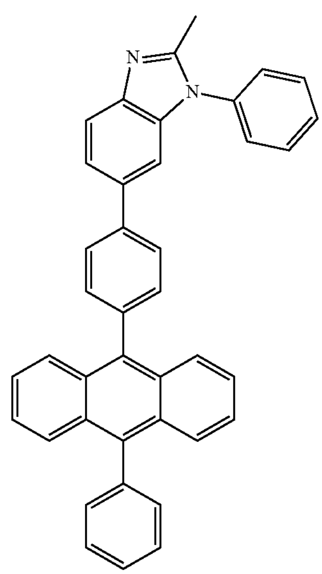

ET19
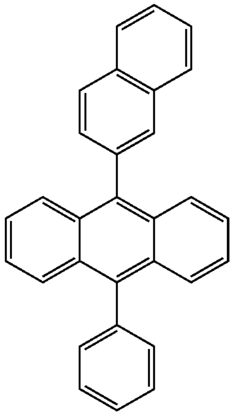
ET20
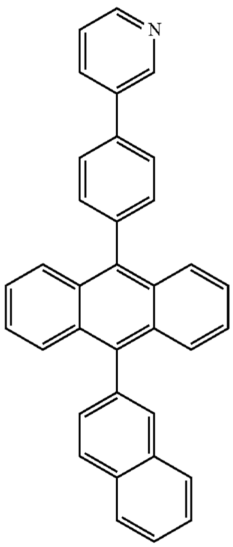
ET21
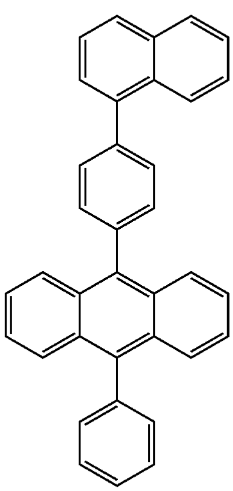
ET22
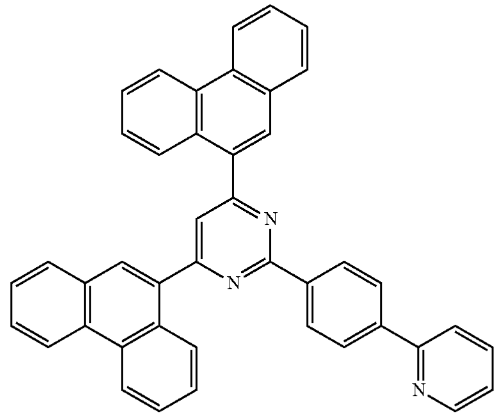
ET23
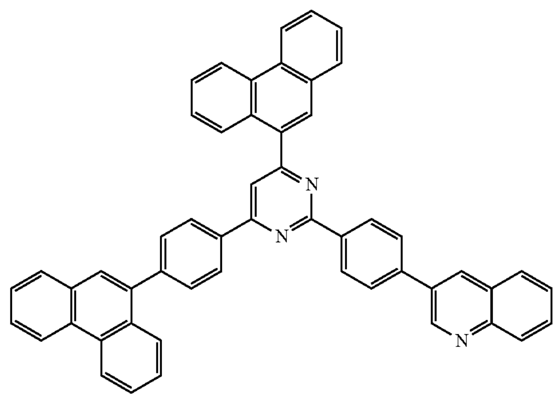
ET24
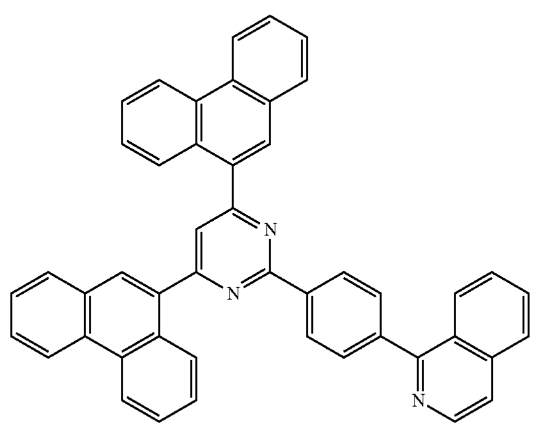

-continued
ET25
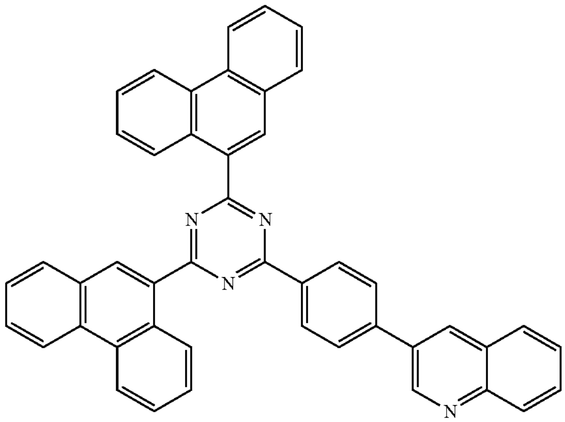
ET26
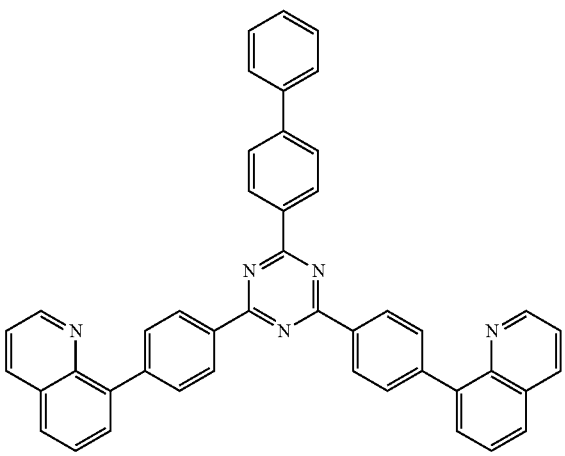
ET27
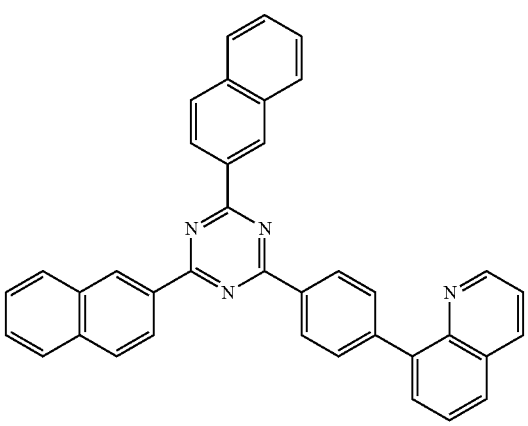
-continued
ET28
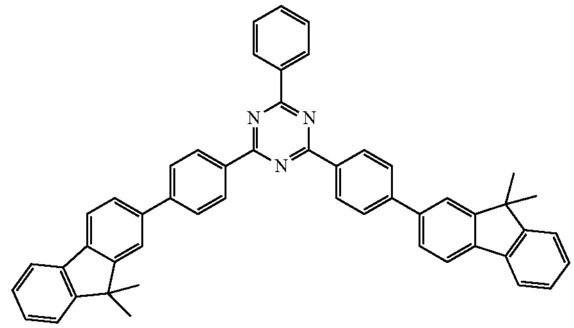
ET29
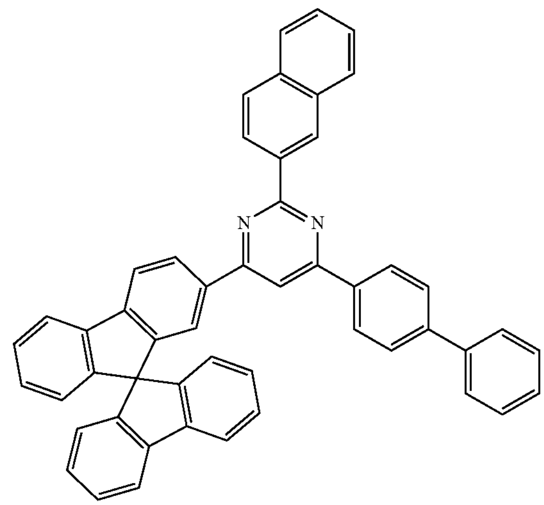
ET30
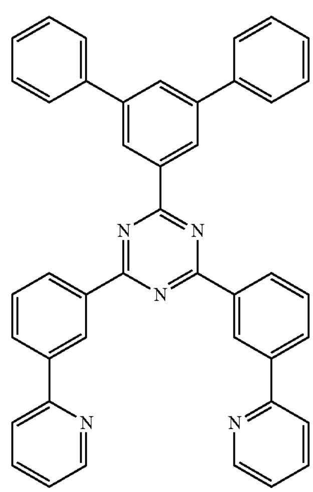

-continued
ET31
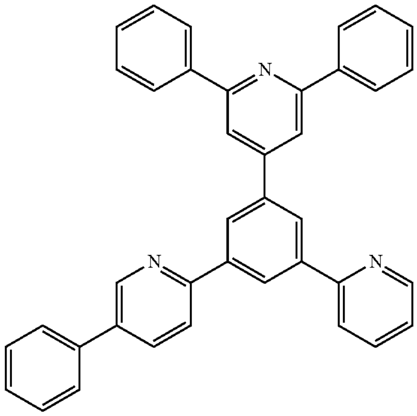
ET32
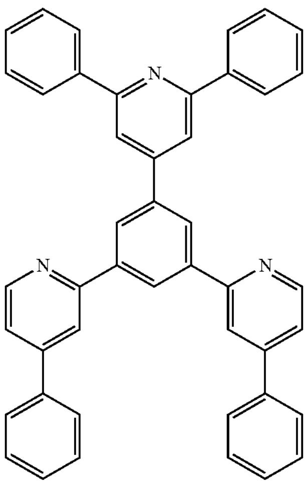
ET33
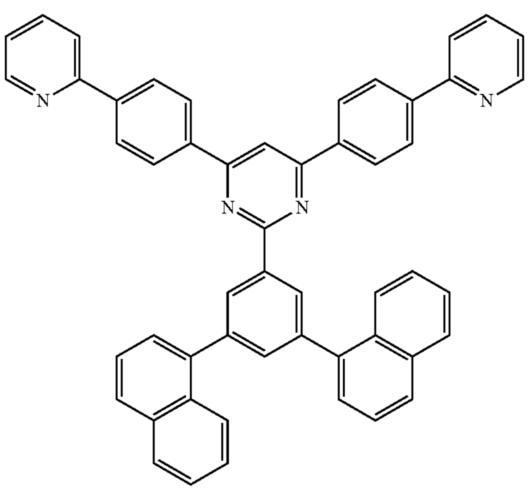
-continued
ET34
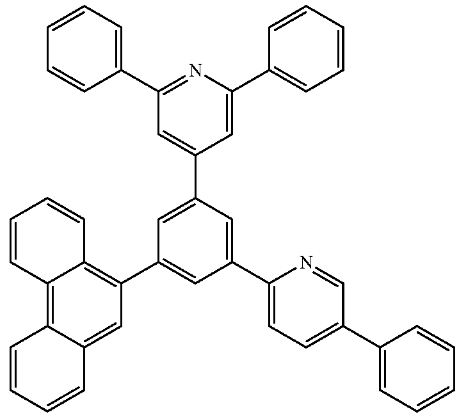
ET35
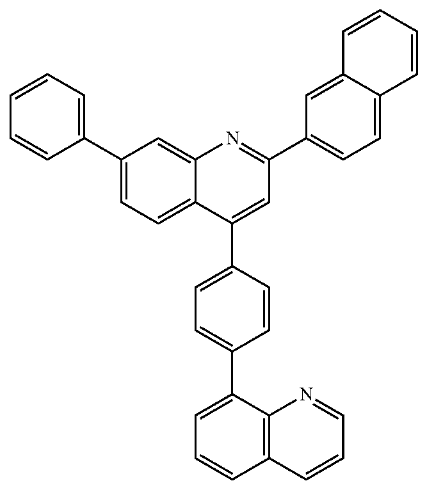
ET36
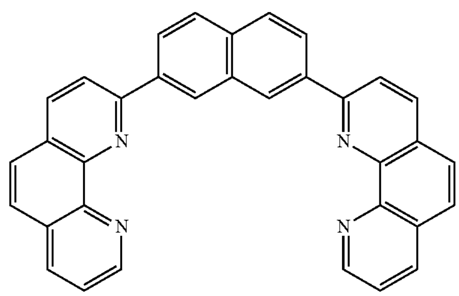
ET37
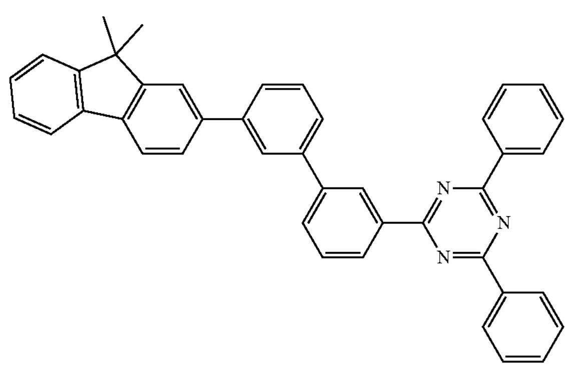

-continued
ET38
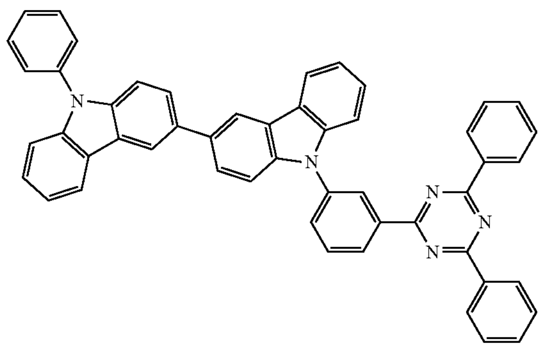
ET39
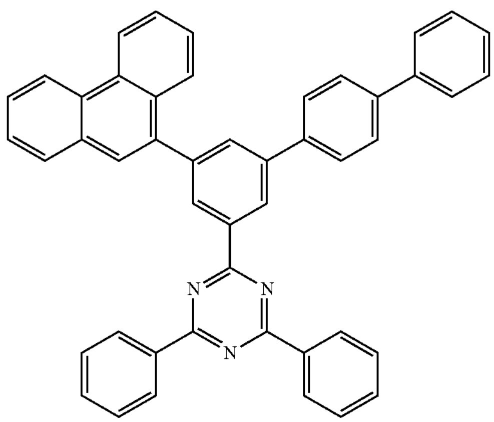
ET40
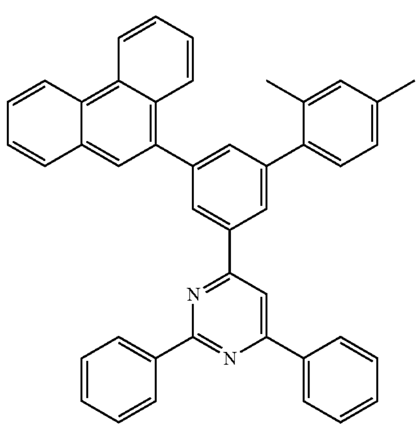
-continued
ET41
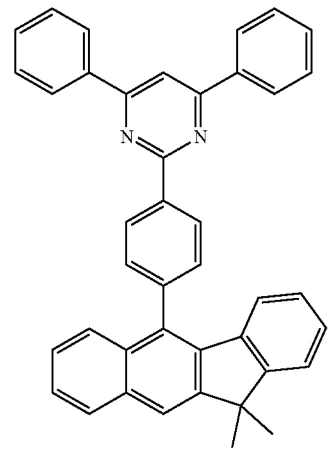
ET42
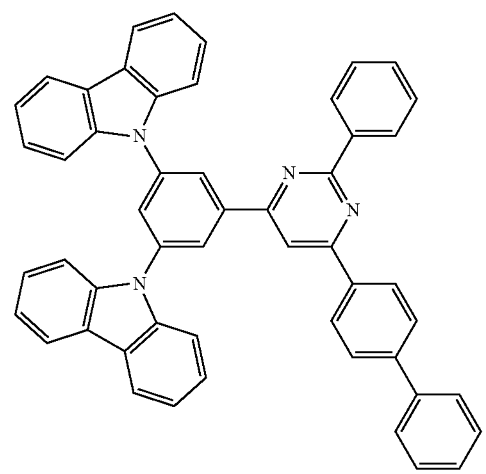
ET43
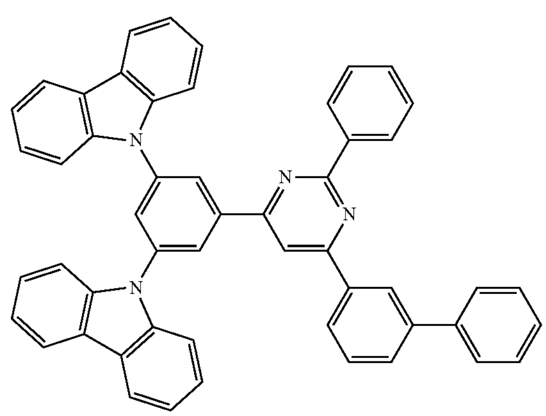

-continued

ET44

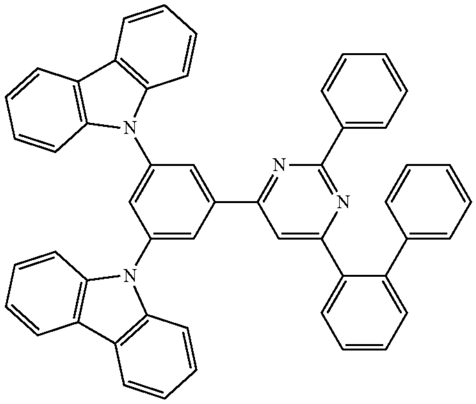

ET45

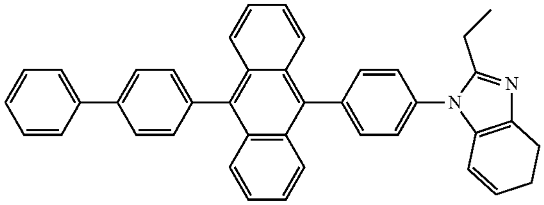

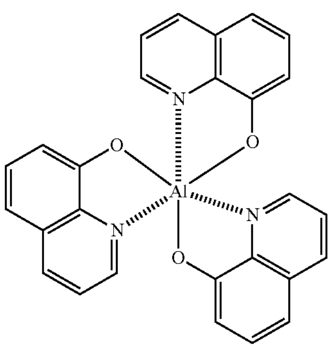

$Alq_3$

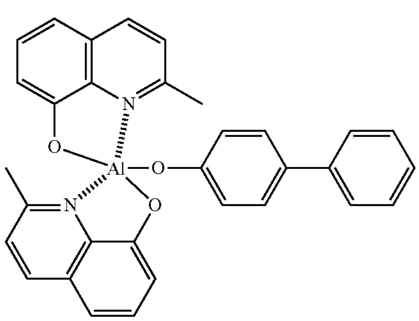

BAlq

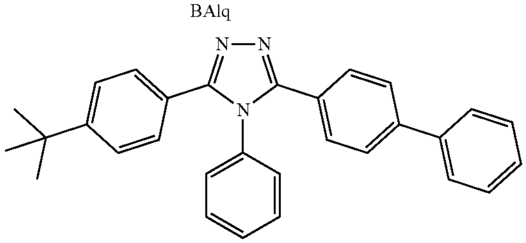

TAZ

-continued

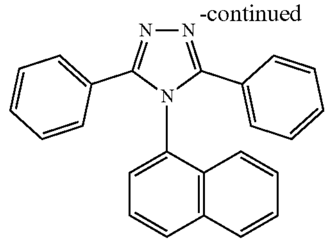

NTAZ

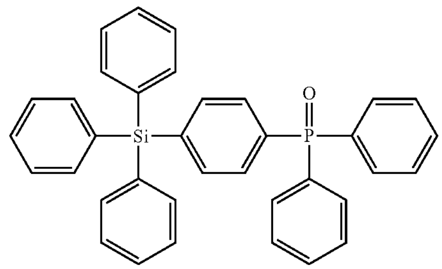

TSPO1

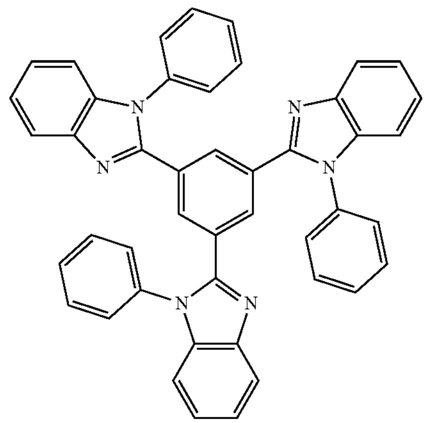

TPBI

A thickness of the electron transport region may be in a range of about 100 Å to about 5,000 Å, for example, about 100 Å to about 4,000 Å. When the electron transport region includes a buffer layer, a hole blocking layer, an electron control layer, an electron transport layer, or any combination thereof, a thickness of the buffer layer, the hole blocking layer, or the electron control layer may be in a range of about 20 Å to about 1,000 Å, for example, about 30 Å to about 300 Å, and a thickness of the electron transport layer may be in a range of about 100 Å to about 1,000 Å, for example, about 150 Å to about 500 Å. When the thickness of the buffer layer, the hole blocking layer, the electron control layer, and/or the electron transport layer are within any of the foregoing ranges, suitable or satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy phenyloxadiazole, a hydroxy phenylthiadiazole, a hydroxy phenylpyridine, a hydroxy phenylbenzimidazole, a hydroxy phenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

ET-D1

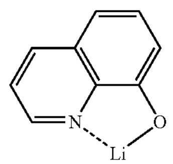

ET-D2

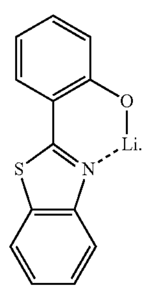

The electron transport region may include an electron injection layer that facilitates the injection of electrons from the second electrode 150. The electron injection layer may directly contact (e.g., physically contact) the second electrode 150.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combinations thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides and/or halides (for example, fluorides, chlorides, bromides, and/or iodides) of the alkali metal, the alkaline earth metal, and/or the rare earth metal, telluride, or any combination thereof.

The alkali metal-containing compound may be alkali metal oxides, such as $Li_2O$, $Cs_2O$, and/or $K_2O$, alkali metal halides, such as LiF, NaF, CsF, KF, LiI, NaI, CsI, and/or KI, or any combination thereof. The alkaline earth metal-containing compound may include an alkaline earth metal oxide, such as BaO, SrO, CaO, $Ba_xSr_{1-x}O$ (where x is a real number that satisfies the condition of $0<x<1$), and/or $Ba_xCa_{1-x}O$ (where x is a real number that satisfies the condition of $0<x<1$). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of the metal ions of the alkali metal, the alkaline earth metal, and the rare earth metal and ii), as a ligand linked to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer includes (e.g., consists of) an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may include (e.g., consist of) i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. For example, the electron injection layer may be a KI:Yb co-deposited layer and/or a RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within any of the ranges described above, suitable or satisfactory electron injection characteristics may be obtained without a substantial increase in driving voltage.

Second Electrode 150

The second electrode 150 may be on the interlayer 130 having such a structure. The second electrode 150 may be a cathode, which is an electron injection electrode, and as a material for forming the second electrode 150, a metal, an alloy, an electrically conductive compound, or any combination thereof, each having a low work function, may be used.

The second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be outside the first electrode 110, and/or a second capping layer may be outside the second electrode 150. In more detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer of the interlayer 130 of the light-emitting device 10 may be extracted toward the outside through the first electrode 110 and the first capping layer, each of which may be a semi-transmissive electrode or a transmissive electrode, or light generated in the emission layer of the interlayer 130 of the light-emitting device 10 may be extracted toward the outside through the second electrode 150 and the second capping layer, each of which may be a semi-transmissive electrode or a transmissive electrode.

The first capping layer and the second capping layer may increase external luminescence efficiency according to the principle of constructive interference. Accordingly, light extraction efficiency of the light-emitting device 10 may be increased, so that luminescence efficiency of the light-emitting device 10 may be also improved.

The first capping layer and the second capping layer may each include a material having a refractive index of equal to or greater than 1.6 (at 589 nm).

The first capping layer and the second capping layer may each independently be an organic capping layer including an organic material, an inorganic capping layer including an inorganic material, and/or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one selected from the first capping layer and the second capping layer may each independently include an amine group-containing compound.

In one or more embodiments, at least one selected from the first capping layer and second capping layer may each independently include the compound represented by Formula 201, the compound represented by Formula 202, or any combination thereof.

In one or more embodiments, at least one selected from the first capping layer and the second capping layer may each independently include a compound selected from Compounds HT28 to HT33, Compounds CP1 to CP6, β-NPB, or any combination thereof:

CP1

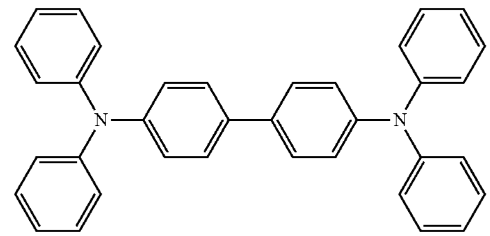

CP2

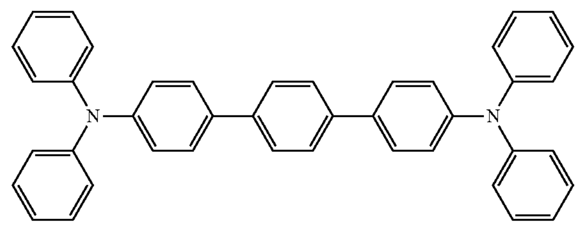

CP3

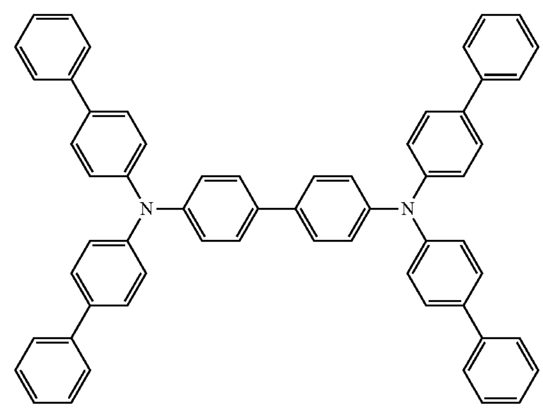

CP4

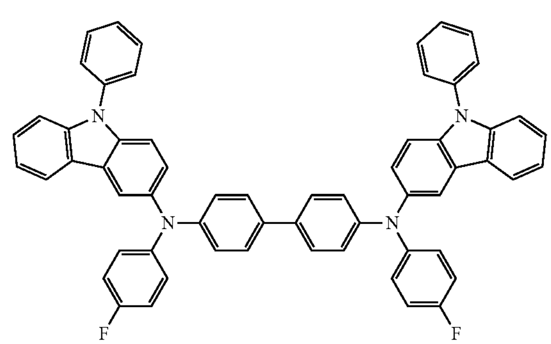

-continued

CP5

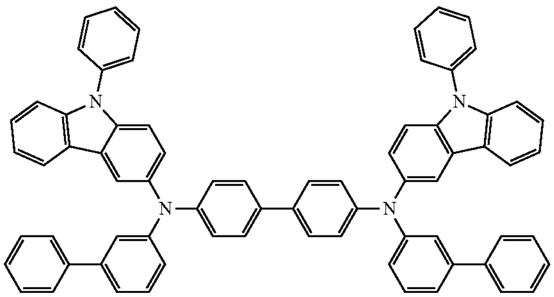

CP6

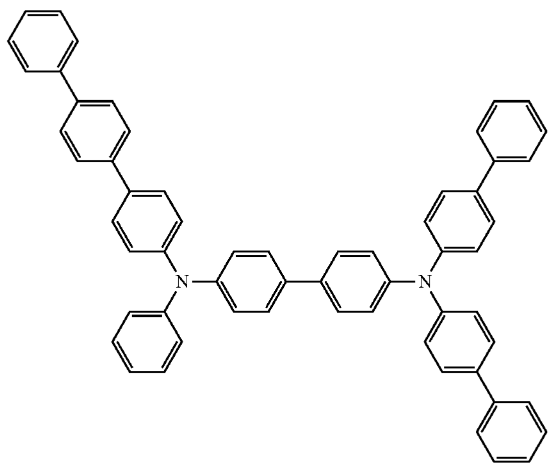

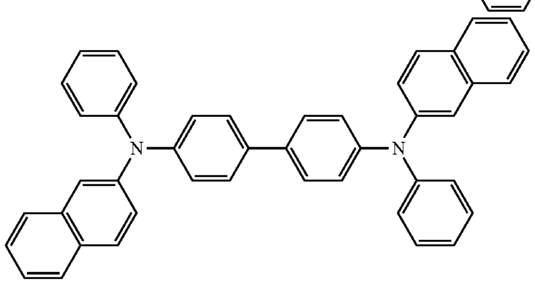

β-NPB

Electronic Apparatus

The light-emitting device may be included in various suitable electronic apparatuses. In an embodiment, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be in at least one traveling direction of light emitted from the light-emitting device. In an embodiment, light emitted from the light-emitting device may be blue light or white light. The light-emitting device may be the same as described above. In an embodiment, the color conversion layer may include a quantum dot. The quantum dot may be, for example, the quantum dot as described herein.

The electronic apparatus may include a first substrate. The first substrate includes a plurality of subpixel areas, the color filter may include a plurality of color filter areas corresponding to the plurality of subpixel areas, respectively, and the color conversion layer may include a plurality of color conversion areas corresponding to the subpixel areas, respectively.

A pixel-defining film may be between the plurality of subpixel areas to define each of the subpixel areas.

The color filter may further include a plurality of color filter areas and a light-blocking pattern between adjacent color filter areas of the plurality of color filter areas, and the color conversion layer may further include a plurality of color conversion areas and a light-blocking pattern between adjacent color conversion areas of the plurality of color conversion areas.

The plurality of color filter areas (or the plurality of color conversion areas) may include a first area emitting first color light, a second area emitting second color light, and/or a third area emitting third color light, and the first color light, the second color light, and/or the third color light may have different maximum luminescence wavelengths from one another. For example, the first color light may be red light, the second color light may be green light, and the third color light may be blue light. For example, the plurality of color filter areas (or the plurality of color conversion areas) may include a quantum dot. In more detail, the first area may include a red quantum dot, the second area may include a green quantum dot, and the third area may not include a quantum dot. The quantum dot may be the same as described in the present specification. The first area, the second area, and/or the third area may further include a scattering body.

For example, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. In more detail, the first light may be blue light, the first first-color light may be red light, the second first-color light may be green light, and the third first-color light may be blue light.

The electronic apparatus may further include a thin-film transistor in addition to the light-emitting device 10 as described above. The thin-film transistor may include a source electrode, a drain electrode, and an active layer, wherein any one selected from the source electrode and the drain electrode may be electrically coupled to any one selected from the first electrode and the second electrode of the light-emitting device.

The thin-film transistor may further include a gate electrode, a gate insulation layer, and/or the like.

The active layer may include crystalline silicon, amorphous silicon, organic semiconductor, oxide semiconductor, and/or the like.

The electronic apparatus may further include a sealing portion for sealing the light-emitting device. The sealing portion may be between the color filter and/or the color conversion layer and the light-emitting device. The sealing portion allows light from the light-emitting device 10 to be extracted to the outside, while concurrently (e.g., simultaneously) preventing or reducing penetration of external air and moisture into the light-emitting device 10. The sealing portion may be a sealing substrate including a transparent glass substrate and/or a plastic substrate. The sealing portion may be a thin-film encapsulation layer including at least one layer of an organic layer and a inorganic layer. When the sealing portion is a thin-film encapsulation layer, the electronic apparatus may be flexible.

In addition to the color filter and/or color conversion layer, various suitable functional layers may be further on the sealing portion according to the use or design of the electronic apparatus. The functional layers may include a touchscreen layer, a polarization layer, and/or the like. The touchscreen layer may be a pressure-sensitive touch screen layer, a capacitive touchscreen layer, and/or an infrared touchscreen layer. The authentication apparatus may be, for example, a biometric authentication apparatus for authenticating an individual by using biometric information of a biometric body (for example, a finger tip, a pupil, and/or the like).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

DESCRIPTION OF FIGS. 2 AND 3

Figure 2:
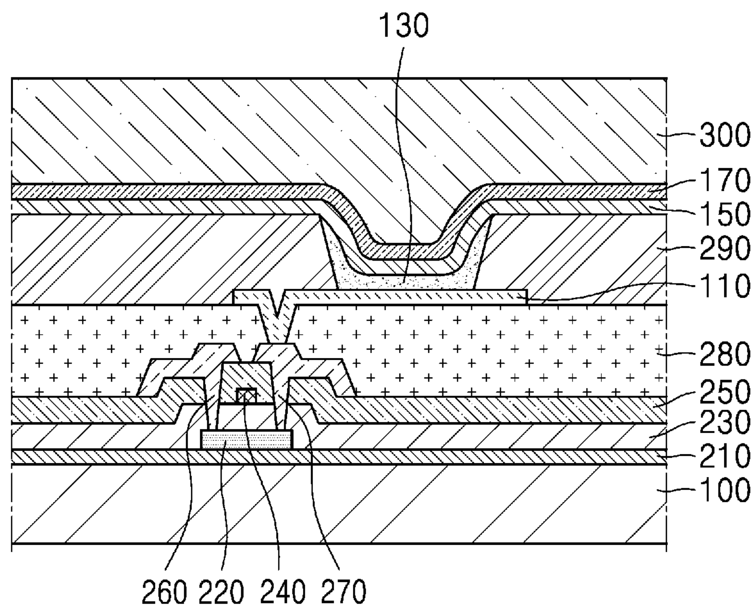
FIG. 2 is a schematic cross-sectional view of a light-emitting apparatus according to another embodiment.

FIG. 2 is a schematic cross-sectional view showing a light-emitting apparatus according to an embodiment of the present disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be on the substrate 100. The buffer layer 210 prevents or reduces the penetration of impurities through the substrate 100 and may provide a flat surface on the substrate 100.

A TFT may be on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, and/or an oxide semiconductor, and may include a source region, a drain region and a channel region.

A gate insulating film 230 for insulating the active layer 220 from the gate electrode 240 may be on the active layer 220, and the gate electrode 240 may be on the gate insulating film 230.

An interlayer insulating film 250 may be on the gate electrode 240. The interlayer insulating film 250 is between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be on the interlayer insulating film 250. The interlayer insulating film 250 and the gate insulating film 230 may be formed to expose the source region and the drain region of the active layer 220, and the source electrode 260 and the drain electrode 270 may be in contact (e.g., physical contact) with the exposed portions of the source region and the drain region of the active layer 220.

The TFT may be electrically coupled to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device includes the first electrode 110, the interlayer 130, and the second electrode 150.

The first electrode 110 may be on the passivation layer 280. The passivation layer 280 does not completely cover the drain electrode 270 and exposes a portion of the drain electrode 270, and the first electrode 110 may be electrically coupled to the exposed portion of the drain electrode 270.

A pixel defining layer 290 including an insulating material may be on the first electrode 110. The pixel defining layer 290 may expose a certain region of the first electrode 110, and the interlayer 130 may be formed in the exposed region of the first electrode 110. The pixel defining layer 290 may be a polyimide or polyacryl-based organic film. In some embodiments, at least one layer of the interlayer 130 may extend to the upper portion of the pixel defining layer 290 and may be in the form of a common layer.

A second electrode 150 may be on the interlayer 130, and a capping layer 170 may be additionally formed on the second electrode 150. The capping layer 170 may be formed to cover the second electrode 150.

An encapsulation portion 300 may be on the capping layer 170. The encapsulation portion 300 may be on a light-emitting device and protects the light-emitting device from moisture or oxygen. The encapsulation portion 300 may include: an inorganic film including silicon nitride ($SiN_x$), silicon oxide ($SiO_x$), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acryl-based resin (for example, polymethyl methacrylate or polyacrylic acid), an epoxy-based resin (for example, aliphatic glycidyl ether (AGE)), or a combination thereof; or a combination of an inorganic film and an organic film.

Figure 3:
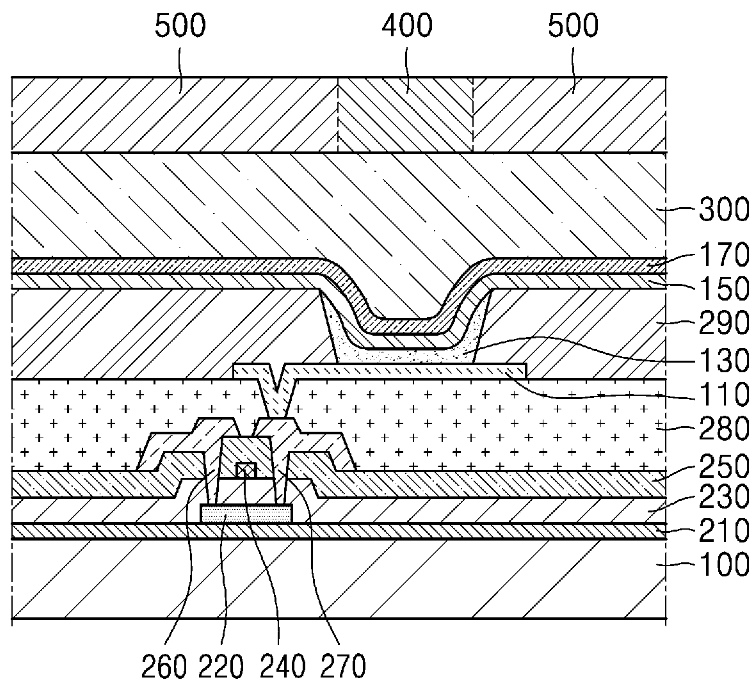
FIG. 3 is a schematic cross-sectional view of a light-emitting apparatus according to another embodiment.

FIG. 3 is a schematic cross-sectional view showing a light-emitting apparatus according to an embodiment of the present disclosure.

The light-emitting apparatus of FIG. 3 is the same as the light-emitting apparatus of FIG. 2, except that a light-blocking pattern 500 and a functional region 400 are additionally on the encapsulation portion 300. The functional region 400 may be i) a color filter area, ii) a color conversion areas, or iii) a combination of the color filter area and the color conversion area. In an embodiment, the light-emitting device included in the light-emitting apparatus of FIG. 3 may be a tandem light-emitting device.

Preparation Method

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

Definitions of at Least Some of the Terms

The term "$C_3$-$C_{60}$ carbocyclic group," as used herein, refers to a cyclic group that includes (e.g., consists of) carbon only and has three to sixty carbon atoms, and the term "$C_1$-$C_{60}$ heterocyclic group," as used herein, refers to a cyclic group that has one to sixty carbon atoms and further includes, in addition to carbon, a heteroatom. The $C_3$-$C_{60}$ carbocyclic group and a $C_1$-$C_{60}$ heterocyclic group may each be a monocyclic group that includes (e.g., consists of) one ring or a polycyclic group in which two or more rings are condensed with each other (e.g., combined together). In an embodiment, the number of ring-forming atoms of the $C_1$-$C_{60}$ heterocyclic group may be from 3 to 61.

The term "cyclic group," as used herein, includes the $C_3$-$C_{60}$ carbocyclic group and the $C_1$-$C_{60}$ heterocyclic group.

The term "π electron-rich $C_3$-$C_{60}$ cyclic group," as used herein, refers to a cyclic group that has one to sixty carbon atoms and does not include *—N=*' as a ring-forming moiety, and the term "π electron-deficient nitrogen-containing $C_1$-$C_{60}$ cyclic group," as used herein, refers to a heterocyclic group that has one to sixty carbon atoms and includes *—N=*' as a ring-forming moiety.

For example, the $C_3$-$C_{60}$ carbocyclic group may be i) a group T1 or ii) a condensed cyclic group in which two or more groups T1 are condensed with (e.g., combined together with) each other (for example, a cyclopentadiene group, an adamantane group, a norbornane group, a benzene group, a pentalene group, a naphthalene group, an azulene group, an indacene group, acenaphthene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other (e.g., combined together with each other), or iii) a condensed cyclic group in which at least one groups T2 and at least one group T1 are condensed with (e.g., combined together with) each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the π electron-rich $C_3$-$C_{60}$ cyclic group may be i) a group T1, ii) a condensed cyclic group in which two or more groups T1 are condensed with each other (e.g., combined together with each other), iii) a group T3, iv) a condensed cyclic group in which two or more groups T3 are condensed with each other (e.g., combined together with each other), or v) a condensed cyclic group in which at least one group T3 and at least one group T1 are condensed with (e.g., combined together with) each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group), the π electron-deficient nitrogen-containing $C_1$-$C_{60}$ cyclic group may be i) a group T4, ii) a condensed cyclic group in which two or more groups T4 are condensed with each other (e.g., combined together with each other), iii) a condensed cyclic group in which at least one group T4 and at least one group T1 are condensed with each other (e.g., combined together with each other), iv) a condensed cyclic group in which at least one group T4 and at least one group T3 are condensed with each other (e.g., combined together with each other), or v) a condensed cyclic group in which at least one group T4, at least one group T1, and at least one group T3 are condensed with (e.g., combined together with) each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo [2.2.1]heptane group), a norbornene group, a bicyclo[1.1.1] pentane group, a bicyclo[2.1.1]hexane group, a bicyclo [2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group," as used herein, refer to a monovalent or polyvalent group (for example, a divalent group, a trivalent group, a tetravalent group, or the like) that is condensed with (e.g., combined together with) a cyclic group, according to the structure of a formula described with corresponding terms. In an embodiment, "a benzene group" may be a benzo group, a phenyl group, a phenylene group, and/or the like, which may be easily understood by one of ordinary skill in the art according to the structure of a formula including the "benzene group."

In an embodiment, examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group," as used herein, refers to a linear or branched aliphatic hydrocarbon monovalent group having 1 to 60 carbon atoms, preferably $C_1$-$C_{20}$ alkyl group, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group," as used herein, refers to a divalent group having substantially the same structure as the $C_1$-$C_{60}$ alkyl group, preferably $C_1$-$C_{20}$ alkylene group or $C_1$-$C_5$ alkylene group.

The term "$C_2$-$C_{60}$ alkenyl group," as used herein, refers to a monovalent hydrocarbon group having at least one carbon-carbon double bond at a main chain (e.g., in the middle) or at a terminal end (e.g., the terminus) of a $C_2$-$C_{60}$ alkyl group, preferably $C_2$-$C_{20}$ alkenyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group, preferably $C_2$-$C_{20}$ alkenylene group or $C_2$-$C_5$ alkenylene group.

The term "$C_2$-$C_{60}$ alkynyl group," as used herein, refers to a monovalent hydrocarbon group having at least one carbon-carbon triple bond at a main chain (e.g., in the middle) or at a terminal end (e.g., the terminus) of a $C_2$-$C_{60}$ alkyl group, preferably $C_2$-$C_{20}$ alkynyl group, and examples thereof include an ethynyl group, and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), preferably $C_1$-$C_{20}$ alkoxy group and examples thereof include a methoxy group, an ethoxy group, and an isopropyloxy group.

The term "$C_3$-$C_{10}$ cycloalkyl group," as used herein, refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cycloctyl group, an adamantanyl group, a norbornanyl group (or a bicyclo [2.2.1]heptyl group), a bicyclo[1.1.1]pentyl group, a bicyclo [2.1.1]hexyl group, and a bicyclo[2.2.2]octyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothienyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one carbon-carbon double bond in the ring thereof and no aromaticity (e.g., is not aromatic), and non-limiting examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothienyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Examples of the $C_6$-$C_{60}$ aryl group are a fluorenyl group, a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be fused to each other (e.g., combined together).

The term "$C_1$-$C_{60}$ heteroaryl group," as used herein, refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group," as used herein, refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a carbozylyl group, a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other (e.g., combined together with each other).

The term "monovalent non-aromatic condensed polycyclic group," as used herein, refers to a monovalent group (for example, having 8 to 60 carbon atoms) having two or more rings condensed with each other (e.g., combined together with each other), only carbon atoms as ring-forming atoms, and no aromaticity in its entire molecular structure (e.g., the entire molecular structure is not aromatic). Examples of the monovalent non-aromatic condensed polycyclic group are an indenyl group, a spiro-bifluorenyl group, a benzofluorenyl group, an indenophenanthrenyl group, and an indenoanthracenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together with each other), at least one heteroatom other than carbon atoms, as a ring-forming atom, and no aromaticity in its entire molecular structure (e.g., the entire molecular structure is not aromatic). Examples of the monovalent non-aromatic condensed heteropolycyclic group are a pyrrolyl group, a thienyl group, a furanyl group, an indolyl group, a benzoindolyl group, a naphthoindolyl group, an isoindolyl group, a benzoisoindolyl group, a naphthoisoindolyl group, a benzosilolyl group, a benzothienyl group, a benzofuranyl group, a dibenzosilolyl group, a dibenzothienyl group, a dibenzofuranyl group, an azacarbazolyl group, an azafluorenyl group, an azadibenzosilolyl group, an azadibenzothienyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothienyl group, a benzonaphthosilolyl group, a benzofurodibenzofuranyl group, a benzofurodibenzothienyl group, and a benzothienodibenzothiophenyl group. The term "divalent non-aromatic condensed heteropolycyclic group," as used herein, refers to a divalent group having substantially the same structure as the monovalent non-aromatic condensed heteropolycyclic group.

The term "$C_6$-$C_{60}$ aryloxy group," as used herein, refers to —$OA_{102}$ (wherein $A_{102}$ is the $C_6$-$C_{60}$ aryl group), and the term "$C_6$-$C_{60}$ arylthio group," as used herein, refers to —$SA_{103}$ (wherein $A_{103}$ is the $C_6$-$C_{60}$ aryl group).

The term "$R_{10a}$," as used herein, refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_6$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_6$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom," as used herein, refers to any atom other than a carbon atom. Examples of the heteroatom are O, S, N, P, Si, B, Ge, Se, and any combination thereof.

The term "Ph," as used herein, refers to a phenyl group, the term "Me," as used herein, refers to a methyl group, the term "Et," as used herein, refers to an ethyl group, the term "tert-Bu" or "Bu$^t$," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In some embodiments, the "terphenyl group" is a substituted phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula.

Hereinafter, a compound according to embodiments and a light-emitting device according to embodiments will be described in more detail with reference to Synthesis Examples and Examples. The wording "B was used instead of A" used in describing Synthesis Examples refers to that an identical molar equivalent of B was used in place of A.

EXAMPLES

Synthesis Example 1: Synthesis of Compound 1

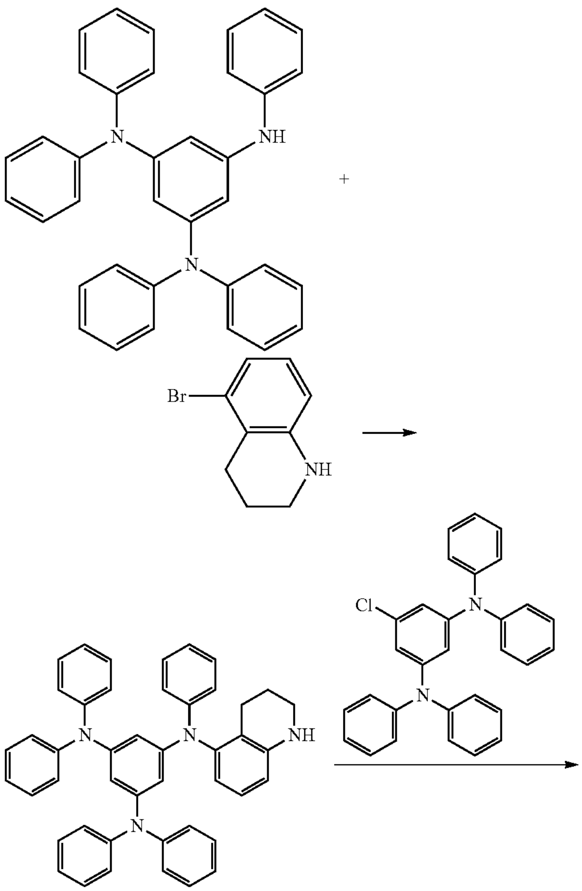

1-1

-continued

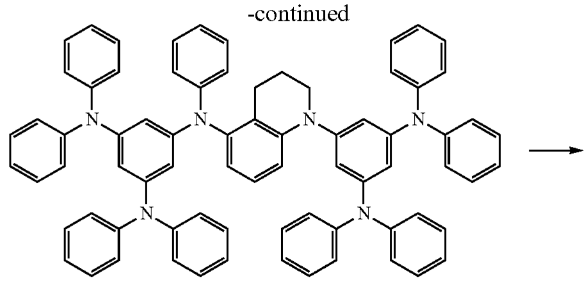

1-2

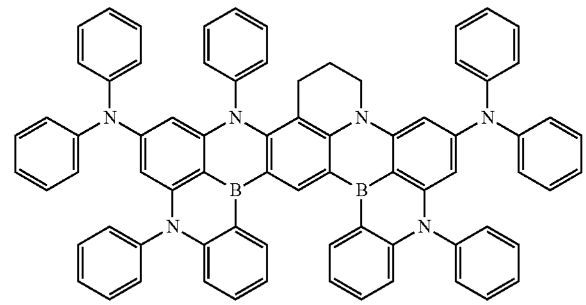

1

Synthesis of Intermediate 1-1

N1,N1,N3,N3,N5-pentaphenylbenzene-1,3,5-triamine (1 eq), 5-bromo-1,2,3,4-tetrahydroquinoline (1.1 eq), tris(dibenzylideneacetone)dipalladium(0) (0.05 eq), tri-tert-butylphosphine (0.1 eq), and sodium tert-butoxide (3 eq) were dissolved in toluene under a nitrogen atmosphere, and the resultant mixed solution was stirred under a nitrogen atmosphere at a temperature of 100° C. for 12 hours. After cooling, an organic layer obtained by washing the resultant reaction solution three times with ethyl acetate and water was dried using $MgSO_4$, and dried under reduced pressure. Subsequently, the resultant product was subjected to separation-purification by column chromatography, so as to obtain Intermediate 1-1. (Yield: 60%).

Synthesis of Intermediate 1-2

Intermediate 1-1 (1 eq), 5-chloro-N1,N1,N3,N3-tetraphenylbenzene-1,3-diamine (2 eq), tris(dibenzylideneacetone) dipalladium (0) (0.05 eq), tri-tert-butylphosphine (0.1 eq), and sodium tert-butoxide (3 eq) were dissolved in toluene under a nitrogen atmosphere, and the resultant mixed solution was stirred under a nitrogen atmosphere at a temperature of 100° C. for 12 hours. After cooling, an organic layer obtained by washing the resultant reaction solution three times with ethyl acetate and water was dried using $MgSO_4$, and dried under reduced pressure. Subsequently, the resultant product was subjected to separation-purification by column chromatography, so as to obtain Intermediate 1-2. (Yield: 60%).

Synthesis of Compound 1

Intermediate 1-2 (1 eq) was dissolved in ortho dichlorobenzene, and cooled to 0° C. Then, $BBr_3$ (5 eq) was slowly injected thereto. The reaction temperature was raised to 150° C., and the resultant reaction solution was stirred under a nitrogen atmosphere for 24 hours. After cooling, triethylamine was slowly dropped into the resultant reaction solution to quench the reaction. Afterwards, the resultant product was dropped into ethyl alcohol for precipitation, thereby obtaining a reaction product by filtration. The resultant product was purified by column chromatography, so as to obtain Compound 1. (Yield: 52%)

Synthesis Example 2: Synthesis of Compound 2

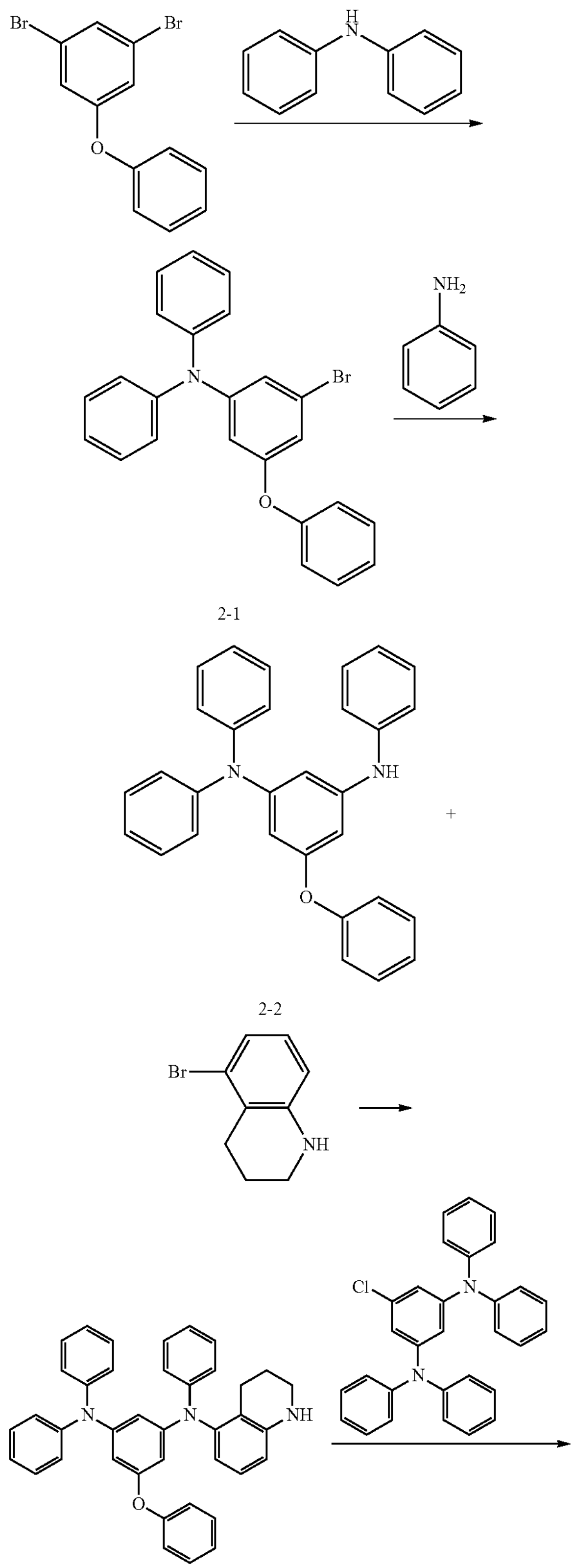

2-1

2-2

2-3

-continued

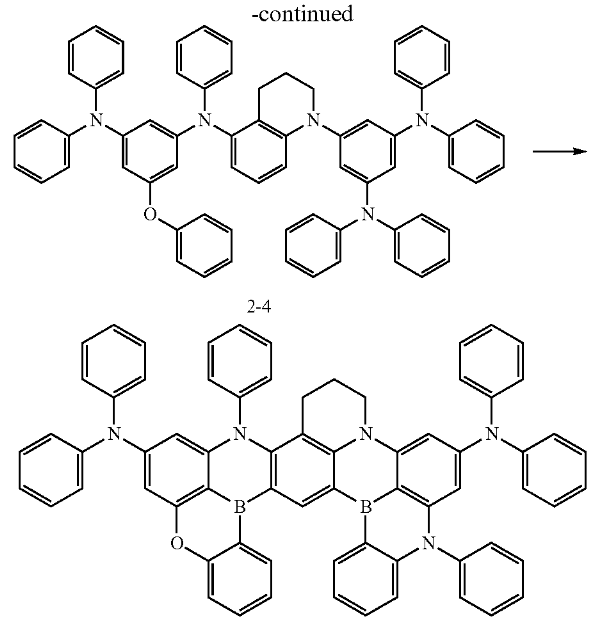

2-4

2

Synthesis of Intermediate 2-1

1,3-dibromo-5-phenoxybenzene (1 eq), diphenylamine (0.9 eq), tris(dibenzylideneacetone)dipalladium (0) (0.05 eq), BINAP (0.1 eq), and sodium tert-butoxide (3 eq) were dissolved in toluene, and the resultant mixed solution was stirred under a nitrogen atmosphere at a temperature of 100° C. for 4 hours. After cooling, an organic layer obtained by washing the resultant reaction solution three times with ethyl acetate and water was dried using $MgSO_4$, and dried under reduced pressure. Subsequently, the resultant product was subjected to separation-purification by column chromatography, so as to obtain Intermediate 2-1. (Yield: 65%).

Synthesis of Intermediate 2-2

Intermediate 2-1 (1 eq), aniline (1.5 eq), tris(dibenzylideneacetone)dipalladium(0) (0.05 eq), tri-tert-butylphosphine (0.1 eq), and sodium tert-butoxide (3 eq) were dissolved in toluene, and the mixed solution was stirred under a nitrogen atmosphere at a temperature of 100° C. for 12 hours. After cooling, an organic layer obtained by washing the reaction solution three times with ethyl acetate and water was dried using $MgSO_4$, and dried under reduced pressure. Subsequently, the resultant product was subjected to separation-purification by column chromatography, so as to obtain Intermediate 2-2. (Yield: 75%)

Synthesis of Intermediate 2-3

Intermediate 2-3 was synthesized in substantially the same manner as used to prepare Intermediate 1-1, except that Intermediate 2-2 was used instead of N1,N1,N3,N3,N5-pentaphenylbenzene-1,3,5-triamine. (Yield: 65%).

Synthesis of Intermediate 2-4

Intermediate 2-4 was synthesized in substantially the same manner as used to prepare Intermediate 1-2, except that Intermediate 2-3 was used instead of Intermediate 1-1. (Yield: 60%).

Synthesis of Compound 2

Compound 2 was synthesized in substantially the same manner as used to synthesize Compound 1, except that Intermediate 2-4 was used instead of Intermediate 1-2. (Yield: 3%).

Synthesis Example 3: Synthesis of Compound 3

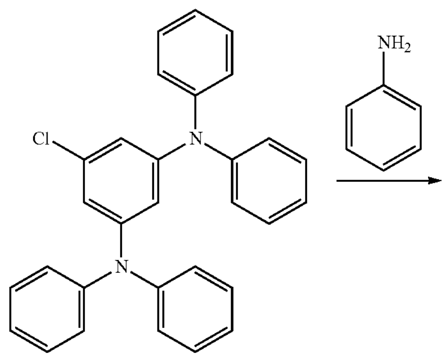

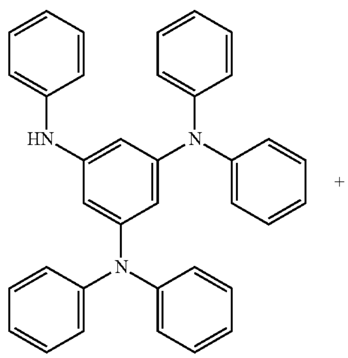

3-1

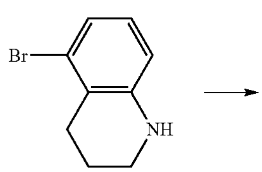

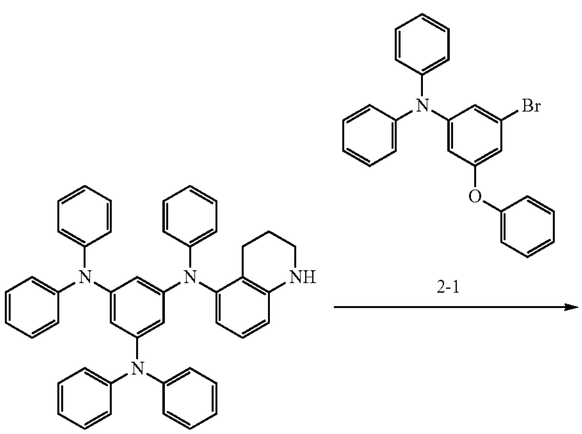

2-1

3-2

-continued

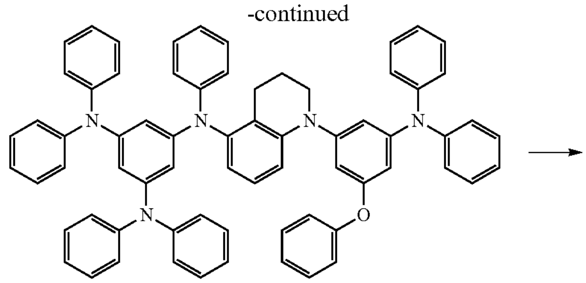

3-3

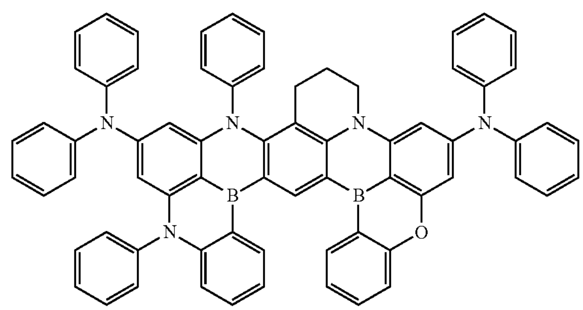

3

Synthesis of Intermediate 3-1

Intermediate 3-1 was obtained in substantially the same manner as used to synthesize Intermediate 2-2, except that 5-chloro-N1,N1,N3,N3-tetraphenylbenzene-1,3-diamine was used instead of Intermediate 2-1. (Yield: 75%) Synthesis of Intermediate 3-2

Intermediate 3-2 was synthesized in substantially the same manner as used to prepare Intermediate 1-1, except that Intermediate 3-1 was used instead of N1,N1,N3,N3,N5-pentaphenylbenzene-1,3,5-triamine. (Yield: 65%).

Synthesis of Intermediate 3-3

Intermediate 2-1 (1 eq), Intermediate 3-2 (1.5 eq), tris (dibenzylideneacetone)dipalladium(0) (0.05 eq), tri-tert-butylphosphine (0.1 eq), and sodium tert-butoxide (3 eq) were dissolved in toluene, and the mixed solution was stirred under a nitrogen atmosphere at a temperature of 100° C. for 12 hours. After cooling, an organic layer obtained by washing the resultant reaction solution three times with ethyl acetate and water was dried using $MgSO_4$, and dried under reduced pressure. Subsequently, the resultant product was subjected to separation-purification by column chromatography, so as to obtain Intermediate 3-3. (Yield: 65%).

Synthesis of Compound 3

Compound 3 was synthesized in substantially the same manner as used to synthesize Compound 1, except that Intermediate 3-3 was used instead of Intermediate 1-2. (Yield: 3%).

Synthesis Example 4: Synthesis of Compound 4

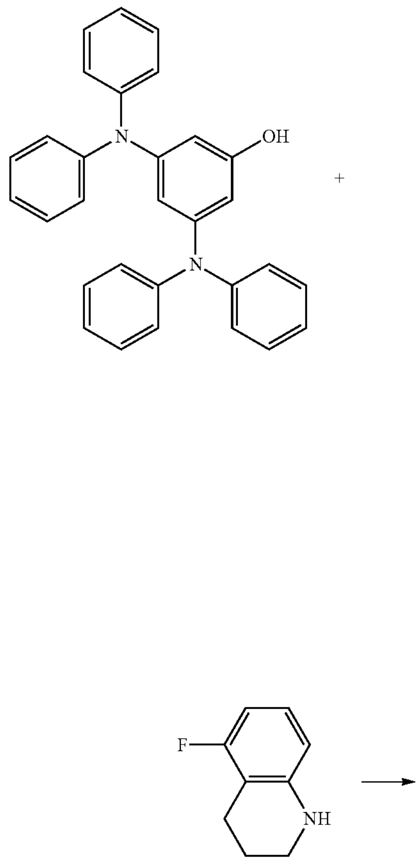

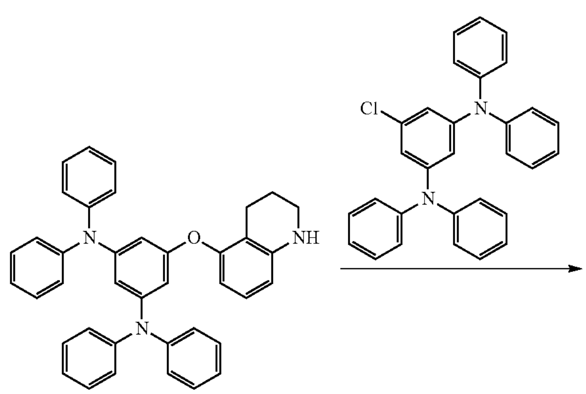

4-1

-continued

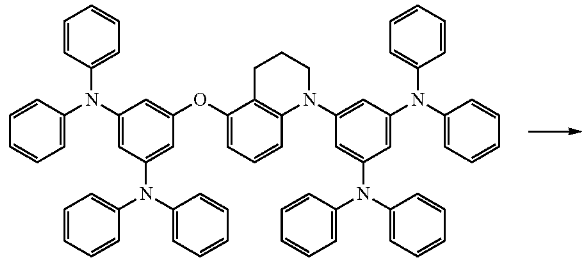

4-2

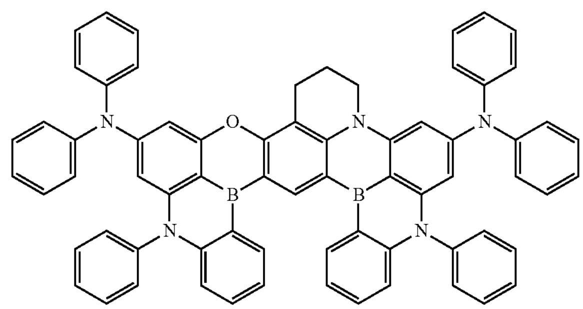

4

Synthesis of Intermediate 4-1

3,5-bis(diphenylamino)phenol (1 eq), 5-fluoro-1,2,3,4-tetrahydroquinoline (1.5 eq), and $K_3PO_4$ (2 eq) were dissolved in DMF, and the mixed solution was stirred at a temperature of 160° C. for 12 hours. After cooling, the solvent was removed therefrom under reduced pressure, and the resultant product was washed three times with dichloromethane and water, and an organic layer obtained by separation was dried using $MgSO_4$ and dried under reduced pressure. Subsequently, the resultant product was subjected to separation-purification by column chromatography, so as to obtain Intermediate 4-1. (Yield: 60%).

Synthesis of Intermediate 4-2

Intermediate 4-2 was synthesized in substantially the same manner as used to prepare Intermediate 1-2, except that Intermediate 4-1 was used instead of Intermediate 1-1. (Yield: 60%).

Synthesis of Compound 4

Compound 4 was synthesized in substantially the same manner as used to synthesize Compound 1, except that Intermediate 4-2 was used instead of Intermediate 1-2. (Yield: 6%)

Synthesis Example 5: Synthesis of Compound 8
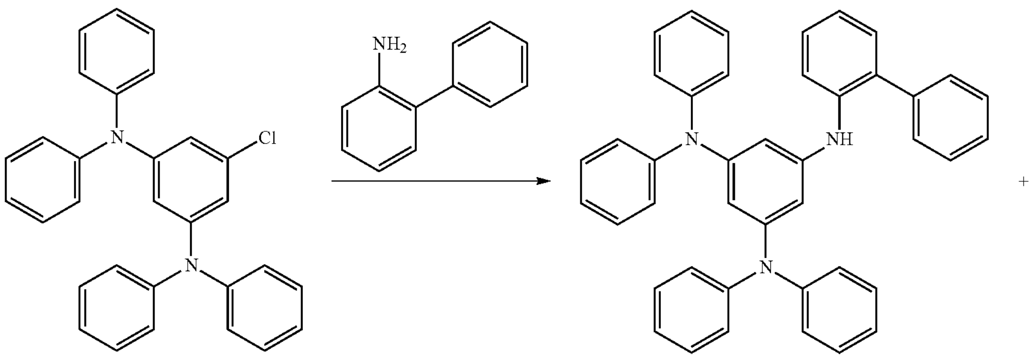
8-1
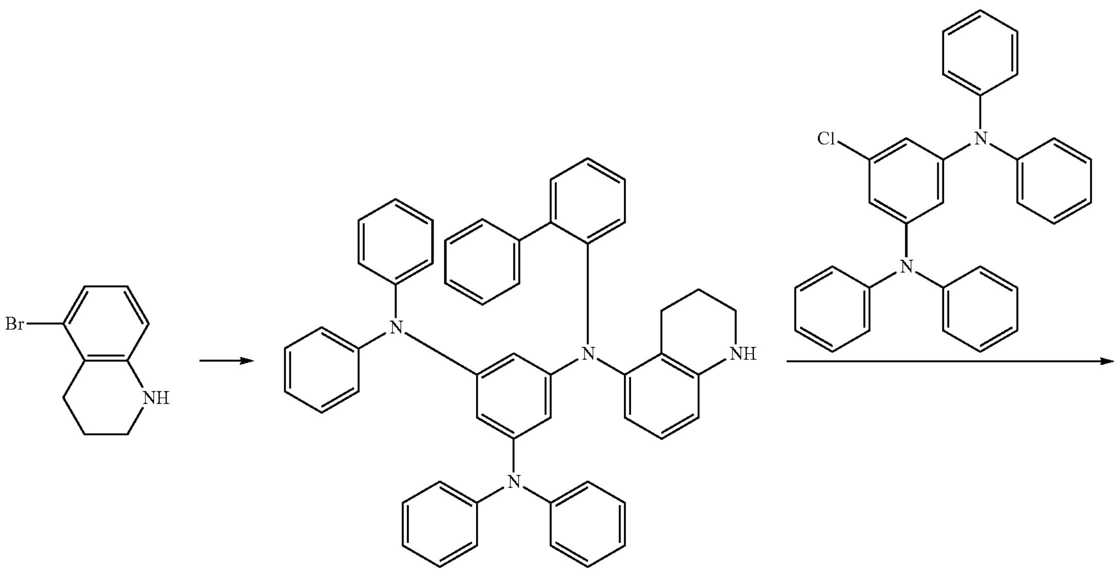
8-2
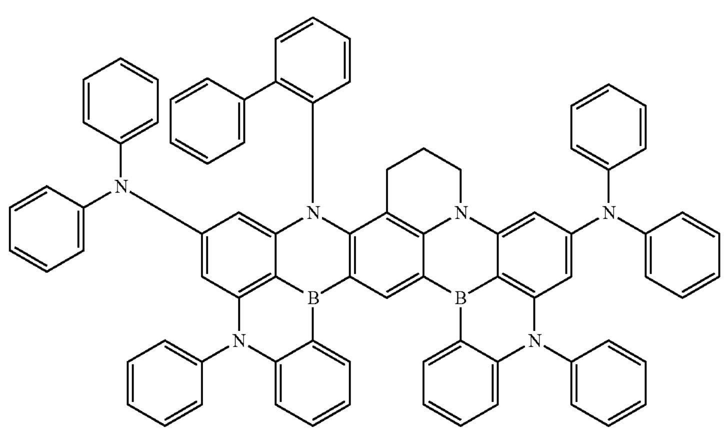
8

Synthesis of Intermediate 8-1

Intermediate 8-1 was synthesized in substantially the same manner as used to prepare Intermediate 3-1, except that [1,1'-biphenyl]-2-amine was used instead of aniline. (Yield: 70%).

Synthesis of Intermediate 8-2

Intermediate 8-2 was synthesized in substantially the same manner as used to prepare Intermediate 1-1, except that Intermediate 8-1 was used instead of N1,N1,N3,N3,N5-pentaphenylbenzene-1,3,5-triamine. (Yield: 55%)

Synthesis of Compound 8

Compound 8 was synthesized in substantially the same manner as used to synthesize Compound 1, except that Intermediate 8-2 was used instead of Intermediate 1-2. (Yield: 11%)

Synthesis Example 6: Synthesis of Compound 16

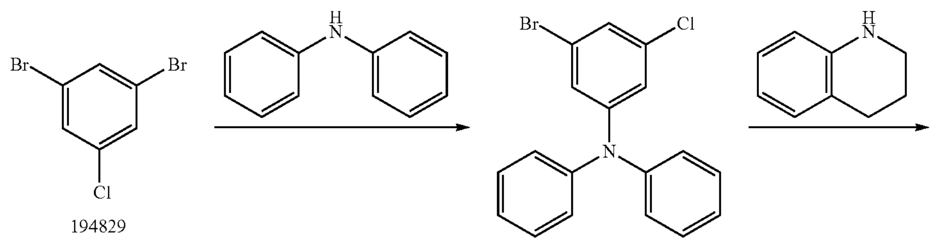

194829

16-1

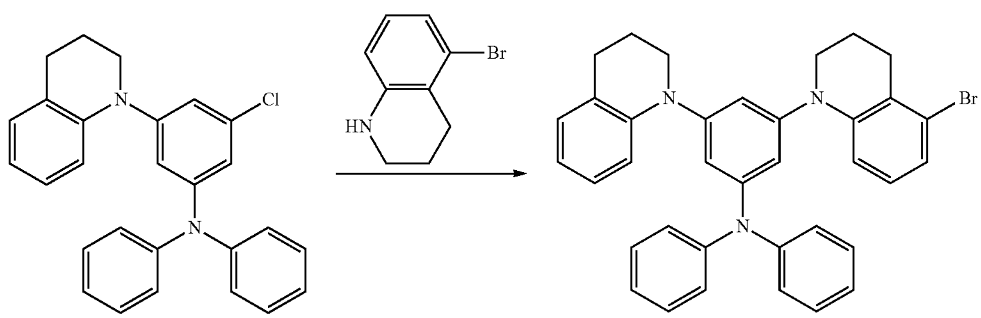

16-2

16-3

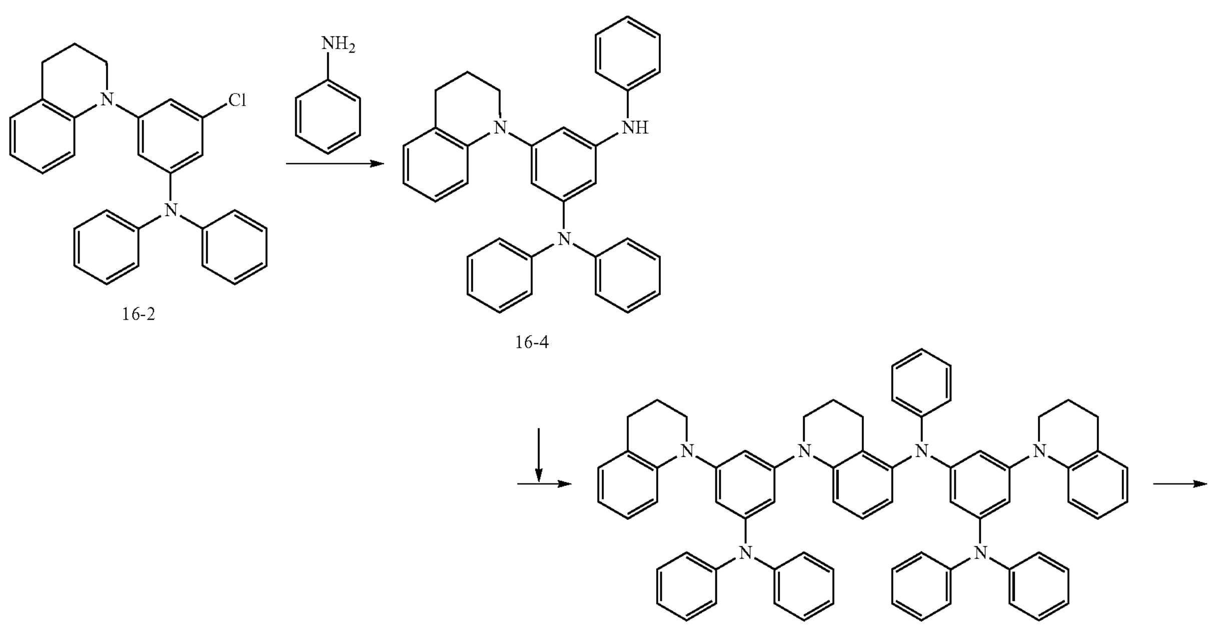

16-2

16-4

16-5

-continued

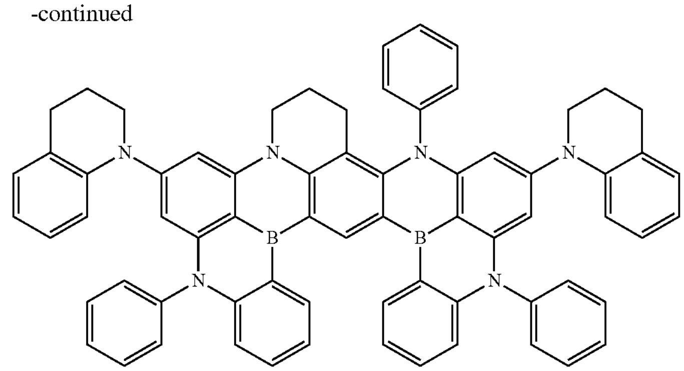

16

Synthesis of Intermediate 16-1

Intermediate 16-1 was synthesized in substantially the same manner as used to prepare Intermediate 2-1, except that 1,3-dibromo-5-chlorobenzene was used instead of 1,3-dibromo-5-phenoxybenzene. (Yield: 60%).

Synthesis of Intermediate 16-2

Intermediate 16-1 (1 eq), 1,2,3,4-tetrahydroquinoline (1.5 eq), tris(dibenzylideneacetone)dipalladium (0) (0.05 eq), tri-tert-butylphosphine (0.1 eq), and sodium tert-butoxide (3 eq) were dissolved in toluene, and the mixed solution was stirred under a nitrogen atmosphere at a temperature of 100° C. for 12 hours. After cooling, an organic layer obtained by washing the resultant reaction solution three times with ethyl acetate and water was dried using $MgSO_4$, and dried under reduced pressure. Subsequently, the resultant product was subjected to separation-purification by column chromatography, so as to obtain Intermediate 16-2. (Yield: 65%).

Synthesis of Intermediate 16-3

Intermediate 16-2 (1 eq), 5-bromo-1,2,3,4-tetrahydroquinoline (1.1 eq), tris(dibenzylideneacetone)dipalladium (0) (0.05 eq), tri-tert-butylphosphine (0.1 eq), and sodium tert-butoxide (3 eq) were dissolved in toluene, and the mixed solution was stirred under a nitrogen atmosphere at a temperature of 100° C. for 12 hours. After cooling, an organic layer obtained by washing the resultant reaction solution three times with ethyl acetate and water was dried using $MgSO_4$, and dried under reduced pressure. Subsequently, the resultant product was subjected to separation-purification by column chromatography, so as to obtain Intermediate 16-3. (Yield: 55%)

Synthesis of Intermediate 16-4

Intermediate 16-4 was synthesized in substantially the same manner as used to prepare Intermediate 16-3, except that aniline was used instead of 5-bromo-1,2,3,4-tetrahydroquinoline. (Yield: 60%).

Synthesis of Intermediate 16-5

Intermediate 16-3 (1 eq), Intermediate 16-4 (1.3 eq), tris(dibenzylideneacetone)dipalladium(0) (0.05 eq), tri-tert-butylphosphine (0.1 eq), and sodium tert-butoxide (3 eq) were dissolved in toluene, and the mixed solution was stirred under a nitrogen atmosphere at a temperature of 100° C. for 12 hours. After cooling, an organic layer obtained by washing the resultant reaction solution three times with ethyl acetate and water was dried using $MgSO_4$, and dried under reduced pressure. Subsequently, the resultant product was subjected to separation-purification by column chromatography, so as to obtain Intermediate 16-5. (Yield: 60%).

Synthesis of Compound 16

Compound 16 was synthesized in substantially the same manner as used to synthesize Compound 1, except that Intermediate 16-5 was used instead of Intermediate 1-2. (Yield: 15%)

$^1H$ NMR and MS/FAB of the compounds synthesized according to Synthesis Examples 1 to 6 are shown in Table 1. The synthesis of additional compounds other than the compounds shown in Table 1 may be easily recognized by those skilled in the art by referring to the above synthesis routes and source materials.

TABLE 1

| | | MS/FAB | |
|---|---|---|---|
| Compound | $^1H$ NMR (δ) | Calc | Found |
| 1 | 10.5 (1H, s), 9.29 (2H, d), 7.47-7.38(6H, m), 7.19-7.12 (16H, m), 7.05-6.88 (18H, m), 5.86-5.72 (5H, m), 3.10-2.75 (4H, m), 2.01-1.95 (2H, m) | 1060.94 | 1060.92 |
| 2 | 10.2 (1H, s), 9.30 (2H, d), 7.42-7.35 (5H, m), 7.20-7.11 (14H, m), 7.07-6.85 (16H, m), 5.82-5.73 (5H, m), 3.12-2.80 (4H, m), 2.11-1.97 (2H, m) | 985.81 | 985.79 |
| 3 | 10.2 (1H, s), 9.31 (2H, d), 7.44-7.37 (5H, m), 7.22-7.13 (14H, m), 7.10-6.88 (16H, m), 5.81-5.74 (5H, m), 3.10-2.81 (4H, m), 2.13-1.99 (2H, m) | 985.81 | 985.79 |
| 4 | 10.3 (1H, s), 9.35 (2H, d), 7.48-7.35 (6H, m), 7.24-7.18 (16H, m), 7.05-6.90 (14H, m), 6.01-5.82 (4H, m), 3.09-2.83 (4H, m), 2.15-1.98 (2H, m) | 985.81 | 985.79 |
| 8 | 10.6 (1H, s), 9.38 (2H, d), 7.67-7.35 (10H, m), 7.27-7.12 (21H, m), 7.08-6.93 (14H, m), 5.97-5.82 (4H, m), 3.10-2.85 (4H, m), 2.12-1.99 (2H, m) | 1137.01 | 1136.99 |
| 16 | 10.6 (1H, s), 9.38 (2H, d), 7.67-7.35 (6H, m), 7.27-7.12 (12H, m), 7.08-6.93 (10H, m), 5.97-5.82 (5H, m), 3.20-3.02 (6H, m), 2.98-2.71 (6H, m), 2.12-1.97 (6H, m) | 988.85 | 988.83 |

As an anode, a Corning 15 $\Omega/cm^2$ (1,200 Å) ITO glass substrate was cut to a size of 50 mm×50 mm×0.7 mm, sonicated with isopropyl alcohol and pure water each for 5 minutes, and then cleaned by exposure to ultraviolet rays and ozone for 30 minutes. The ITO glass substrate was provided to a vacuum deposition apparatus.

NPD was vacuum-deposited on the ITO anode formed on the ITO glass substrate to form a hole injection layer having a thickness of 300 Å, and HT3 was vacuum-deposited on the hole injection layer to form a first hole transport layer having a thickness of 200 Å.

CzSi which is a hole transport compound was vacuum-deposited on the first hole transport layer to form a second hole transport layer having a thickness of 100 Å.

mCP (host) and Compound 1 (dopant) were co-deposited to a weight ratio of 99:1 on the second hole transport layer to form an emission layer having a thickness of 200 Å.

Subsequently, TSPO1 was deposited on the emission layer to form a buffer layer having a thickness of 200 Å, and TPBI was deposited on the buffer layer to form an electron transport layer having a thickness of 300 Å.

LiF which is a halogenated alkali metal was deposited on the electron transport layer to form an electron injection layer having a thickness of 10 Å, and Al was vacuum-deposited thereon to form a LiF/Al electrode having a thickness of 3,000 Å. HT28 was vacuum-deposited on the LiF/Al electrode to form a capping layer having a thickness of 700 Å, thereby completing the manufacture of a light-emitting device.

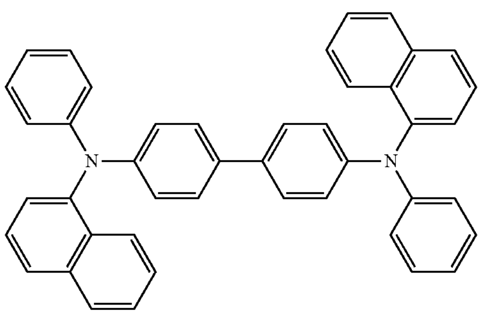

NPD

HT3

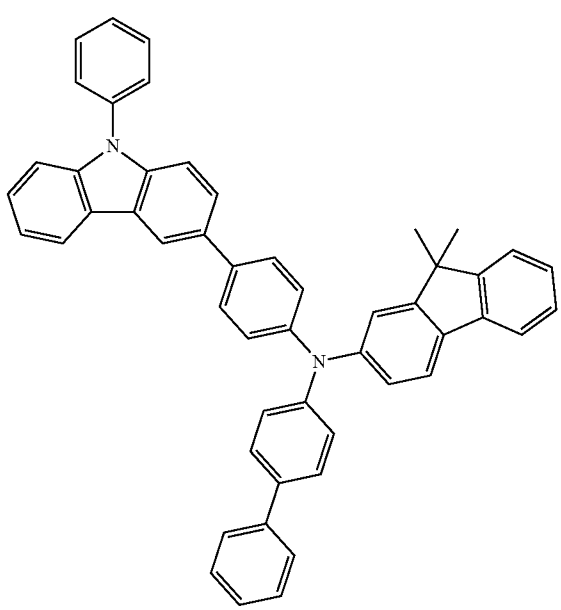

-continued

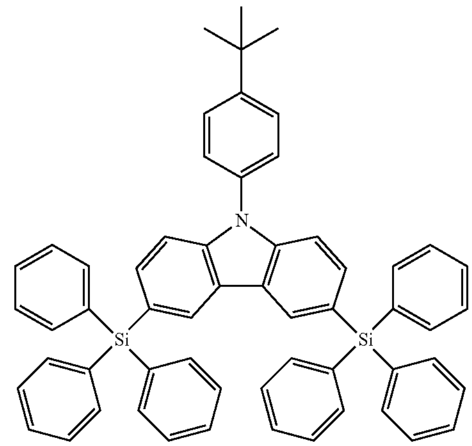

CzSi

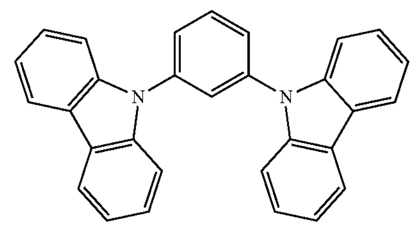

mCP

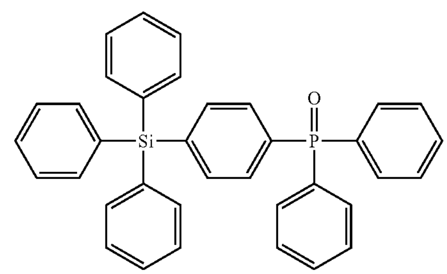

TSPO1

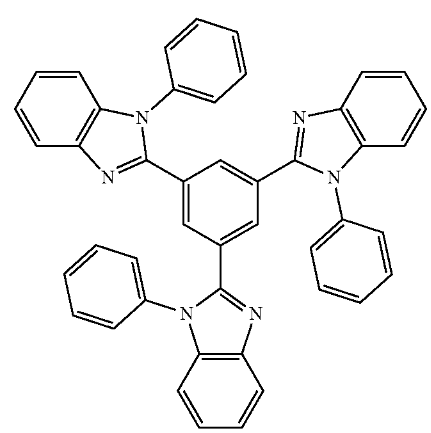

TPBI

-continued

HT28

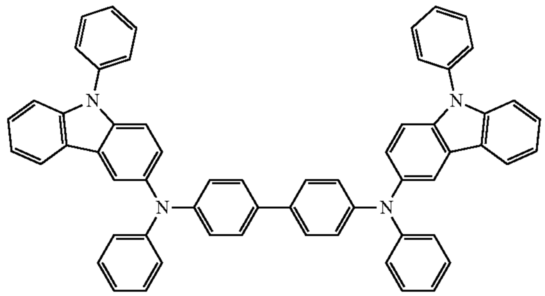

Examples 2 to 12 and Comparative Examples 1 to 6

Light-emitting devices were manufactured in substantially the same manner as in Example 1, except that materials shown in Table 2 were each used instead of HT3 in forming a first hole transport layer, and that compounds shown in Table 2 were each used instead of Compound 1 in forming an emission layer.

Evaluation Example 1

To evaluate characteristics of the light-emitting devices of Examples 1 to 12 and Comparative Examples 1 to 6, the driving voltage at current density of 10 mA/cm, luminescence efficiency, and maximum external quantum efficiency (EQE) were measured. The driving voltage of the light-emitting device was measured using a source meter (Keithley Instrument, 2400 series), and the maximum EQE was measured using an external quantum efficiency measurement device C9920-2-12 of Hamamatsu Photonics Inc. In evaluating the maximum EQE, the luminance/current density was measured using a luminance meter that was calibrated for wavelength sensitivity, and the maximum EQE was converted under the assumption that an angular luminance distribution (Lambertian) was obtained with respect to a fully diffused reflective surface. The results of the characteristics evaluation of the light-emitting devices are shown in Table 2.

TABLE 2

| | Hole transport layer material | Dopant in emission layer | Driving voltage (V) | Luminescence efficiency (cd/A) | Maximum EQE (%) | Emission color |
|---|---|---|---|---|---|---|
| Example 1 | HT3 | Compound 1 | 4.5 | 25.3 | 24.9 | Blue |
| Example 2 | HT3 | Compound 2 | 4.62 | 22.5 | 22.6 | Blue |
| Example 3 | HT3 | Compound 3 | 4.51 | 23.2 | 22.5 | Blue |
| Example 4 | HT3 | Compound 4 | 4.71 | 23.8 | 23.1 | Blue |
| Example 5 | HT3 | Compound 8 | 4.56 | 23.8 | 23.8 | Blue |
| Example 6 | HT3 | Compound 16 | 4.66 | 23.7 | 23.7 | Blue |
| Example 7 | HT44 | Compound 1 | 4.42 | 24.4 | 26.1 | Blue |
| Example 8 | HT44 | Compound 2 | 4.62 | 22.2 | 24.9 | Blue |
| Example 9 | HT44 | Compound 3 | 4.51 | 23.1 | 23.5 | Blue |
| Example 10 | HT44 | Compound 4 | 4.70 | 24.1 | 23.6 | Blue |
| Example 11 | HT44 | Compound 8 | 4.57 | 23.5 | 22.9 | Blue |
| Example 12 | HT44 | Compound 16 | 4.64 | 23.2 | 23.4 | Blue |
| Comparative Example 1 | HT3 | Compound A | 5.7 | 15.6 | 16.1 | Blue |
| Comparative Example 2 | HT3 | Compound B | 5.0 | 22.1 | 22.4 | Blue |
| Comparative Example 3 | HT3 | Compound C | 5.0 | 20.4 | 21.7 | Turquoise |
| Comparative Example 4 | NPD | Compound 1 | 4.92 | 22.2 | 23.1 | Blue |
| Comparative Example 5 | NPD | Compound 2 | 4.81 | 21.1 | 21.8 | Blue |
| Comparative Example 6 | NPD | Compound 8 | 4.94 | 22.1 | 21.4 | Blue |

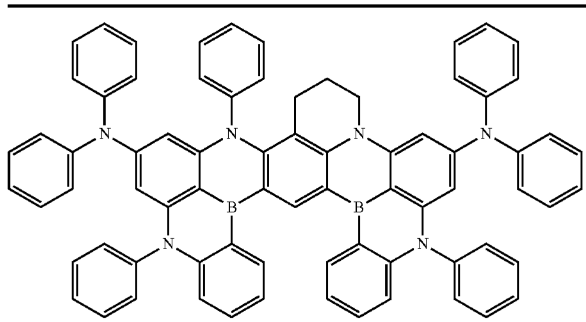

1

TABLE 2-continued
| | Hole transport layer material | Dopant in emission layer | Driving voltage (V) | Luminescence efficiency (cd/A) | Maximum EQE (%) | Emission color |
|---|---|---|---|---|---|---|
| | | | | | | |
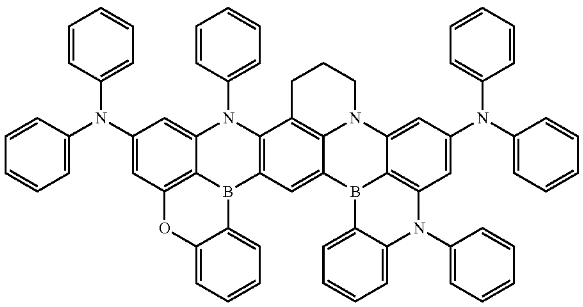
2
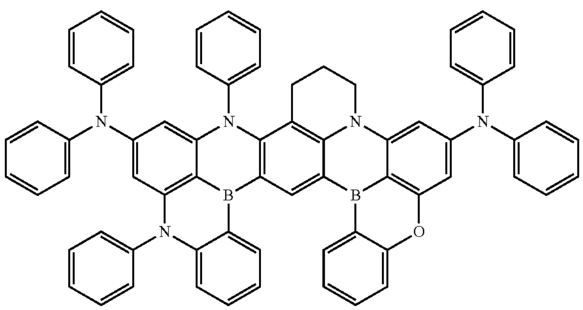
3
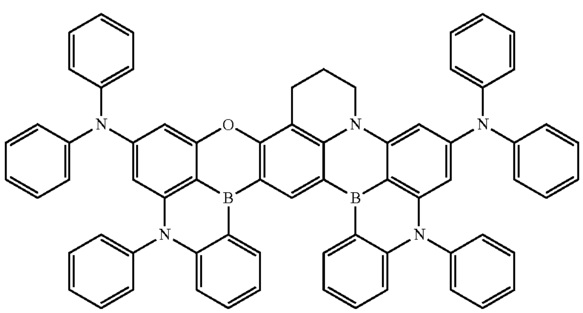
4
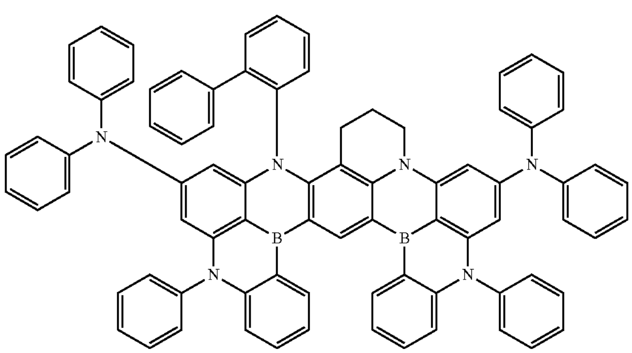
8

TABLE 2-continued
| Hole transport layer material | Dopant in emission layer | Driving voltage (V) | Luminescence efficiency (cd/A) | Maximum EQE (%) | Emission color |
|---|---|---|---|---|---|
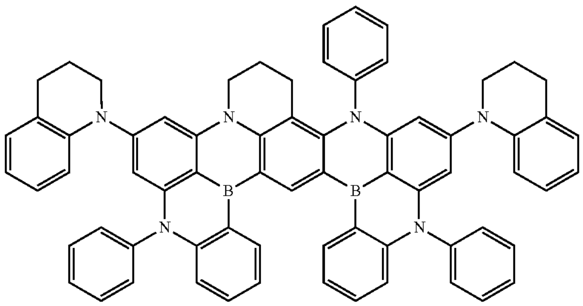
16
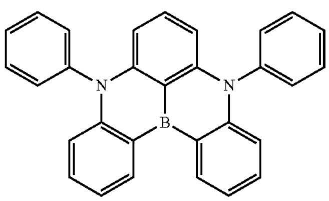
A
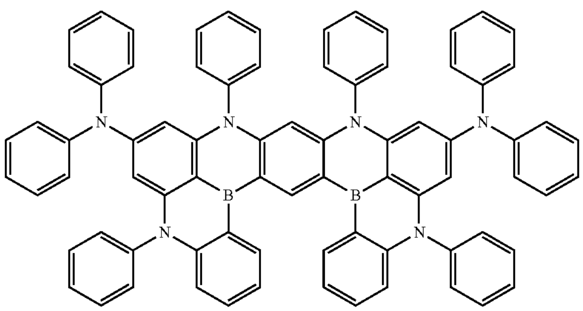
B
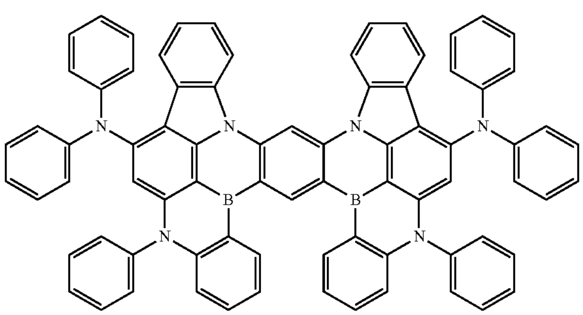
C TABLE 2-continued

| Hole transport layer material | Dopant in emission layer | Driving voltage (V) | Luminescence efficiency (cd/A) | Maximum EQE (%) | Emission color |
|---|---|---|---|---|---|

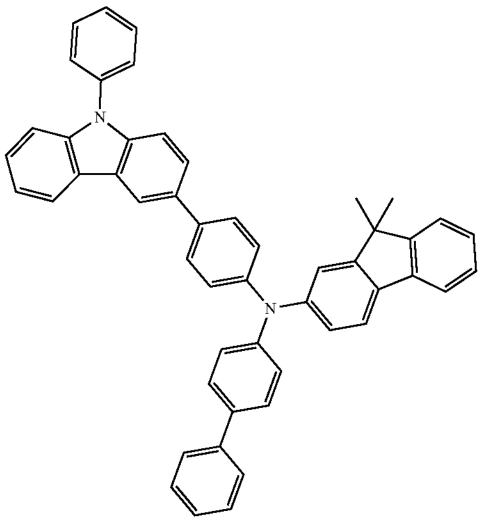

HT3

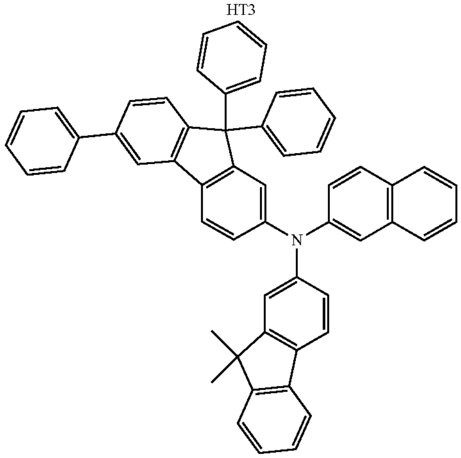

HT44

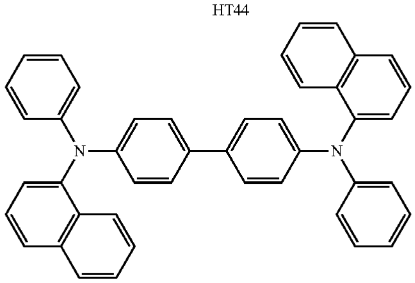

NPD

Referring to Table 2, it can be seen that the light-emitting devices of Examples 1 to 12 had lowered driving voltage, increased luminescence efficiency, or increased maximum EQE compared to the light-emitting devices of Comparative Examples 1 to 6.

According to the one or more embodiments, a light-emitting device may have low driving voltage, high efficiency, and long lifespan, and in this regard, such a light-emitting device may be used to manufacture a high-quality electronic apparatus.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A light-emitting device comprising:

a first electrode;

a second electrode facing the first electrode; and an interlayer between the first electrode and the second electrode and including an emission layer, wherein the interlayer further comprises a hole transport region between the first electrode and the emission layer, the hole transport region comprises a compound represented by Formula 201, a compound represented by Formula 202, or any combination thereof, and the emission layer comprises at least one heterocyclic compound represented by Formula 1:

Formula 1

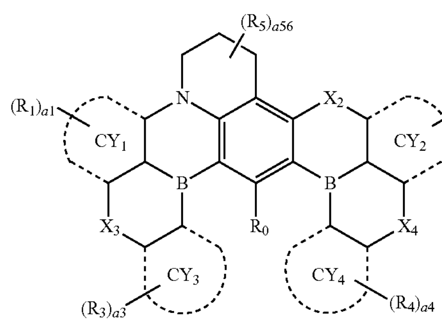

Formula 201

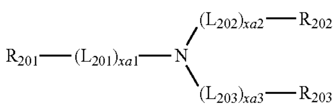

Formula 202

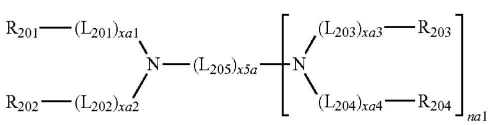

wherein, in Formula 1, $X_2$ is O, S, Se, $C(Z_{2a})(Z_{2b})$, or $N(Z_{2a})$, $X_3$ is O, S, Se, $C(Z_{3a})(Z_{3b})$, or $N(Z_{3a})$, $X_4$ is O, S, Se, $C(Z_{4a})(Z_{4b})$, or $N(Z_{4a})$, ring $CY_1$ to ring $CY_4$ are each independently a $C_3$-$C_{60}$ carbocyclic group or a $C_1$-$C_{60}$ heterocyclic group, $R_0$ to $R_5$, $Z_{2a}$, $Z_{2b}$, $Z_{3a}$, $Z_{3b}$, $Z_{4a}$, and $Z_{4b}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, a1 to a4 are each independently an integer selected from 0 to 20, a56 is an integer selected from 0 to 6, $Z_{2a}$ or $Z_{2b}$ is optionally linked to $R_2$ to form a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $Z_{3a}$ or $Z_{3b}$ is optionally linked to $R_3$ to form a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $Z_{4a}$ or $Z_{4b}$ is optionally linked to $R_4$ to form a $C_3$-$C_{60}$ carbocyclic group that is unsubstituted or substituted with at least one $R_{10a}$, or a $C_1$-$C_{60}$ heterocyclic group that is unsubstituted or substituted with at least one $R_{10a}$, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_6$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, wherein, in Formulae 201 and 202, $L_{201}$ to $L_{204}$ are each independently a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $L_{205}$ is *—O—*', *—S—*', *—$N(Q_{201})$-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 are each independently an integer selected from 0 to 5, xa5 is an integer selected from 1 to 10, $R_{201}$ to $R_{204}$ and $Q_{201}$ are each independently a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ are optionally linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, $R_{203}$ and $R_{204}$ are optionally linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, na1 is an integer selected from 1 to 4, and and *' each indicate a binding site to a neighboring atom.

2. The light-emitting device of claim 1, wherein:

the first electrode is an anode, the second electrode is a cathode, the interlayer further comprises an electron transport region between the emission layer and the second electrode, the hole transport region comprises a hole injection layer, a hole transport layer, an emission auxiliary layer, an electron blocking layer, or any combination thereof, and the electron transport region comprises a buffer layer, a hole blocking layer, an electron control layer, an electron transport layer, an electron injection layer, or any combination thereof.

3. The light-emitting device of claim 2, wherein:

at least one selected from the hole transport region and the emission layer comprises an arylamine-containing compound, an acridine-containing compound, a carbazole-containing compound, or any combination thereof; or at least one selected from the emission layer and the electron transport region comprises a silicon-containing compound, a phosphine oxide-containing compound, a sulfur oxide-containing compound, a phosphorus oxide-containing compound, a triazine-containing compound, a pyrimidine-containing compound, a pyridine-containing compound, a dibenzofuran-containing compound, a dibenzothiophene-containing compound, or any combination thereof.

4. The light-emitting device of claim 1, wherein $X_2$ is O or $N(Z_{2a})$.

5. The light-emitting device of claim 1, wherein ring $CY_1$ to ring $CY_4$ are each independently a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

6. The light-emitting device of claim 1, wherein at least one selected from ring $CY_1$ to ring $CY_4$ is a benzene group.

7. The light-emitting device of claim 1, wherein $R_0$ to $R_5$, $Z_{2a}$, $Z_{2b}$, $Z_{3a}$, $Z_{3b}$, $Z_{4a}$, and $Z_{4b}$ are each independently:

hydrogen, deuterium, —F, —Cl, —Br, —I, a hydroxyl group, a cyano group, or a nitro group;

a $C_1$-$C_{20}$ alkyl group, a $C_2$-$C_{20}$ alkenyl group, a $C_2$-$C_{20}$ alkynyl group, or a $C_1$-$C_{20}$ alkoxy group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, an imidazopyrimidinyl group, an azacarbazolyl group, an azadibenzofuranyl group, an azadibenzothienyl group, an azafluorenyl group, an azadibenzosilolyl group, a piperidinyl group, an acridinyl group, a phenothiazinyl group, a 1,2,3,4-tetrahydroquinoline group, or a phenoxazinyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, a $C_1$-$C_{20}$ alkyl group, a $C_2$-$C_{20}$ alkenyl group, a $C_2$-$C_{20}$ alkynyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thienyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothienyl group, an benzoisothiazolyl group, a benzoxazolyl group, an benzoisoxazolyl group, a triazolyl group, a tetrazolyl group, an oxadiazolyl group, a triazinyl group, a dibenzofuranyl group, a dibenzothienyl group, a benzocarbazolyl group, a dibenzocarbazolyl group, an imidazopyridinyl group, an imidazopyrimidinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, or $—B(Q_1)(Q_2)$, $—P(Q_1)(Q_2)$, or $—C(=O)(Q_1)$.

8. The light-emitting device of claim 1, wherein ring $CY_1$ and ring $CY_2$ are identical to each other.

9. The light-emitting device of claim 1, wherein the emission layer comprises at least one heterocyclic compound represented by any of Formulae 1A to 1D:

1A

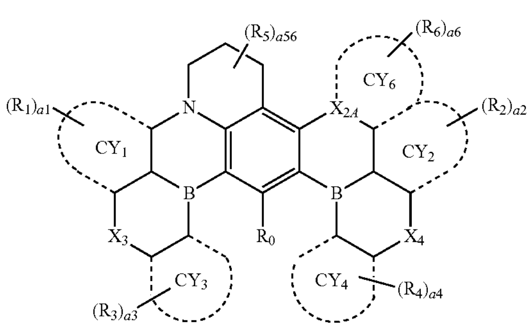

-continued

1B

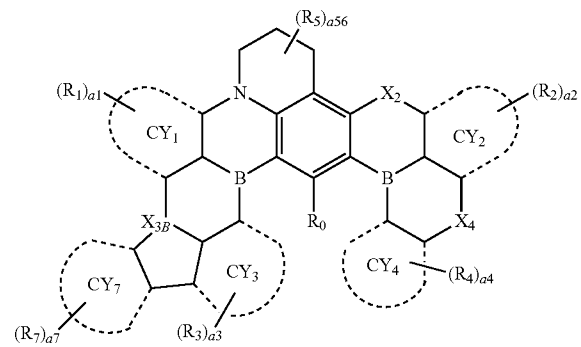

1C

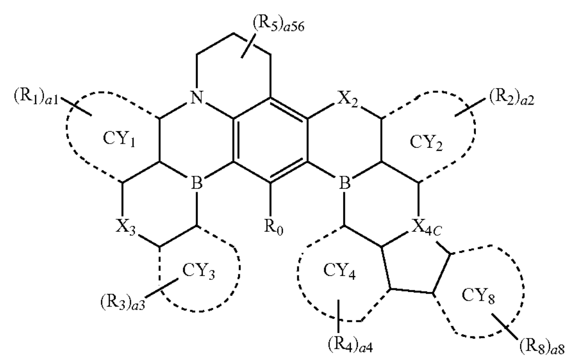

1D

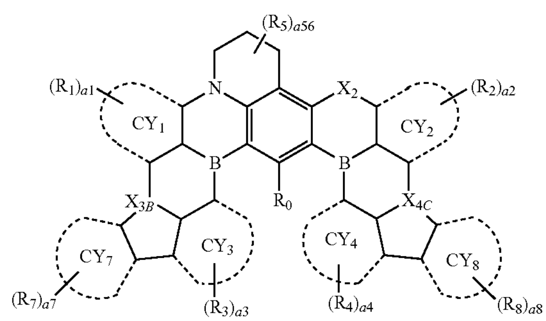

wherein, in Formulae 1A to 1D, $X_2$ to $X_4$, ring $CY_1$ to ring $CY_4$, $R_0$ to $R_5$, a1 to a4, and a56 are each the same as described in claim 1, $X_{2A}$ is $C(Z_{2a})(Z_{2b})$ or $N(Z_{2a})$, $X_{3B}$ is $C(Z_{3a})(Z_{3b})$ or $N(Z_{3a})$, $X_{4C}$ is $C(Z_{4a})(Z_{4b})$ or $N(Z_{4a})$, ring $CY_6$ to ring $CY_8$ are each the same as described in connection with ring $CY_1$ in claim 1, $R_6$ to $R_8$ are each the same as described in connection with $R_1$ in claim 1, and a6 to a8 are each the same as described in connection with a1 in claim 1.

10. The light-emitting device of claim 1, wherein the emission layer comprises at least one heterocyclic compound represented by any of Formulae 1A-1 to 1D-1:

-continued 1A-1

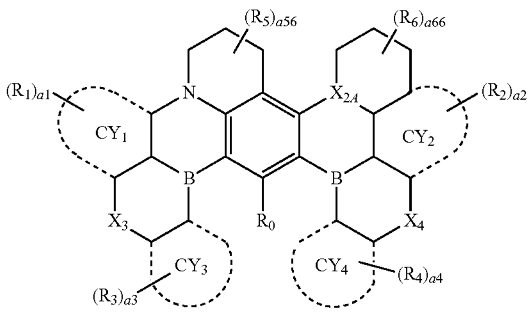

1B-1

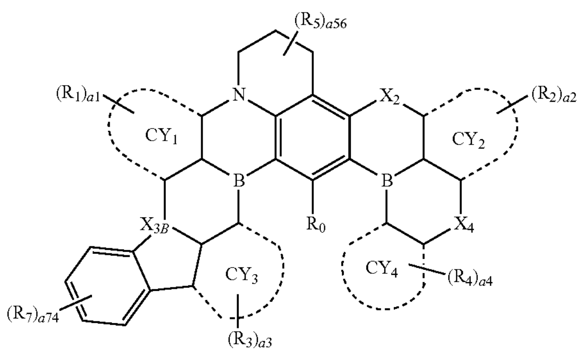

1C-1

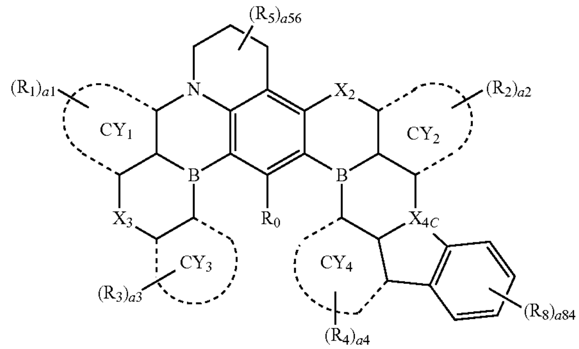

1D-1

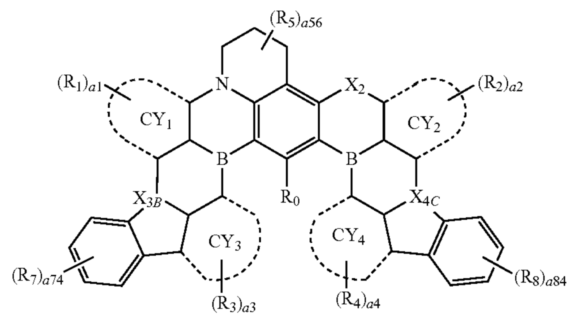

wherein, in Formulae 1A-1 to 1D-1, $X_2$ to $X_4$, ring $CY_1$ to ring $CY_4$, $R_0$ to $R_5$, a1 to a4, and a56 are each the same as described in claim 1, $X_{2A}$ is $C(Z_{2a})(Z_{2b})$ or $N(Z_{2a})$, $X_{3B}$ is $C(Z_{3a})(Z_{3b})$ or $N(Z_{3a})$, $X_{4C}$ is $C(Z_{4a})(Z_{4b})$ or $N(Z_{4a})$, $R_6$ to $R_8$ are each the same as described in connection with $R_1$ in claim 1, a66 is the same as described in connection with a56 in claim 1, and a74 and a84 are each independently an integer selected from 0 to 4.

11. The light-emitting device of claim 1, wherein the emission layer comprises at least one heterocyclic compound selected from Compounds 1 to 40:

1

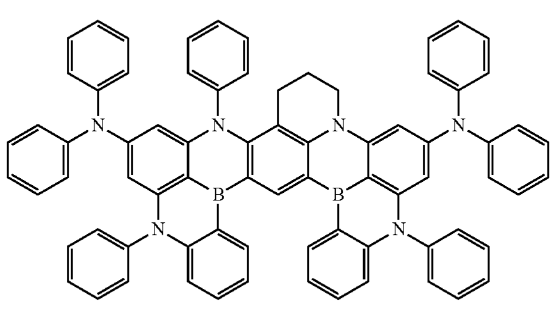

2

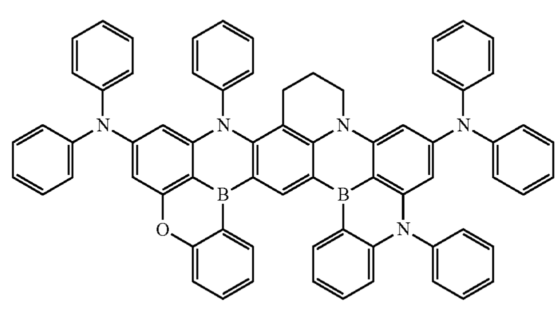

-continued
3
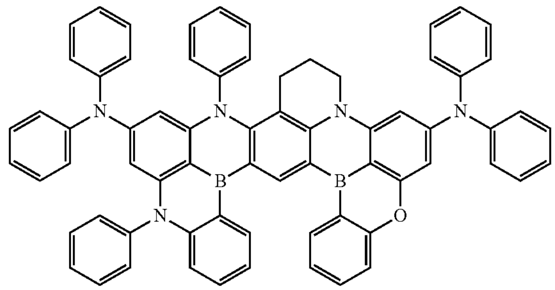
4
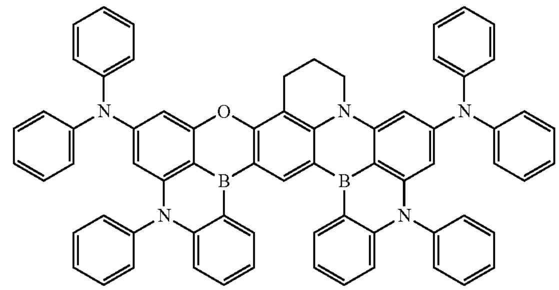
5
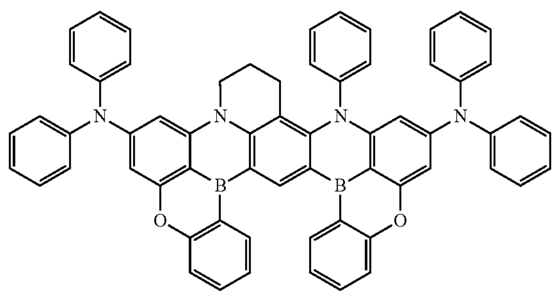
6
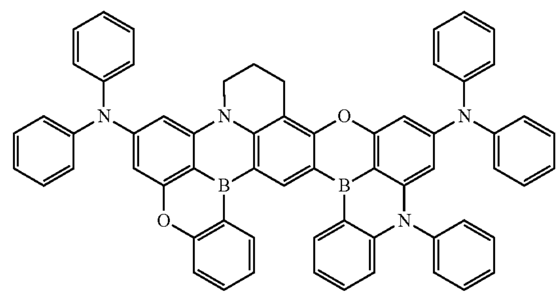
7
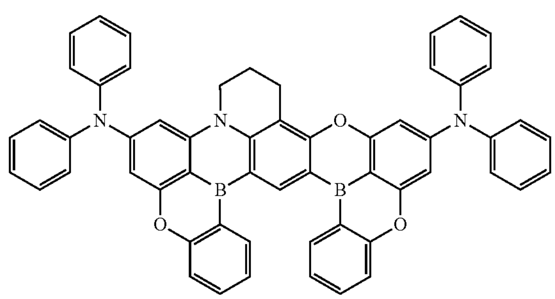
8
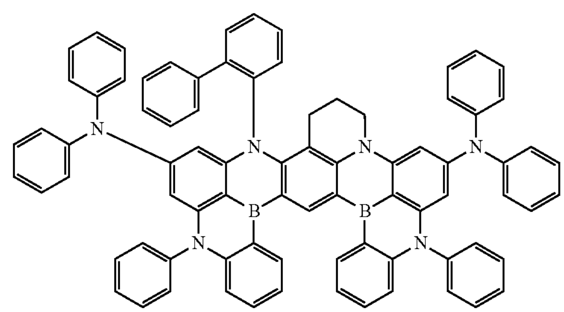
9
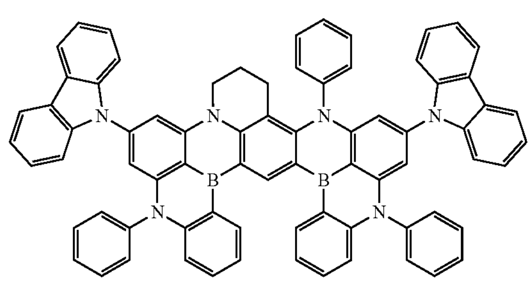
10
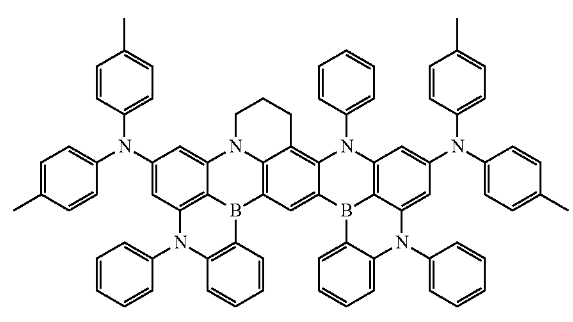

-continued
11
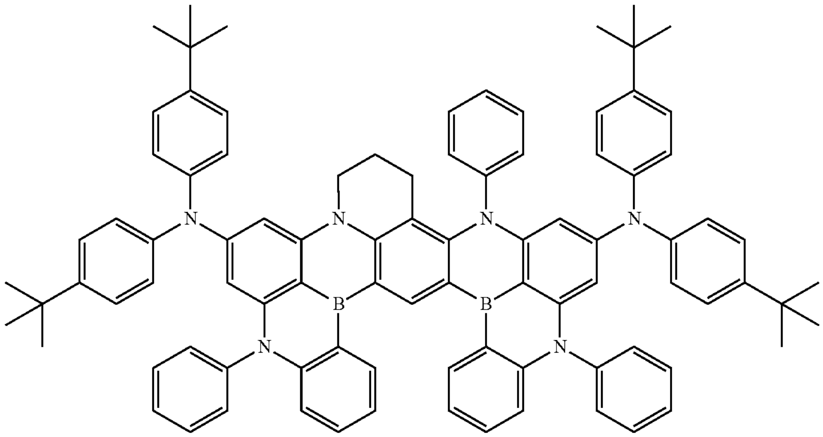
12
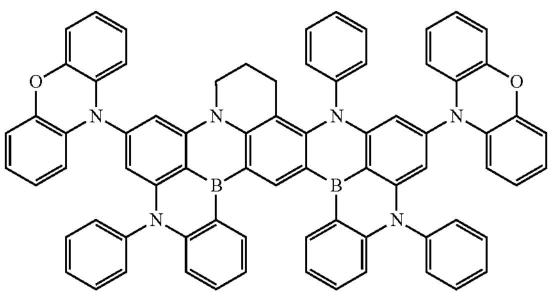
13
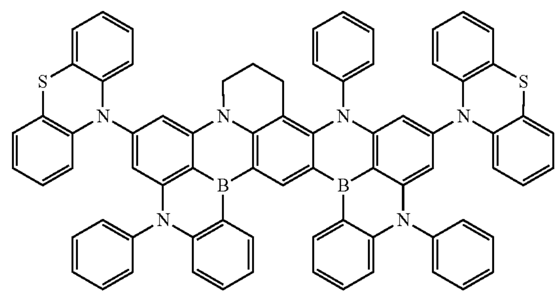
14
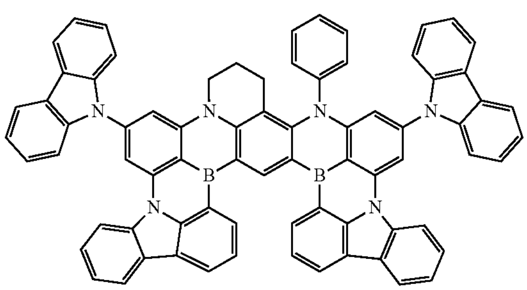
15
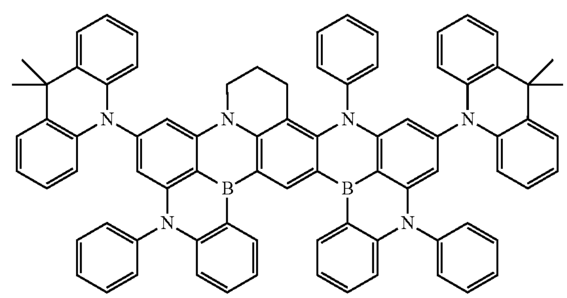
16
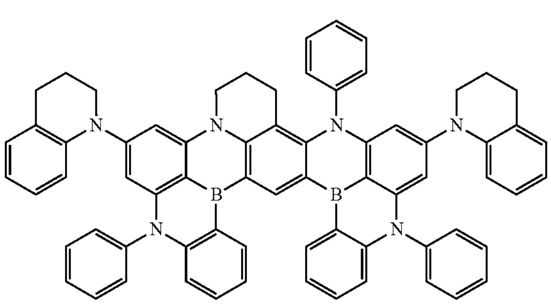
17
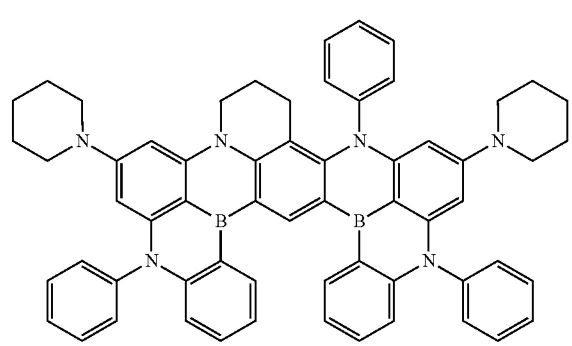

-continued
18
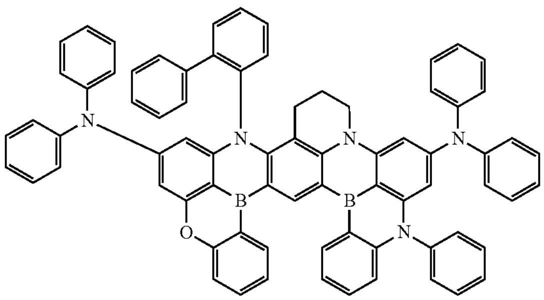
19
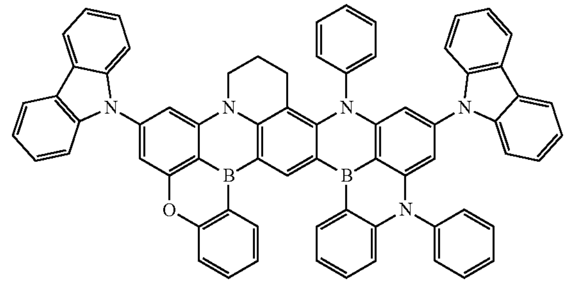
20
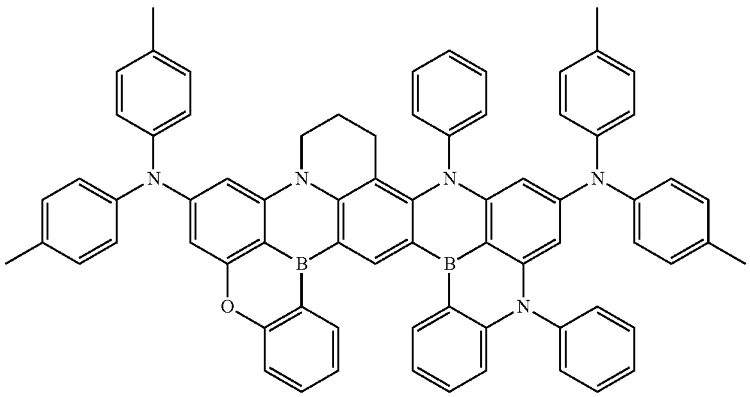
21
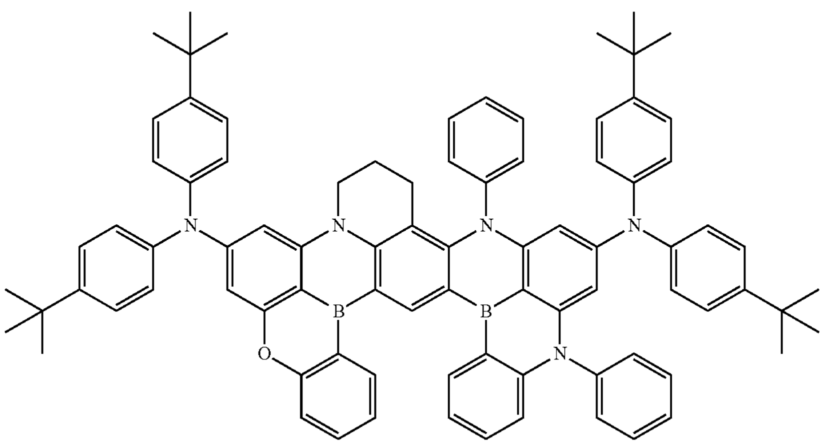
22
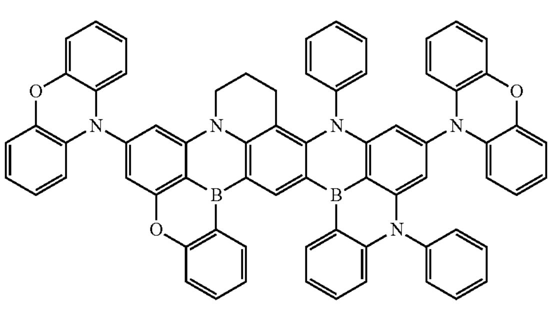
23
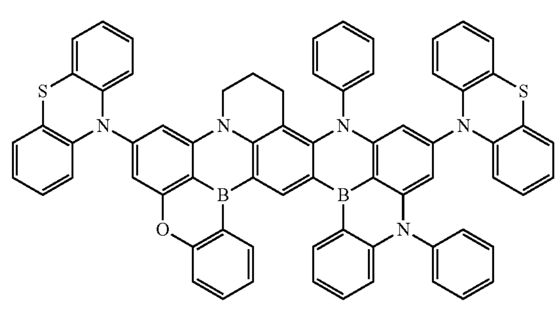

-continued
24
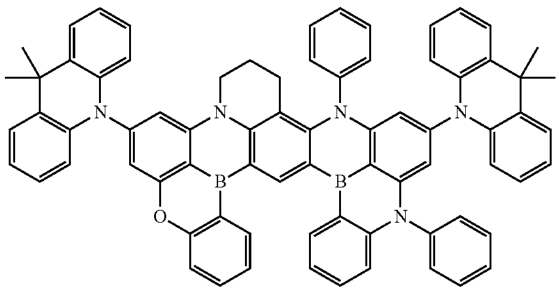
25
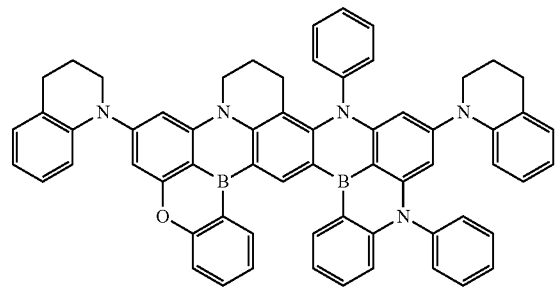
26
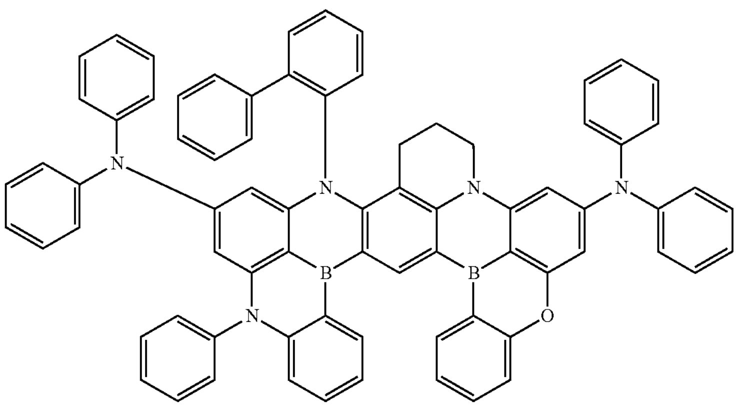
27
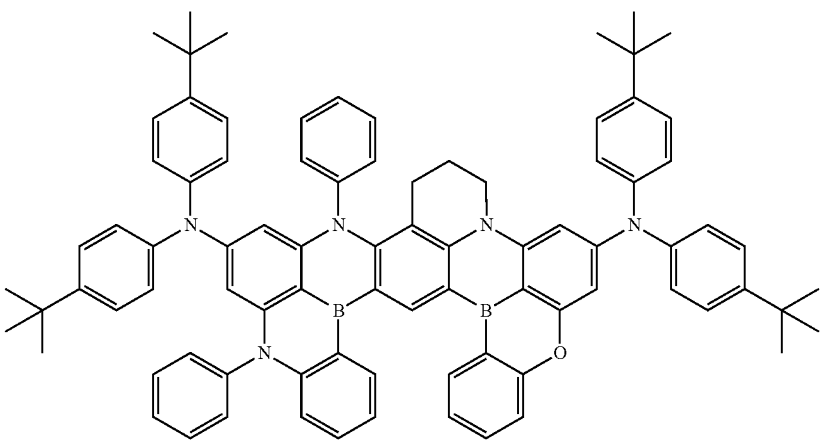
28
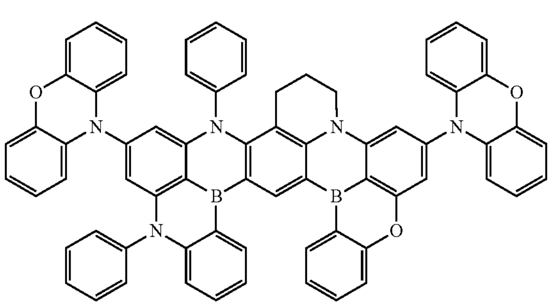
29
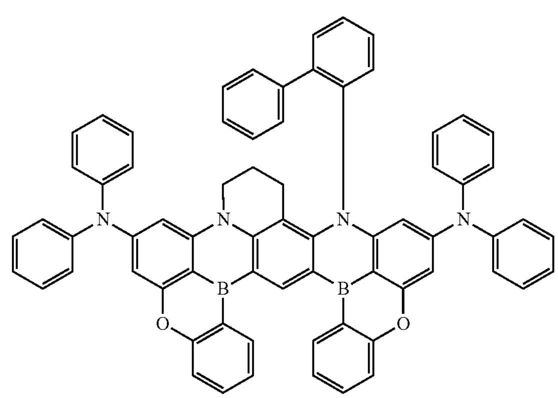

-continued
30
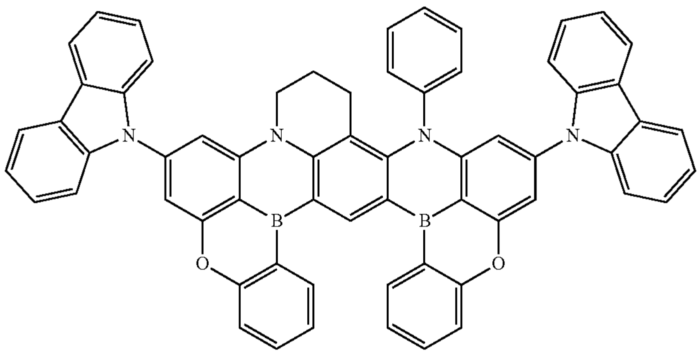
31
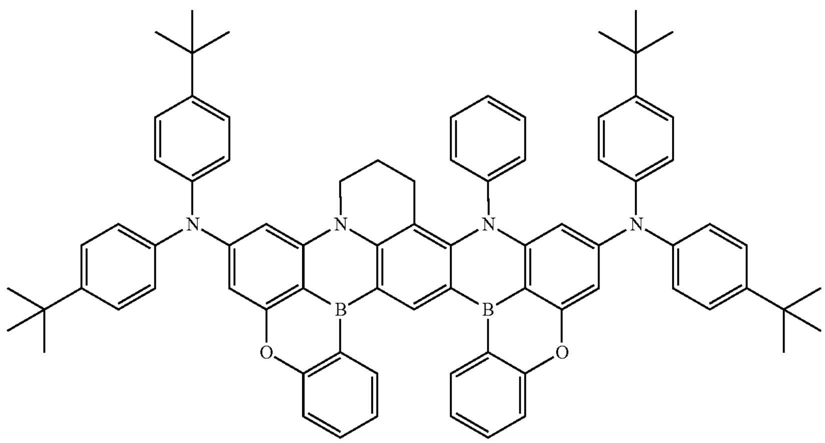
32
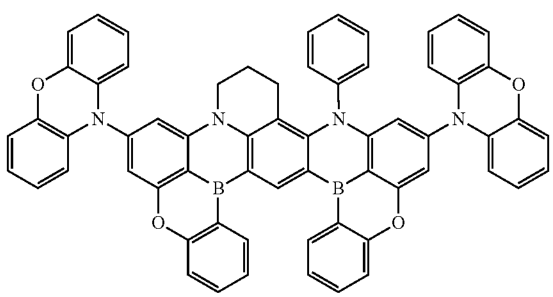
33
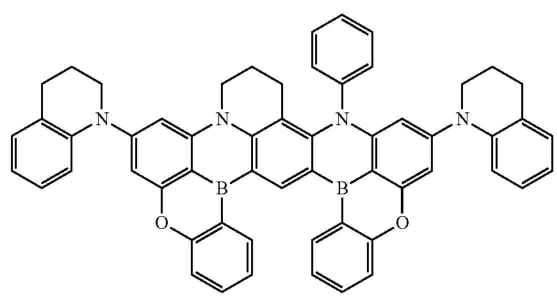
34
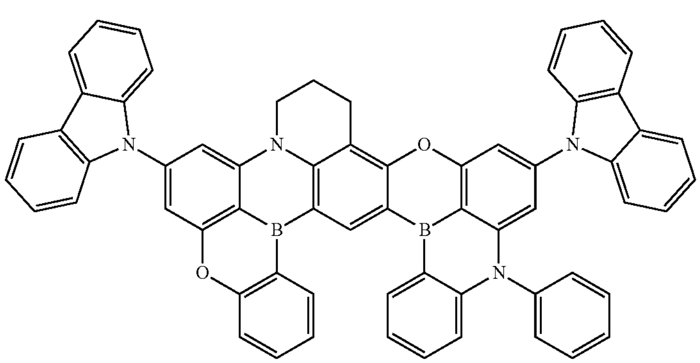

-continued
35
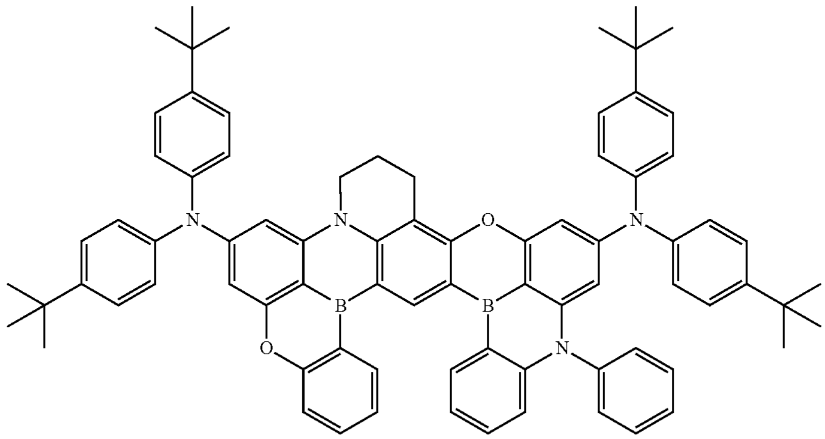
36
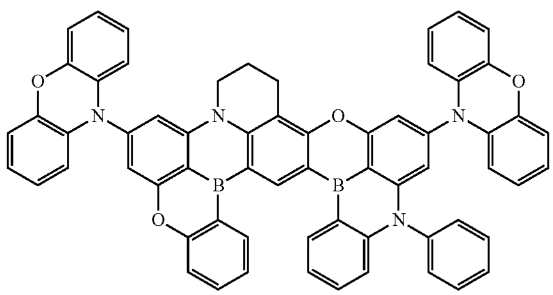
37
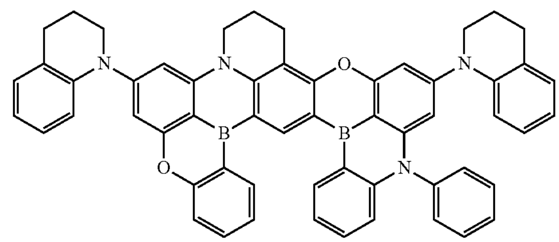
38
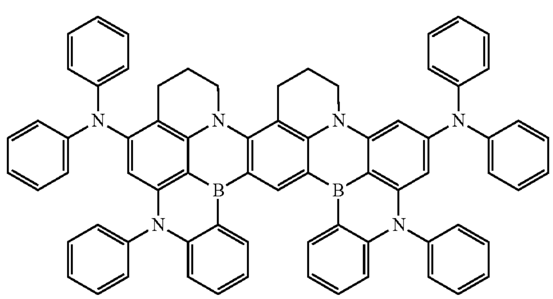
39
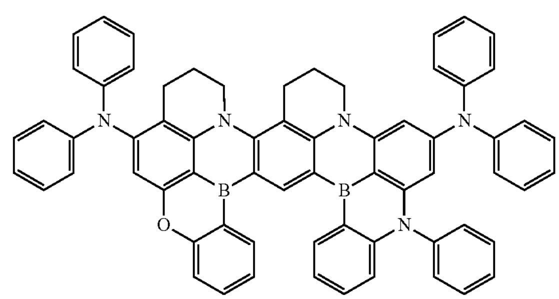
40
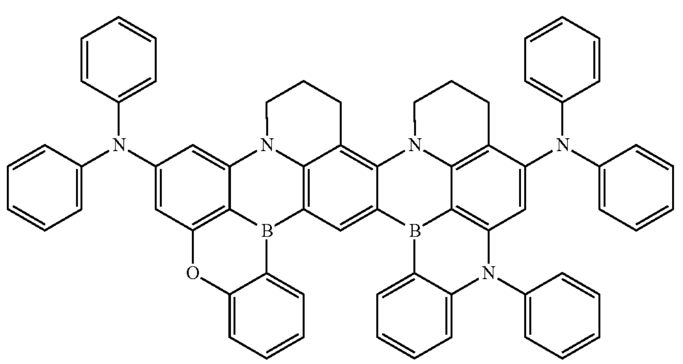

12. The light-emitting device of claim 1, wherein the emission layer emits blue light or turquoise light.

13. The light-emitting device of claim 1, wherein the emission layer has a lowest excitation triplet energy level of equal to or greater than 2.5 eV and equal to or less than 3.0 eV.

14. The light-emitting device of claim 1, wherein:

the light-emitting device further comprises a second capping layer outside the second electrode, and the second capping layer comprises one selected from a carbocyclic compound, a heterocyclic compound, an amine group-based compound, a porphyrine derivative, a phthalocyanine derivative, a naphthalocyanine derivative, an alkali metal complex, an alkaline earth-based complex, and any combination thereof.

15. The light-emitting device of claim 1, wherein the heterocyclic compound represented by Formula 1 included in the emission layer serves as a delayed fluorescence dopant to emit delayed fluorescence from the emission layer.

16. A light-emitting device comprising:

a first electrode;

a second electrode facing the first electrode; and an interlayer between the first electrode and the second electrode and including an emission layer, wherein the light-emitting device further comprises a second capping layer outside the second electrode, the second capping layer having a refractive index of equal to or greater than 1.6, and the emission layer comprises at least one heterocyclic compound represented by Formula 1:

Formula 1

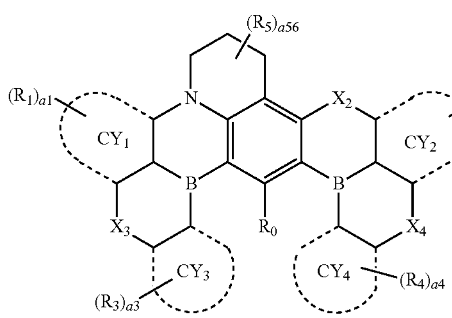

wherein, in Formula 1, $X_2$ is O, S, Se, $C(Z_{2a})(Z_{2b})$, or $N(Z_{2a})$, $X_3$ is O, S, Se, $C(Z_{3a})(Z_{3b})$, or $N(Z_{3a})$, $X_4$ is O, S, Se, $C(Z_{4a})(Z_{4b})$, or $N(Z_{4a})$, ring $CY_1$ to ring $CY_4$ are each independently a $C_3$-$C_{60}$ carbocyclic group or a $C_1$-$C_{60}$ heterocyclic group, $R_0$ to $R_5$, $Z_{2a}$, $Z_{2b}$, $Z_{3a}$, $Z_{3b}$, $Z_{4a}$, and $Z_{4b}$ are each independently hydrogen, deuterium, —F, —Cl, —Br, —I, a hydroxyl group, a cyano group, a nitro group, a $C_1$-$C_6$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —$Si(Q_1)(Q_2)(Q_3)$, —$N(Q_1)(Q_2)$, —$B(Q_1)(Q_2)$, —$C(=O)(Q_1)$, —$S(=O)_2(Q_1)$, or —$P(=O)(Q_1)(Q_2)$, a1 to a4 are each independently an integer selected from 0 to 20, a56 is an integer selected from 0 to 6, $Z_{2a}$ or $Z_{2b}$ is optionally linked to $R_2$ to form a $C_3$-$C_{60}$ carbocyclic group that is unsubstituted or substituted with at least one $R_{10a}$, or a $C_1$-$C_6$ heterocyclic group that is unsubstituted or substituted with at least one $R_{10a}$, $Z_{3a}$ or $Z_{3b}$ is optionally linked to $R_3$ to form a $C_3$-$C_{60}$ carbocyclic group that is unsubstituted or substituted with at least one $R_{10a}$, or a $C_1$-$C_6$ heterocyclic group that is unsubstituted or substituted with at least one $R_{10a}$, $Z_{4a}$ or $Z_{4b}$ is optionally linked to $R_4$ to form a $C_3$-$C_{60}$ carbocyclic group that is unsubstituted or substituted with at least one $R_{10a}$, or a $C_1$-$C_6$ heterocyclic group that is unsubstituted or substituted with at least one $R_{10a}$, $R_{10a}$ is selected from:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_6$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof; or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_6$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

17. The light-emitting device of claim 16, wherein an encapsulation portion is on the second capping layer.

18. The light-emitting device of claim 16, wherein the encapsulation portion comprises:

an inorganic film comprising silicon nitride, silicon oxide, indium tin oxide, indium zinc oxide, or any combination thereof;

an organic film comprising polyethylene terephthalate, polyethylene naphthalate, polycarbonate, polyimide, polyethylene sulfonate, polyoxymethylene, polyarylate, hexamethyldisiloxane, acryl-based resin, epoxy-based resin, or any combination thereof; or a combination of the inorganic film and the organic film.

19. An electronic apparatus comprising the light-emitting device of claim 1, wherein:

the electronic apparatus further comprises a thin-film transistor, the thin-film transistor comprises a source electrode and a drain electrode, and the first electrode of the light-emitting device is electrically coupled to the source electrode or the drain electrode of the thin-film transistor.

20. The electronic apparatus of claim 19, wherein the electronic apparatus further comprises a color filter, a color conversion layer, a touchscreen layer, a polarization layer, or any combination thereof.

* * * * *